United States Patent
Kaufman et al.

(10) Patent No.: US 6,251,238 B1
(45) Date of Patent: Jun. 26, 2001

(54) ANODE HAVING SEPARATELY EXCITABLE SECTIONS TO COMPENSATE FOR NON-UNIFORM PLATING DEPOSITION ACROSS THE SURFACE OF A WAFER DUE TO SEED LAYER RESISTANCE

(75) Inventors: Robert Kaufman, Canoga Park; Gary C. Downes, Moorpark, both of CA (US)

(73) Assignee: Technic Inc., Cranston, RI (US)

( * ) Notice: Subject to any disclaimer, the term of this patent is extended or adjusted under 35 U.S.C. 154(b) by 0 days.

(21) Appl. No.: 09/407,635

(22) Filed: Sep. 28, 1999

Related U.S. Application Data

(63) Continuation-in-part of application No. 09/348,768, filed on Jul. 7, 1999, now Pat. No. 6,197,182.

(51) Int. Cl.$^7$ .................................................. C25B 9/00
(52) U.S. Cl. ...................... 204/242; 204/272; 204/280; 204/288.2; 204/288.4
(58) Field of Search ......................... 204/228.1, 228.7, 204/229.3, 229.5, 229.8, 230.2, 230.6, 230.8, 272, 280, 284, 286.1, 288, 288.2, 288.5, 289, 242, 288.4

(56) References Cited

U.S. PATENT DOCUMENTS

| | | | |
|---|---|---|---|
| 5,156,730 | * 10/1992 | Bhatt et al. | 204/230.2 |
| 5,326,455 | * 7/1994 | Kubo et al. | 204/211 |
| 6,033,540 | 3/2000 | Kosaki et al. | 204/284 |
| 6,099,702 | 8/2000 | Reid et al. | 204/212 |

* cited by examiner

Primary Examiner—Bruce F. Bell
(74) Attorney, Agent, or Firm—Blakely, Sokoloff, Taylor & Zafman LLP

(57) ABSTRACT

A plating apparatus, anode assembly, and method therefor are disclosed herein that improves the uniformity of the plating deposition across the surface of a wafer, substrate or article. This improvement is accomplished by compensating for the uneven plating deposition caused by a seed layer disposed on the article. The seed layer typically has a high resistance. As a result of the high resistance characteristic of the seed layer, plating currents that flow through substantial portion of the seed layer to the cathode contact encounter more resistance than plating currents that flow through less seed layer. This produces non-uniformity in the plating currents across the surface of the wafer, which results in an uneven plating deposition across the surface of the wafer. The plating apparatus, anode, and method therefor provide an anode having a plurality of separate anode sections designed to plate different surface regions of the wafer. The anode sections are applied with respective anode voltages selected or configured to provide a more uniform plating current distribution across the surface of the wafer. As a result, a more uniform plating deposition across the surface of the wafer may be achieved by proper design of the anode sections and the voltages exciting respective anode sections.

39 Claims, 32 Drawing Sheets

ANODE HAVING SEPARATELY EXCITABLE SECTIONS TO COMPENSATE FOR NON-UNIFORM PLATING DEPOSITION ACROSS THE SURFACE OF A WAFER DUE TO SEED LAYER RESISTANCE

CROSS-REFERENCE TO RELATED APPLICATION

This application is a continuation-in-part of patent application Ser. No. 09/348,768, filed on Jul. 7, 1999, now U.S. Pat. No. 6,197,182 and entitled "Improved Apparatus and Method for Plating Wafers, Substrates, and Other Articles", which is incorporated herein by reference.

FIELD OF THE INVENTION

This invention relates generally to methods and apparatus for plating wafers, substrates and other articles, and in particular, to methods and apparatus of configuring the fluid dynamics and electrostatics of a plating process in order to provide improved uniformity in plating deposition, improved plating rates, and improved step coverage of via holes.

BACKGROUND OF THE INVENTION

Because of recent technological advancements in the fields of computers and telecommunications, there has been a substantial increase in demand for "high tech" products. Not only do consumers want more sophisticated computer, telecommunication and other "hightech" systems, they want it at a more economical costs. Because of this consumer desire, high tech industries are gearing their manufacturing techniques to produce products that are made as economical as possible, with improved performance and reliability.

One of the backbone industries supporting many high tech industries, including the computer and telecommunication fields, involves the manufacturing of semiconductor wafers. Semiconductor wafers are used extensively for the manufacturing of integrated circuits, semiconductor devices, and other circuits and/or components. The manufacturing of an integrated circuit or device typically comprises several manufacturing stages, including processing the semiconductor wafer to form the desired circuits and/or devices, forming a copper seed layer on the base plate of the semiconductor, plating the copper seed layer with a layer of copper having a desired thickness, and dicing the wafers in order to form separate integrated circuits and/or components. The invention described herein involves the plating aspect of the overall integrated circuits/devices manufacturing process.

Because of high tech industries' need for manufacturing techniques that economically produce products that have improved performance and reliability characteristics, this need is also a driving force in the field of plating semiconductor wafers. In terms of performance, it is desired for a method and apparatus for plating semiconductor wafers that achieves improved uniformity of the plating deposition across the surface of the wafer. In terms of reliability, it is desired for a method and apparatus for plating semiconductor wafers that accomplishes the desired plating of the semiconductor wafer, without subjecting the wafer to unnecessary harsh environments. In terms of manufacturing costs, it is desired for a method and apparatus for plating semiconductor wafers that accomplishes the desired plating of the semiconductor wafer in a relatively fast manner.

These needs are satisfied with the method and apparatus of plating wafers, substrates and other articles in accordance with the invention as described hereinafter.

SUMMARY OF THE INVENTION

A first aspect of the invention is a method and apparatus for plating a wafer that is particularly useful in improving the plating rate. This aspect of the invention comprises the technique of immersing a wafer in a bath of plating fluid and continuously directing fresh plating fluid towards the surface of the wafer. The directing of plating fluid towards the surface of the wafer increases the ion concentration gradient between the cathode-contacted wafer and the anode. The current between the anode and the cathode is proportional to the ion concentration gradient at the surface of the wafer. The plating rate is also proportional to the current. Accordingly, increasing the ion concentration gradient by continuously directing plating fluid towards the surface of the wafer, increases the current, and therefore increases the plating rate. Thus, a relatively high plating rate can be achieved by directing plating fluids towards the wafer, while the wafer is immersed in a bath of plating fluid.

A second aspect of the invention is a method and apparatus for plating a wafer that is particularly useful in plating high aspect ratio via holes. This aspect of the invention comprises the technique of immersing a wafer with the side to be plated facing up in a bath of plating fluid. By immersing a wafer in a bath of plating fluid, any pockets of air or gas formed within via holes rise due to buoyancy and therefore, move out of the via hole. Accordingly, the absence of trapped pockets of air or gas within via holes allows the plating ions to better adhere to the walls of via holes without hindrance if, otherwise, the trapped air or gas were present.

A third aspect of the invention is an apparatus and method for plating a wafer that is particularly useful in improving the uniformity of the plating deposition across the surface of a wafer. This aspect of the invention comprises continuously effecting random plating fluid flow in the horizontal directions (i.e. x-y directions) within a bath of plating fluid. The random horizontal fluid flow in a plating fluid bath reduces the of the occurrences of relatively long horizontal fluid flow path. Long horizontal fluid flow path forms uneven plating of the surface of a wafer. Accordingly, effecting random horizontal plating fluid flow helps in improving the uniformity of the plating thickness across the surface of the wafer.

A fourth aspect of the invention is an apparatus and method for plating a wafer that is particularly useful in improving the uniformity of the plating deposition across the surface of a wafer. This aspect of the invention comprises configuring the electrostatic field lines between the anode and the cathode so that a more uniform current distribution across the surface of the wafer is formed. A substantially uniform plating current across the surface of the wafer provides for a substantially uniform thickness of the plating deposition across the surface of the wafer. In the preferred implementations, the electrostatic fields can be configured by providing a selectively shaped anode and/or cathode, by providing an electrostatic shield between the anode and the cathode, and/or providing an electrical conductor between the anode and cathode that can alter the electrostatic field in response to a control voltage.

A fifth aspect of the invention is an apparatus and method for plating a wafer that is particularly useful in improving the uniformity of the plating deposition across the surface of a wafer, improving the plating rate, and minimizing cathode contact damage to the wafer. This aspect of the invention comprises providing an electrically conductive liquid in order to effectuate the cathode contact to the surface of the wafer. In the preferred embodiment, the conductive liquid comprises a mixture of sulfuric acid and de-ionized water.

Preferably, the conductive liquid is supported by an annular channel configured so that the conductive liquid makes contact to the perimeter region (e.g. exclusion zone) of the wafer surface. Because the conductive liquid provides a continuous and uniform contact to the wafer, the uniformity of the plating deposition across the surface of the wafer is improved. Because the conductive liquid makes a continuous contact, a large surface contact area is achieved for providing increased current capacity which improves the plating rate. Because the cathode connection to the wafer is accomplished by a liquid, this minimizes mechanical damage to the wafer.

A sixth aspect of the invention is an apparatus and method for plating a wafer that is particularly useful in preventing acidic damage to the copper seed layer of the wafer during the initial stage of forming the plating fluid bath. This aspect of the invention comprises providing a secondary anode near the surface of the wafer that is energized with a positive voltage. The positive voltage activates the plating fluid that is initially introduced into the bath, and prevents the acidic properties of the plating fluid from damaging the copper seed layer of the wafer. Once the primary anode is immersed, the positive voltage on the secondary anode is removed.

A seventh aspect of the invention is an apparatus and method for plating a wafer that is particularly useful in improving the uniformity of the plating deposition across the surface of the wafer when the wafer is initially being plated. When the wafer is initially being plated, the surface resistance of the wafer is high due to the high resistive properties of the seed layer (e.g. copper seed layer). As a result, more of the plating is deposited where the cathode makes contact to the wafer (e.g. at the perimeter of the wafer). This aspect of the invention comprises providing a secondary cathode situated near the cathode contact of the wafer to reduce the plating rate near the cathode contact in response to a control voltage that is more negative than the cathode. The more negative voltage on the secondary cathode diverts plating ions that would otherwise be deposited near the cathode contact. The control voltage is selected to improve the uniformity of the plating deposition across the surface of the wafer.

An eighth aspect of the invention is a plating apparatus, an anode assembly, and a method that improves the uniformity of the plating deposition across the surface of a wafer, substrate or article. This improvement is accomplished by compensating for uneven plating deposition caused by a seed layer disposed on the article. The seed layer typically has a high resistance. As a result of the high resistance characteristic of the seed layer, plating currents that flow through substantial portion of the seed layer to the cathode contact encounter more resistance than plating currents that flow through less seed layer. This produces non-uniformity in the plating currents across the surface of the wafer, which results in an uneven plating deposition across the surface of the wafer. The plating apparatus, anode, and method therefor provide an anode having a plurality of separate anode sections designed to plate different surface regions of the wafer. The anode sections are applied with respective anode voltages selected or configured to provide a more uniform plating current distribution across the surface of the wafer. As a result, a more uniform plating deposition across the surface of the wafer may be achieved by proper design of the anode sections and the voltages exciting respective anode sections.

Additional aspects of the invention include (1) an apparatus and method for initial loading of a wafer; (2) an apparatus and method for wafer alignment and final loading; (3) an apparatus and method for supporting a wafer; (4) an apparatus and method for cathode alignment; (5) an apparatus and method for cathode contacting a wafer; (6) an apparatus and method of draining the plating fluid bath; (7) an apparatus and method of drying an anode; (8) an apparatus and method of rinsing a wafer after plating; (9) an apparatus and method of drying a wafer; (10) an apparatus and method of draining fluids from the plating apparatus; (11) an apparatus and method of controlling and disposing of fumes; (12) an apparatus and method of unloading a wafer; and (13) an apparatus and method of cleaning the plating apparatus.

DESCRIPTION OF THE PREFERRED EMBODIMENTS

I. Method of Plating Wafers, Substrates or Other Articles

One aspect of the invention is a unique method of plating wafers, substrates or other articles. The objectives achieved by the plating method of the invention includes providing a relatively fast plating rate, providing a substantially uniform plating deposition across the surface of a wafer, and providing improved plating of high aspect ratio via holes. These objectives are achieved by uniquely implementing the fluid dynamics and the electrostatics of the plating method and apparatus. Although the plating of a wafer is used herein to illustrate the plating method and apparatus of the invention, it shall be understood that other articles, such as ceramic substrates, can be plated with the method and apparatus of the invention.

A. The Fluid Dynamics of the Plating Process of the Invention

The plating method of the invention provides for a unique implementation of the fluid dynamics of the plating process in order to achieve a relatively fast plating rate, a substantially uniform plating deposition on the surface of the wafer, and improved plating of high aspect ratio via holes. One aspect of the fluid dynamics of the plating process is forcibly directing fresh plating fluid toward the surface of the wafer while the wafer is immersed in a bath of plating fluid. This aspect improves the plating rate. Another aspect of the fluid dynamics of the plating process is continuously effecting random plating fluid flow in the horizontal directions (i.e. x-y directions) within a bath of plating fluid to improve the uniformity of the plating deposition across the surface of the wafer. Yet another aspect of the fluid dynamics of the plating process is positioning a wafer near the bottom of a bath of plating fluid to improve the plating of high aspect ratio via holes.

Figure 1:
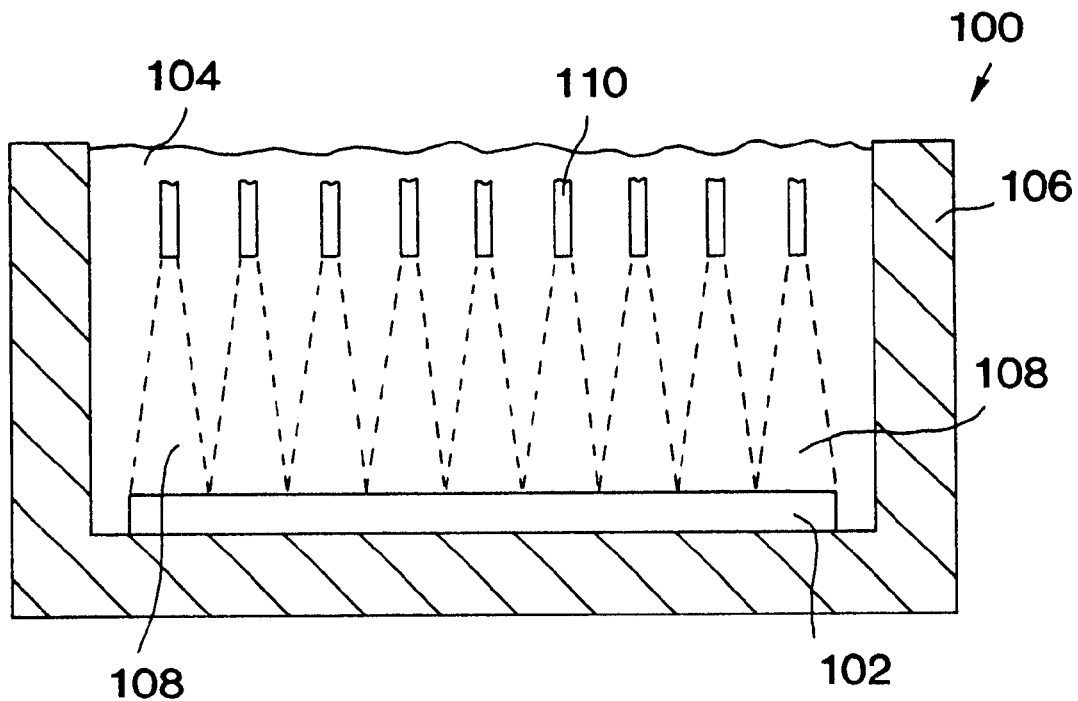
FIG. 1 illustrates a simplified diagram of a plating apparatus that is used to illustrate an aspect of the fluid dynamics of the plating method of the invention.

FIG. 1 depicts a simplified diagram of a plating apparatus 100 that is used to illustrate an aspect of the fluid dynamics of the plating method of the invention. This aspect of the plating method of the invention provides for a relatively fast plating rate of the surface of a wafer by continuously replenishing the plating ions at the surface of the wafer. This is preferably performed by immersing a wafer 102 in a bath of plating fluid 104 contained by a suitable container 106, and continuously directing fresh plating fluid 108 towards the wafer. By continuously directing fresh plating fluid towards the surface of the wafer 102, a high concentration of the plating ions forms near the surface of the wafer. The continuous high concentration of plating ions near the surface of the wafer helps in replenishing the ions near the surface of the wafer, that are continuously being depleted from the plating fluid 104 due to the plating of the wafer 102. In the embodiment, a plurality of discrete nozzles 110 are employed to direct a plurality of streams of plating fluid towards the surface of the wafer 102.

Figure 2:
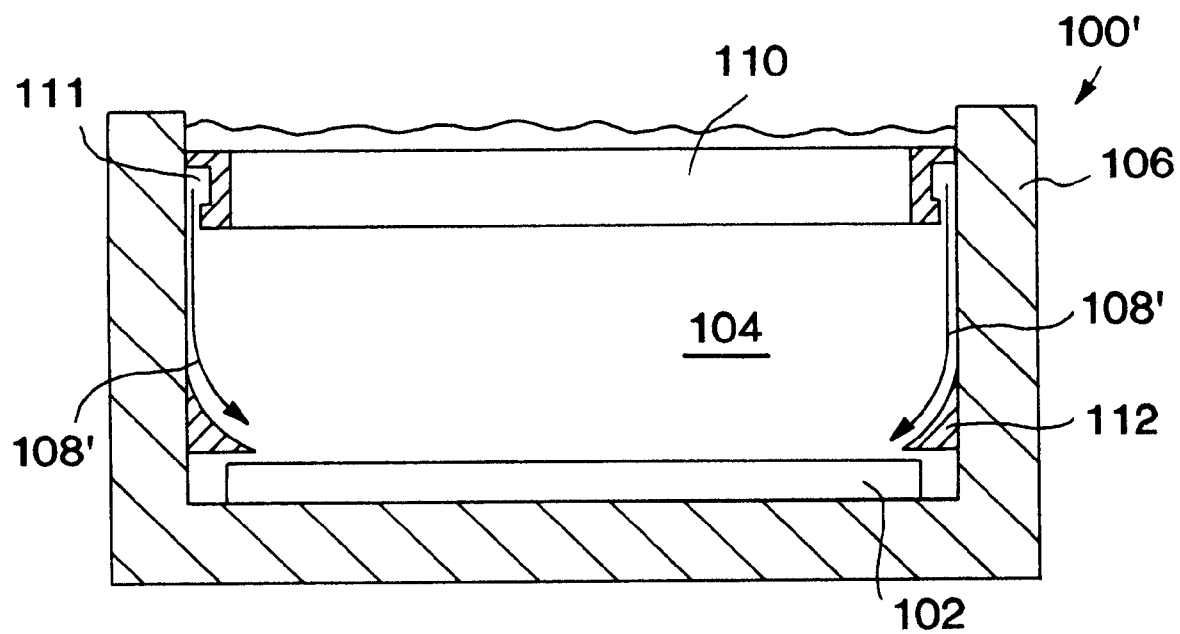
FIG. 2 illustrates another simplified diagram of a plating apparatus that is used to illustrate an aspect of the fluid dynamics of the plating method of the invention.

FIG. 2 depicts a simplified diagram of another plating apparatus 100' that is used to illustrate an aspect of the fluid dynamics of the plating method of the invention. The plating apparatus 100' is similar to plating apparatus 100, and the same elements have the same reference numbers to identify them. The plating apparatus 100' differs from apparatus 100 in that it includes a distribution element 110 for forming a plating fluid flow 108' that cascades down the wall of the container 106 towards the surface of the wafer 102. The distribution element 110 includes an intake cavity 111 formed between the inside wall of the container 106 and the distribution element 110. Plating fluid is fed into the intake cavity 111, and thereafter, the plating fluid 108' cascades parallel to the container wall down to the wafer 102. The plating apparatus 100' may include a curved element 112 for directing the cascading plating fluid towards the wafer 102. The advantage of this embodiment is that the fluid flow towards the surface of the wafer 102 does not directly impinge the surface of the wafer 102, and provides a more controlled flow towards the wafer 102.'

Figure 3:
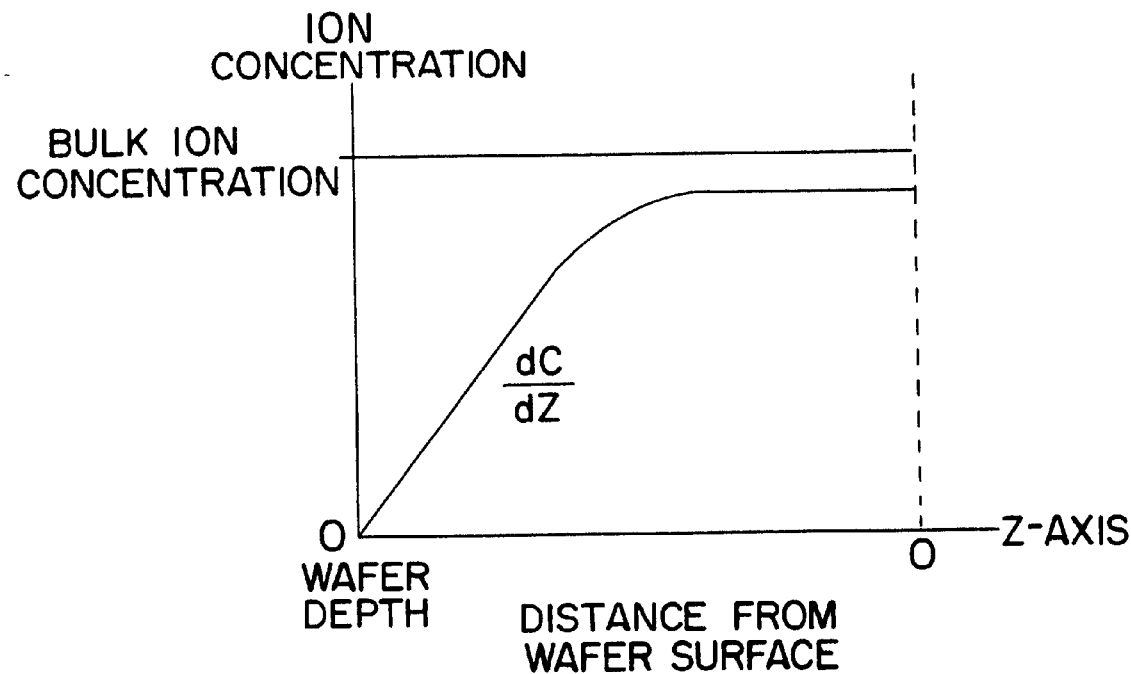
FIG. 3 illustrates a graph of the concentration of the plating ions in the plating fluid as it varies with the depth of the plating fluid bath.

FIG. 3 depicts a graph of the concentration of the plating ions in the plating fluid as it varies with the depth of the plating fluid bath. The horizontal axis of the graph represents the distance from the surface of the wafer and the vertical axis represents the concentration of the plating ions. As previously discussed, forcibly directing fresh plating fluid onto the surface of the wafer produces a higher concentration of plating ions just above the surface of the wafer. Consequently, as the graph illustrates, the concentration gradient $dC/dZ$ of the plating ions near the surface of the wafer is substantially increased.

By increasing the flow rate of the fresh plating fluid impinging the surface of the wafer, the plating ion concentration gradient $dC/dZ$ increases. The ion electrical current that is formed within the plating fluid bath when a potential is applied between an anode situated near the top of and within the fluid bath and the cathode connected to the surface of the wafer is proportional to the concentration gradient $dC/dZ$ near the surface of the wafer. Thus, by increasing the ion concentration gradient $dC/dZ$ by forcibly directing fresh plating fluid onto the surface of the wafer, the electric current propagating within the fluid bath increases, which, in turn, increases the plating rate. Thus, a high plating rate can be achieved by the plating method of the invention by forcibly directing fresh plating fluid onto the surface of the wafer.

Figure 4:
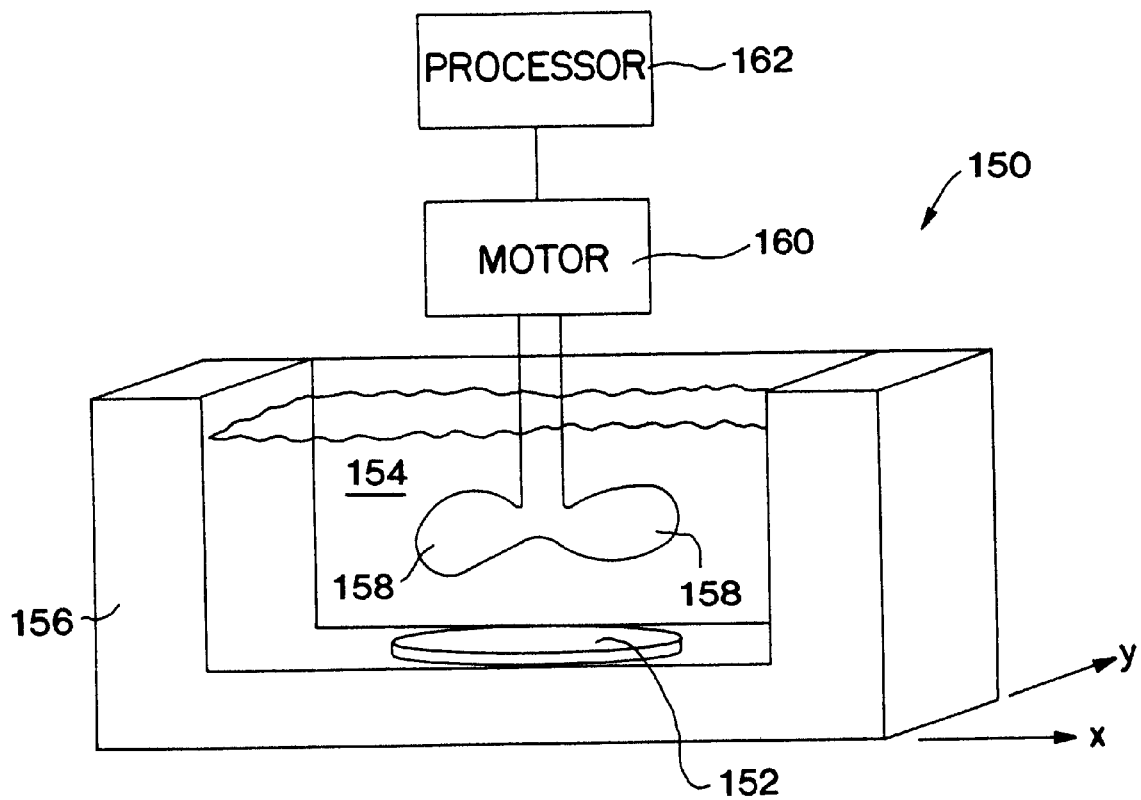
FIG. 4 illustrates a simplified diagram of a plating apparatus that is used to illustrate another aspect of the fluid dynamics of the plating method of the invention.

FIG. 4 depicts a simplified diagram of a plating apparatus 150 that is used to illustrate another aspect of the fluid dynamics of the plating method of the invention. This aspect of the plating method of the invention improves the uniformity of the plating deposition across the surface of the wafer by continuously effecting random plating fluid flow in the horizontal directions (i.e. x-y directions) within a bath of plating fluid. This is preferably performed by immersing a wafer 152 in a bath of plating fluid 154 contained by a suitable container 156, and randomly stirring the fluid bath 154 with one or more paddles 158 being rotated about a vertical axis. The rotation of the paddles 158 may be performed by a motor 160 being controlled by a processor 162 to rotate in a random manner. The processor 162 can be a microprocessor, computer or other suitable means.

The objective of continuously effecting random plating fluid flow in the horizontal directions (i.e. x-y direction) within a bath of plating fluid is to eliminate relatively long paths of plating fluid flow in the horizontal direction (i.e. x-y direction). The problem with long horizontal fluid paths is that it produces gradients in the plating deposition across the surface of the wafer. Specifically, at a beginning of such a horizontal fluid path, the plating ion concentration is high. As a result, a high percentage of the plating ions are deposited on the surface of the wafer at the beginning of a horizontal fluid path. As the horizontal fluid path proceeds, the plating ions are continuously depleted. Thus, from the beginning towards the end of a horizontal fluid path, the plating ions deposited on the surface of the wafer gradually decreases. This leads to a non-uniformity of the plating deposition across the surface of the wafer. By stirring the plating fluid bath in a random manner in the horizontal direction, the lengths of horizontal fluid paths are substantially shortened, thus resulting in an improvement in the uniformity of the plating deposition across the surface of the wafer.

The plating method of the invention is particularly useful in providing improved step coverage of via holes that are typically formed through thin film layers situated on the surface of a wafer. The reason the preferred implementation of the plating method of the invention provides improved step coverage of via holes is that the wafer 102 is immersed in a bath of plating fluid. As a result, any pockets of air or gas formed within via holes rise due to buoyancy and therefore, move out of via holes. Accordingly, the absence of trapped pockets of air or gas within via holes, allows the plating ions to better adhere to the walls of via holes without hindrance if, otherwise, the trapped air or gas were present.

B. The Electrostatics of the Plating Method of the Invention

The plating method of the invention provides for a unique implementation of the electrostatics of the plating process in order to assist in providing substantially uniform plating across the surface of the wafer and providing an improved plating rate. One aspect of the electrostatics of the plating process of the invention comprises configuring the electrostatic field lines between the anode and the cathode in a manner that the current distribution across the surface of the wafer is substantially uniform during the plating process. The substantially uniform current distribution across the surface of the wafer helps in providing uniform plating of the surface of the wafer. Another aspect of the electrostatics of the plating process of the invention is to configure the cathode contact to the wafer surface to provide a relatively large contact surface to improve the current capacity of the plating (without occupying the useful surface area of the wafer), and to minimize damage to the wafer surface due to the contact.

FIGS. 5A-5D depict simplified diagrams of plating apparatus (114, 128, 138, 143) used to illustrate the electrostatic aspect of the plating method related to configuring the electrostatic field lines between the anode and the cathode to provide a more uniform current distribution across the surface of the wafer. This is accomplished by configuring the anode or assembly and/or the cathode or cathode assembly in a manner that the effective resistances of current paths outlined by respective electrostatic field lines between the anode and the cathode are substantially the same.

Figure 5A:
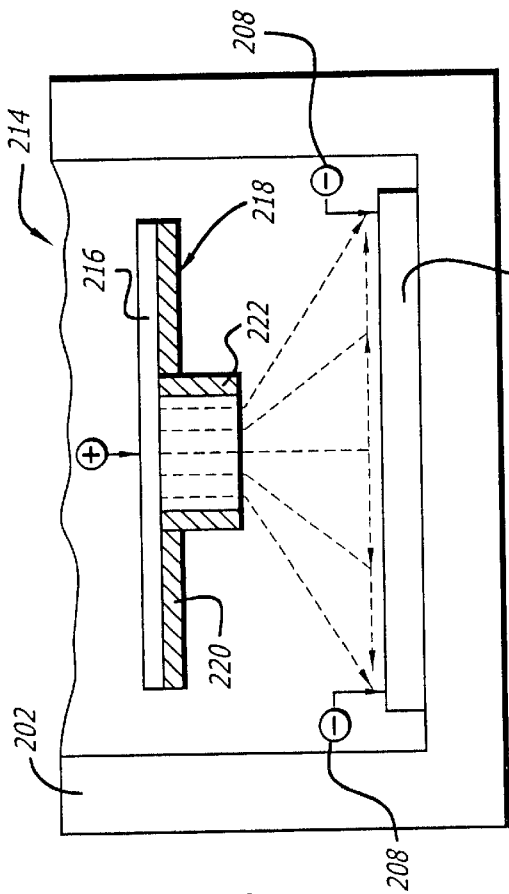
FIGS. 5A–5D illustrate simplified diagrams of plating apparatus used to illustrate an aspect of the plating method in accordance with the invention;.

Referring initially to FIG. 5A, it depicts a simplified diagram of a plating apparatus 200 that includes a container 202 supporting a bath of plating fluid 204, and a wafer 206 preferably disposed on the bottom of the container 202. This configuration applies to the other plating apparatus 214, 224 and 230. A continuous cathode contact or a plurality of cathode contacts 208 are in contact with the surface of the wafer 206 preferably around the perimeter of the wafer. The plating apparatus 200 also includes an anode 210 situated within the plating fluid bath 204, above the wafer 206.

In operation, when a voltage potential difference is formed between the anode 210 and the cathode 208, an electrostatic field is formed between the anode and the cathode. As customary, the electrostatic field can be represented as a plurality of field lines 212 emanating from the anode 210 and terminating at the cathode 208 (for simplicity, five field lines 212a–e are shown in FIG. 5). In addition to the electrostatic field forming between the anode and the cathode in response to a voltage potential difference between the anode and the cathode, current flow occurs between the cathode and the anode that substantially parallel the paths of the field lines 212. The amount of current flow that parallels the path of a particular field line is inversely proportional to the effective resistance between the anode 210 and the cathode 208 along that path. The sources of the resistance are the plating fluid 204 as well as the surface of the wafer 206. In order for the current distribution across the surface of the wafer 206 to be substantially uniform, the anode 210 and/or cathode 208 is/are configured in a manner that the effective resistances of current paths outlined by respective electrostatic field lines 212 are substantially the same.

One preferred manner of substantially equalizing the resistances of the paths outlined by the field lines, shown in FIG. 5A, is to provide an anode 210 that is curved in a concave upward manner with respect to the wafer 206. With this curved anode 210, the field lines 212a and 212e emanating from the anode that are laterally closer and follow a direct path to the cathode 208 are lengthen (assuming the anode was previously straight for illustration purposes) to increase their resistances. Whereas the field lines 212b–d that are laterally farther away and/or follow an indirect path to the cathode 208 via the surface of the wafer 206 are shortened (assuming the anode was previously straight for illustration purposes) to lower their resistance. In this manner, the resistances of the field line paths are substantially equalized, which results in a substantially uniform current distribution across the surface of the wafer 206. It is this substantially uniform current distribution across the surface of the wafer 206 that helps in providing substantially uniform plating of the surface of the wafer.

Figure 5B:
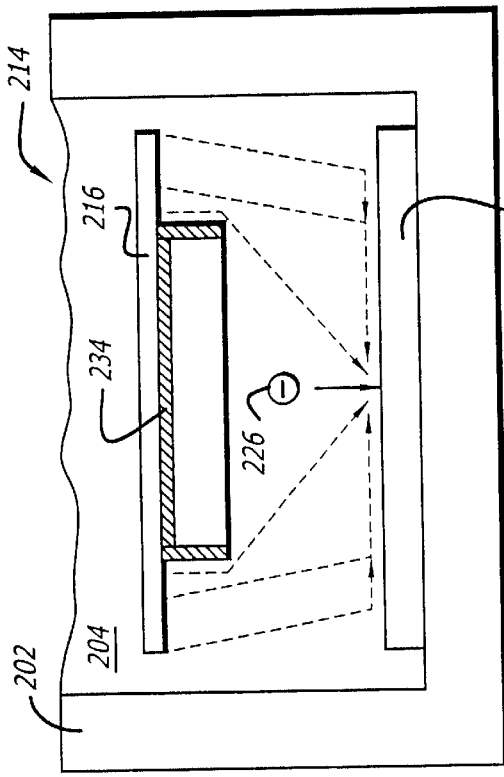
Figure 5C:
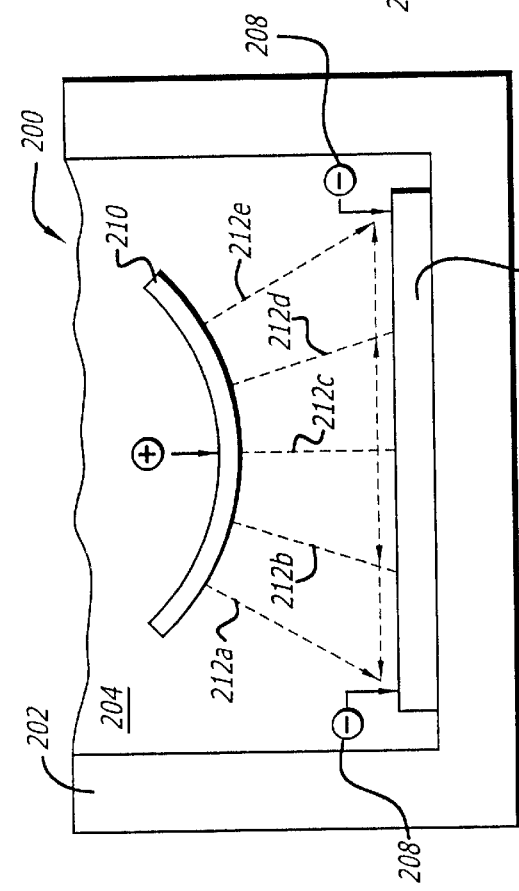
Figure 5D:
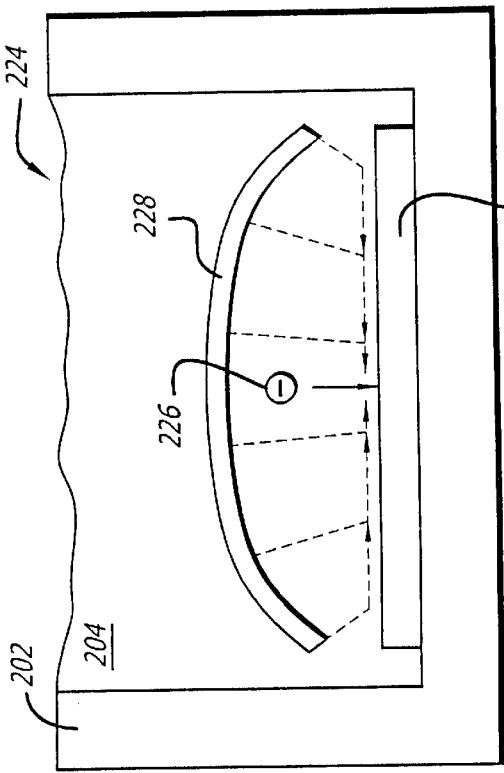

Another preferred manner of substantially equalizing the resistance of current paths outlined by the field lines, shown in FIG. 5B, is to provide an anode 216 and a shield 218 situated between the anode 216 and the wafer 206, and preferably attached to the anode 216. In a preferred embodiment, the shield 218 includes a portion 220 that shields the sections of the anode 216 that are closer to the cathode 208, while leaving a central portion of the anode exposed. In addition, the shield includes an additional portion 222 that extends downward a specified distance from the anode 216 at the perimeter of its exposed central section. This configuration substantially equalizes the resistances of the field line paths, which results in a substantially uniform current distribution across the surface of the wafer 206, and thereby, improve the uniformity of the plating of the wafer surface.

Although in the preferred embodiment the cathode contacts the perimeter of the wafer 206, it shall be understood that the principle of the method of the invention shall not be limited to such configuration. For instance, if the cathode contacts were at the center of the wafer, although not a preferred placement of the cathode, the anode can be configured also to provide a substantially uniform current distribution across the surface of the wafer by equalizing the resistances of field line paths. For instance, if the cathode contact were positioned at the center of the wafer 206, as in apparatus 224 shown in FIG. 5C, an anode 228 can be configured into a concave downward shape with respect to the wafer in order to substantially equalize the resistances of the field line paths. Alternatively, an anode 232 including a shield 234, as in apparatus 230 shown in FIG. 5D, can be configured in order to substantially equalize the resistances of the field line paths.

Figure 6:
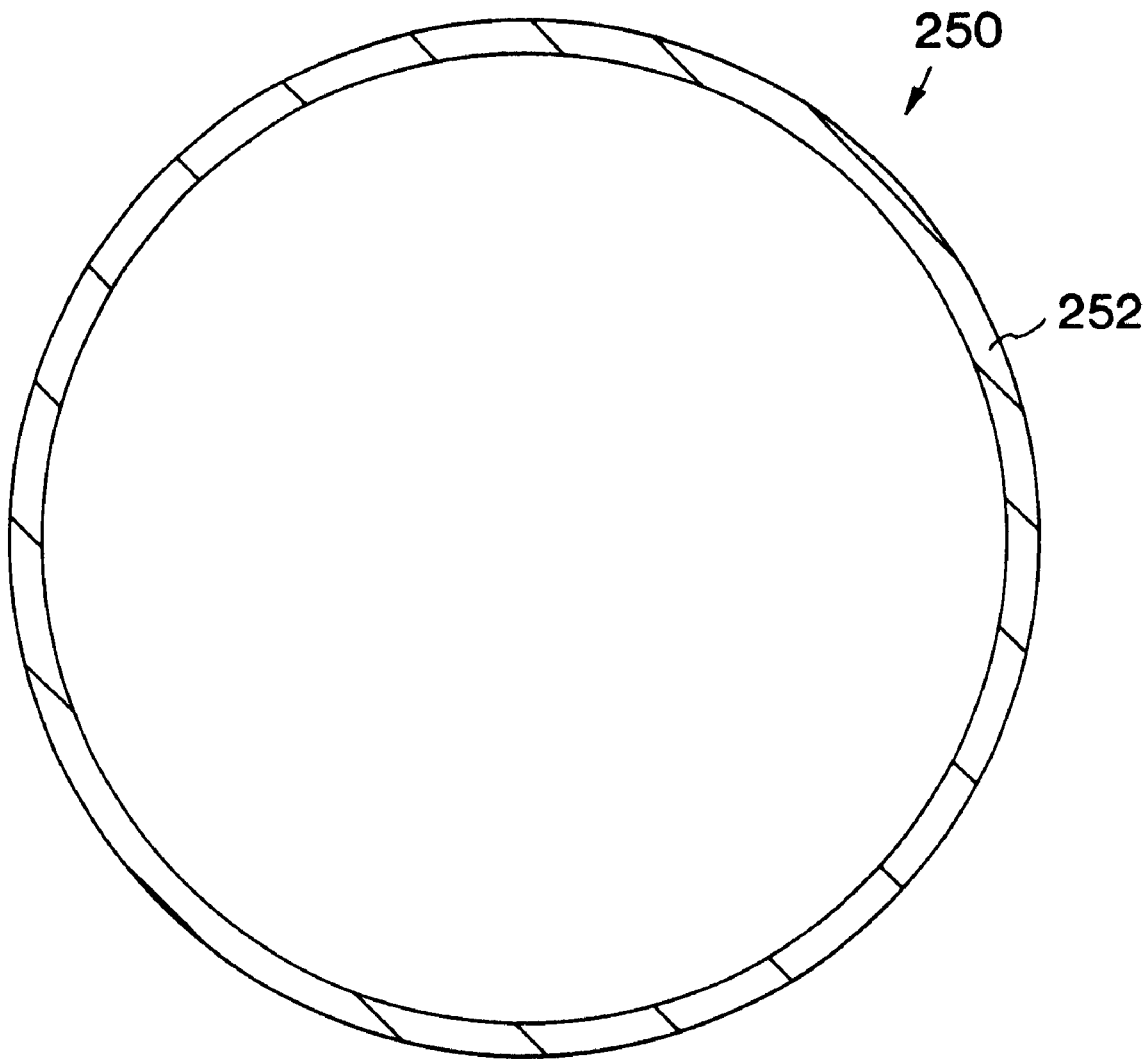
FIG. 6 illustrates a top view of a wafer used to illustrate another aspect of the electrostatics of the plating method in accordance with the invention.

FIG. 6 illustrates a top view of a wafer 250 used to illustrate another aspect of the electrostatics of the plating method in accordance with the invention. This aspect of the invention improves the uniformity of the plating of the surface of the wafer, and also improves the plating rate. Specifically, this aspect of the electrostatics of the plating method comprises the step of providing a continuous and substantially uniform cathode contact along and within the perimeter area 252 of the wafer 250. This perimeter area is typically 3 millimeters wide and is referred to in the art as the "exclusion zone."

In the preferred embodiment, the cathode contact comprises an electrical-conductive fluid, such as a mixture of sulfuric acid and de-ionized (DI) water. The conductive fluid is significantly advantageous because it provides a uniform contact along and within the exclusion zone (i.e. the contact has a uniform resistance along and within the exclusion zone). Because of the continuity of the cathode contact provided by the conductive fluid, a more uniform plating deposition and higher currents for increasing the plating rate results. Alternatively, a mechanical contact comprising a plurality of equally spaced contacts can be provided along and within the exclusion zone to effectuate the cathode contact to the wafer.

II. Apparatus and Corresponding Methods Involved in Plating a Wafer

A. Introduction and Overview

In this section of the specification, a plating apparatus is described that is a preferred physical implementation for achieving the fluid dynamic and electrostatic aspects of the plating method of the invention. Specifically, with regard to the fluid dynamic aspects of the plating method, the plating apparatus of the invention (1) forcibly directs fresh plating fluid toward the surface of the wafer while the wafer is immersed in a bath of plating fluid to improve the plating rate; (2) continuously effects random plating fluid flow in the horizontal direction (i.e. x-y direction) within the plating fluid bath to improve the uniformity of the plating deposition across the surface of the wafer, and (3) positions the wafer near the bottom of the plating fluid bath to improve the plating of high aspect ratio via holes. With regard to the electrostatic aspects of the plating method, the plating apparatus of the invention (1) configures the electrostatic field lines between the anode and the cathode in a manner that the current distribution across the surface of the wafer is substantially uniform during the plating process; and (2) configures the cathode contact to the wafer surface to provide a relatively large contact surface to improve the current capacity of the plating (without occupying the useful surface area of the wafer) and to also provide a substantially uniform plating deposition across the surface of the water.

Figure 7:
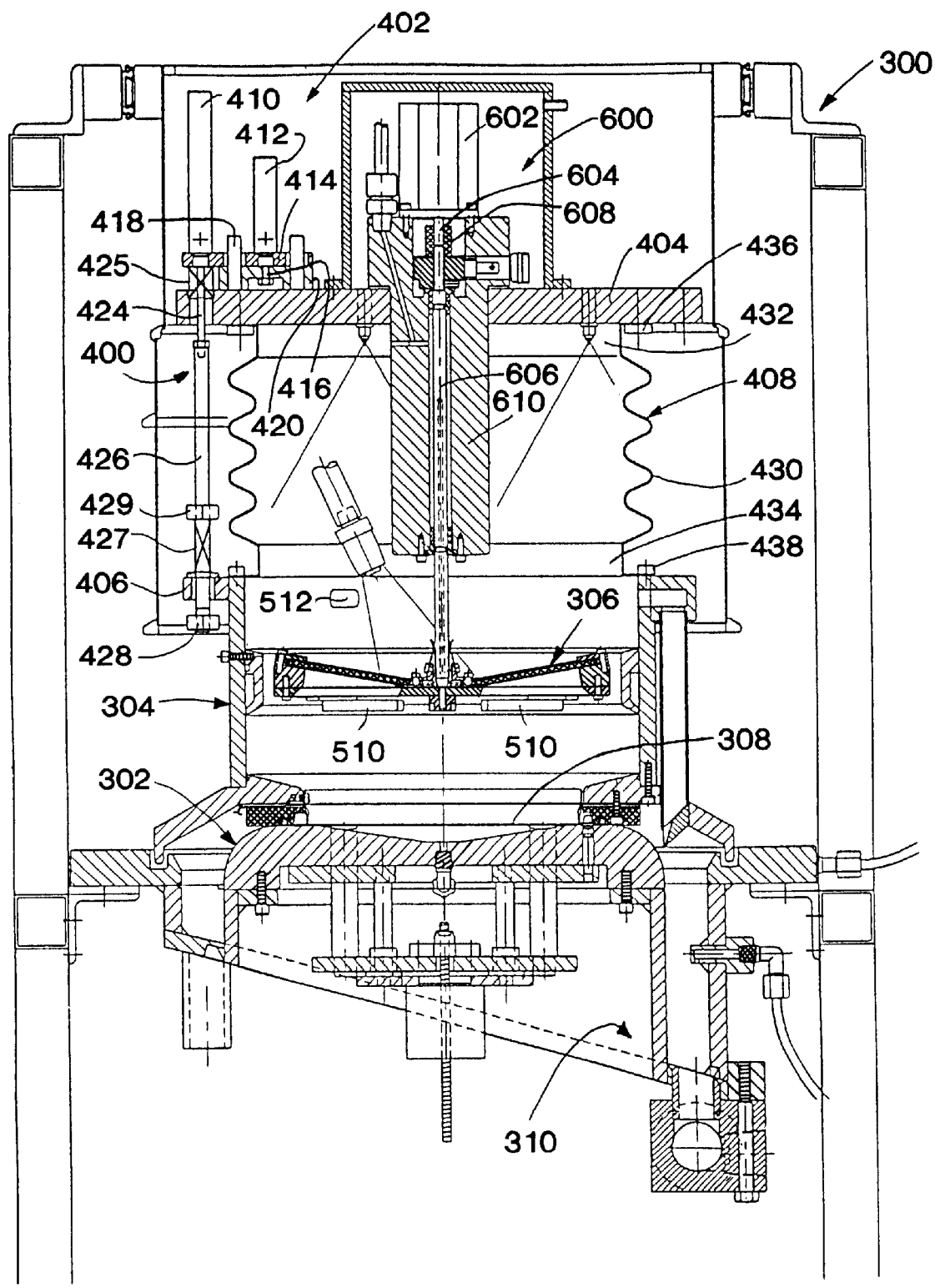
FIG. 7 illustrates a cross-sectional view of an exemplary plating apparatus in a plating position in accordance with the invention.

FIG. 7 illustrates a cross-sectional view of an exemplary plating apparatus 300 in accordance with the invention. The plating apparatus 300 of the invention comprises three principle assemblies relating to the plating process. These assemblies include a wafer mounting assembly 302, a cylinder/distribution ring assembly 304, and an anode assembly 306. During the plating process, the cylinder/distribution ring assembly 304 makes a fluid seal contact with the wafer mounting assembly 302 to form a plating solution (fluid) bath. A wafer 308 is mounted on top of the wafer mounting assembly 302 and is situated at the bottom of the plating fluid bath to improve the plating of via holes, as previously discussed. The cylinder/distribution ring assembly 304 includes an annular slot for directing fresh plating fluid down onto the surface of the wafer 308 to improve the plating rate of the plating process, as previously discussed.

The anode assembly 306 is situated within the cylinder/distribution ring assembly 304 during the plating process and is immersed within the plating fluid bath. The anode assembly 306 includes paddles 510 which are rotated about a vertical axis in a manner to effectuate random fluid flow in a horizontal direction. This improves the uniformity of the plating deposition formed on the surface of the wafer 308. The anode assembly 306 can be configured or altered to provide for substantially uniform current distribution across the surface of the wafer, as previously discussed Finally, the cylinder/distribution ring assembly 304 includes a cathode structure that makes electrical contact with the exclusion zone of the wafer during the plating process, as previously discussed. The three principle assemblies are discussed in more detail in the sections to follow.

In addition to the three principle assemblies and their corresponding plating method, the wafer apparatus 300 also includes other apparatus and method associated with the plating process. These include (1) an apparatus and method for initial loading of a wafer; (2) an apparatus and method for wafer alignment and final loading; (3) an apparatus and method for supporting a wafer; (4) an apparatus and method for cathode alignment; (5) an apparatus and method for cathode contacting a wafer; (6) an apparatus and method of draining the plating fluid bath; (7) an apparatus and method of drying an anode; (8) an apparatus and method of rinsing a wafer after plating; (9) an apparatus and method of drying a wafer; (10) an apparatus and method of draining fluids from the plating apparatus; (11) an apparatus and method of controlling and disposing of fumes; (12) an apparatus and method of unloading a wafer; and (13) an apparatus and method of cleaning the plating apparatus. The following detailed discussion of the plating apparatus will follow a chronological order beginning with the initial loading of the wafer into the plating apparatus and ending with the unloading of the wafer after completion of the plating process.

B. Apparatus and Method for Initial Loading of a Wafer into an Alignment Zone

Figure 8:
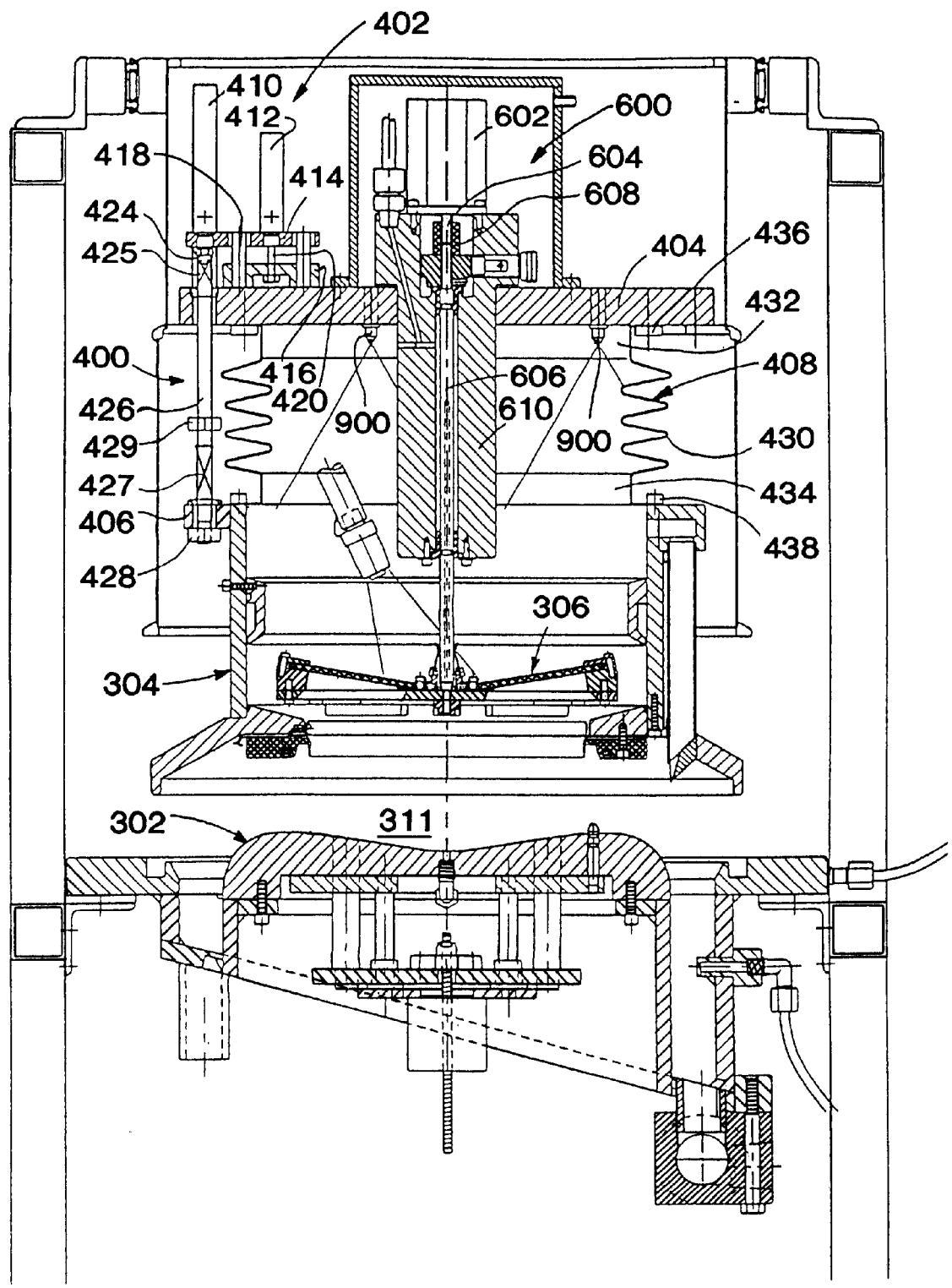
FIG. 8 illustrates a cross-sectional view of an exemplary plating apparatus in a wafer insertion position in accordance with the invention.
Figure 25:
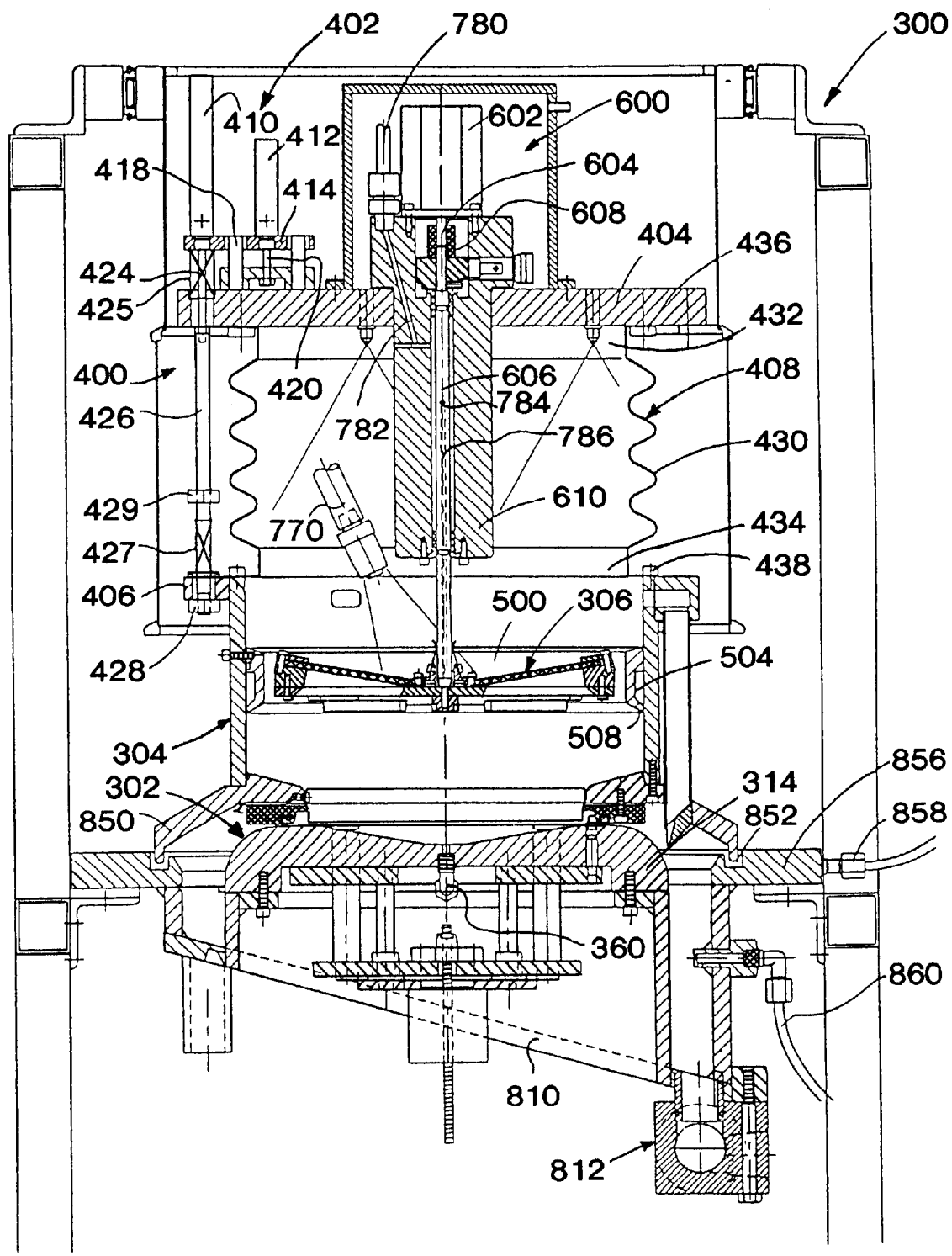
FIG. 25 illustrates a cross-sectional view of the plating apparatus in a fluid draining position in accordance with the invention.

FIG. 8 illustrates a cross-sectional view of the exemplary plating apparatus 300 of the invention immediately prior to the insertion of a wafer 308 for initial loading into the plating apparatus. At this stage, the cylinder/distribution ring assembly 304 is preferably positioned at its full raised position, leaving a sufficient clearance 311 between the cylinder/distribution ring assembly 304 and the wafer-mounting assembly 302 to insert a wafer therein. As will be discussed in more detail, the cylinder/distribution ring assembly 304 can be selectively raised or lowered to a desired position. At the moment, three vertical positions for the cylinder/distribution ring assembly 304 are contemplated: (1) the full raised position shown in FIG. 8 for insertion and removal of the wafer 308 to and from the plating apparatus; (2) in the full lower position where the bottom of the cylinder/distribution ring makes contact with the wafer mounting assembly 302 as shown in FIG. 7; and (3) in a fluid draining position as shown in FIG. 25. However, it shall be understood that any other position between the full raised and lower positions are available.

Figure 9:
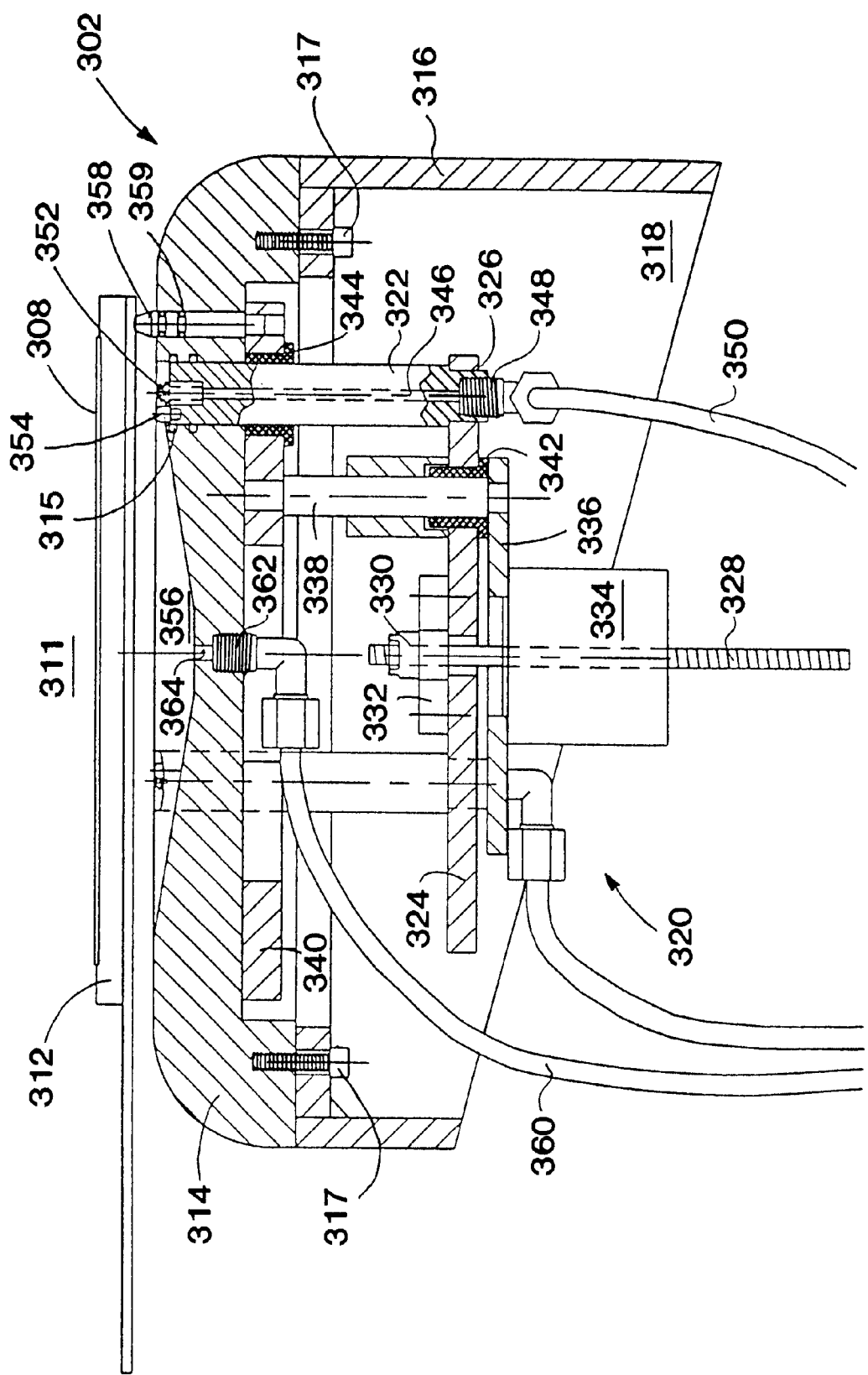
FIG. 9 illustrates a close-up cross-sectional view of a wafer mounting assembly in accordance with the invention, with a wafer supported by a wafer loader above the wafer mounting assembly.

FIG. 9 illustrates a close-up cross-sectional view of the wafer mounting assembly 302 with a wafer 308 positioned above the wafer-mounting assembly 302, and supported by a wafer loader 312. The wafer mounting assembly 302 includes a wafer mounting base 314 mounted on top of a housing 316, by suitable means such as screws 317. The housing 316 encloses an inner cavity 318 that includes at least a portion of a lift post assembly 320, among other components. The housing 316 protects the lift post assembly 320 and other components from the solutions involved in the plating process.

The lift post assembly 320 comprises at least three elongated wafer supporting posts 322 (two shown in FIG. 9) situated coaxially within respective vertical channels formed through the wafer-mounting base 314. One or more O-rings 315 may be placed coaxially around each of the supporting posts 322 to prevent leakage of plating, rinsing and/or other fluids through the vertical channels of the wafer mounting base 314. The wafer supporting posts 322 are mounted on a movable mounting plate 324 situated within the housing 316. In the preferred embodiment, each of the wafer supporting posts 322 includes a bottom narrower portion 326 that extends into and below a hole formed through the movable mounting plate 324. The portion of the wafer supporting posts 322 above the lower narrower portion 326 is wider and sits on top of the horizontal mounting plate 324. The movable mounting plate 324 is securely coupled to a lead screw 328 by way of an collet coupling 330 and adapter 332 mounted on top of the movable mounting plate 324.

The lead screw 328 extends downward from the collate coupling 330 through a clearance hole in the movable mounting plate 324 to an electric motor 334. The lead screw 328 is coupled to an internal rotating acme nut (not shown) driven by the electric motor 334 which causes axial movement of the lead screw 328. The motor 334 is mounted to a stationary motor mounting plate 336 that is securely coupled to lower ends of at least three guide posts 338 (one shown in FIG. 9). The upper ends of the guideposts 338 are securely connected to a horizontal mounting plate 340 secured to the underside of the wafer-mounting base 314. The guideposts 338 extend through holes in the movable mounting plate 324 that are lined with respective bushings 342. The guide posts 338 assist in the vertical alignment and retrain lateral and rotational movement of the movable mounting plate 324. The wafer supporting posts 322 extend through holes in the horizontal mounting plate 340 that are also lined with respective bushings 344.

Each of the wafer supporting posts 322 includes a duct 346 extending coaxial therein from the top of the posts 322 to its bottom portion 326. The bottom portion 326 of each of the wafer supporting posts 322 includes an inner threaded wall for receiving therein a fitting 348 of a vacuum hose 350. The vacuum hose 350 is coupled to a pump (not shown) for forming a vacuum at the top of the wafer supporting posts 322. Situated on top of each wafer supporting post 322 is a vacuum cup 352 in a bellows configuration and having a channel therein in fluid communication with duct 346. Also situated on top of each of the wafer supporting posts 322 is a mechanical stop 354.

Figure 10:
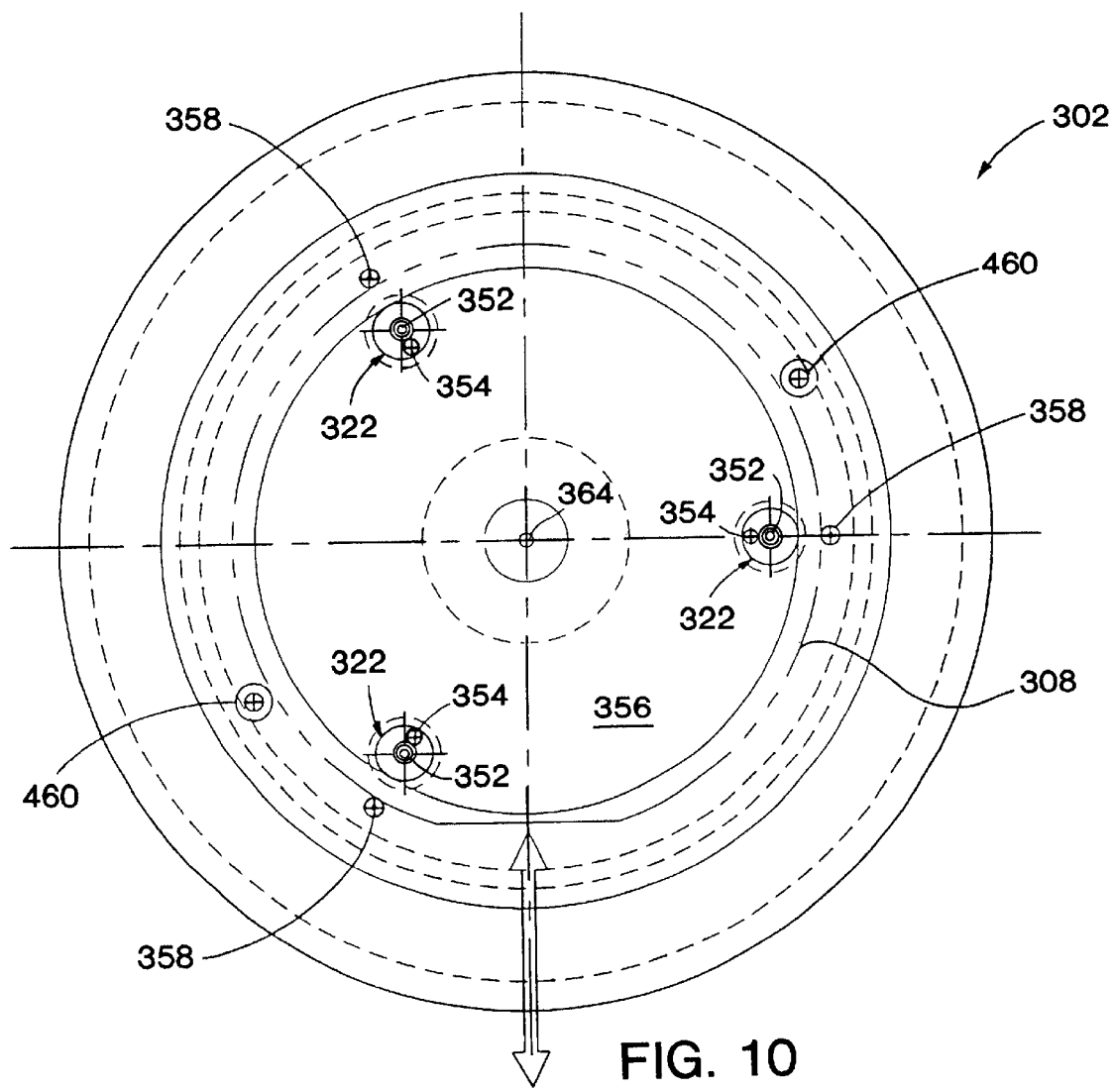
FIG. 10 illustrates a top view of the wafer mounting assembly in accordance with the invention.

FIG. 10 illustrates a top view of the wafer mounting assembly 302. The three wafer supporting posts 322 with respective vacuum cups 352 and mechanical stops 354 are spaced annularly around a fluid bed 356 with substantially the same angular distance from each other. Since there are three wafer-supporting posts 322 in the preferred embodiment, each of them are separated by 120°. Although the preferred embodiment includes three wafer supporting posts 322, it shall be understood that more can be incorporated into the wafer mounting assembly 302. The purpose of the fluid cavity bed 356 will be explained in a subsequent section of the specification.

Referring again to FIG. 9, the method of the invention for initially loading a wafer 308 into the plating apparatus 300 will now be described. The first step in the initial wafer loading method is to transport the wafer 308 from outside of the plating apparatus 300 to the clearance area 311 above and generally aligned with the wafer mounting assembly 302. This can be performed by any suitable wafer loader 312, such as a movable platform, robotic arm or any device that can position the wafer 308 above and approximately aligned with the wafer mounting assembly 302, and in a substantially horizontal orientation. FIG. 9 depicts the condition of the wafer mounting assembly 302 at the end of this step, with the wafer 308 and wafer loader 312 situated above the wafer mounting assembly 302.

Figure 11:
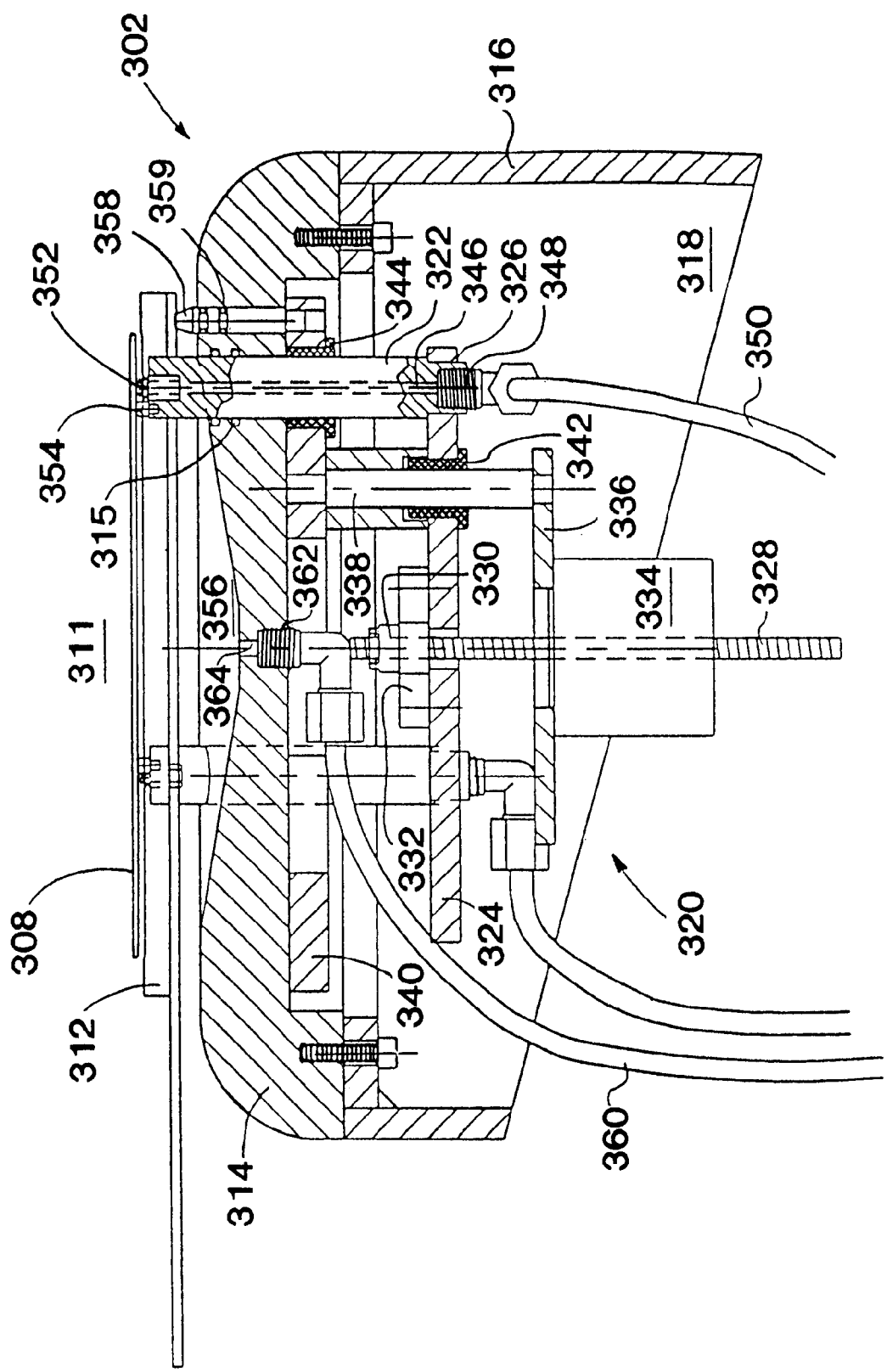
FIG. 11 illustrates a close-up cross-sectional view of a wafer mounting assembly in accordance with the invention, with a wafer supported by wafer supporting posts above the wafer loader and the wafer mounting assembly.

Referring to FIG. 11, a subsequent step in the initial wafer loading method of the invention is to raise the wafer supporting posts 322 to make vacuum contact with the underside of the wafer 308 and lift the wafer off the wafer loader 312. This is performed by actuating the electric motor 334 to cause the lead screw 328 to move in an axially upward direction. The upward movement of the lead screw 328 causes the movable horizontal mounting plate 324 to rise along with the wafer supporting posts 322. When the top of the wafer supporting pins 322 is near the underside of the wafer 308, negative pressure is introduced through the hose 350 to form a vacuum contact of the wafer 308 to the top of the supporting pins 322. The vacuum cup 352 compresses due to the vacuum allowing the wafer 308 to sit on the mechanical stops 354. After making vacuum contact with the underside of the wafer 308, the supporting posts 322 continue to rise to lift the wafer 308 off of the wafer loader 312. The wafer loader 312 is now removed.

Figure 12:
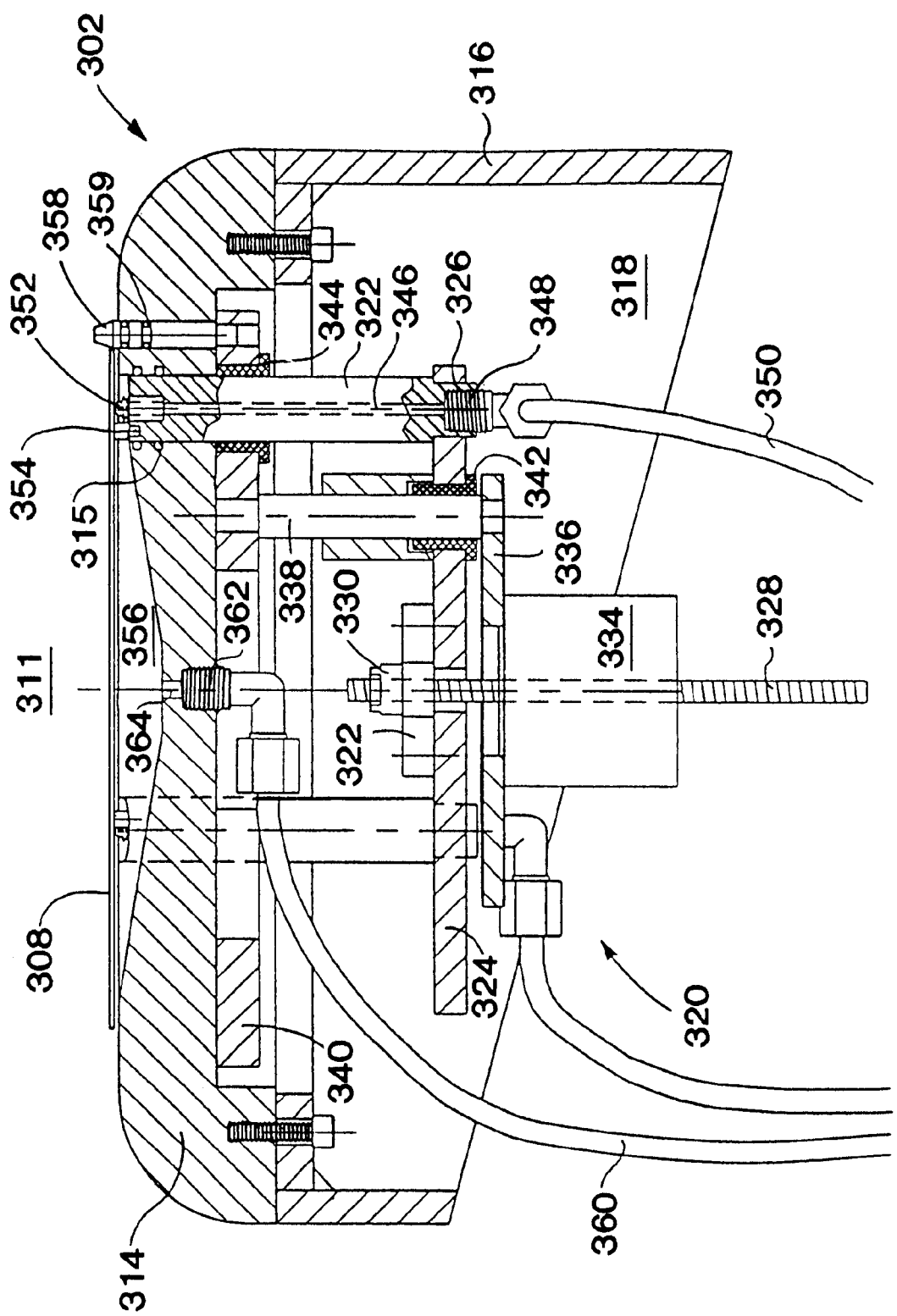
FIG. 12 illustrates a close-up cross-sectional view of a wafer mounting assembly in accordance with the invention, with a wafer in an alignment zone.

Referring to FIG. 12, a subsequent step in the initial wafer loading method of the invention is to lower the wafer supporting pins 322 to position the wafer 308 within an alignment zone. The alignment zone is a region laterally adjacent to the tapered end of alignment pins 358. This positioning of the wafer 308 is performed by actuating the electric motor 334 to move the lead screw 328 in an axially downward direction. The downward movement of the lead screw 328 causes the movable mounting plate 324 and wafer supporting posts 322 to lower the wafer 308 until it is situated in the alignment zone. The movement of the wafer 308 into the alignment zone completes the method of initially loading the wafer.

Although the preferred implementation of the lift post assembly 320 includes an electric motor 334 for causing the vertical movement of the wafer supporting posts 322, it shall be understood that there are many other ways of vertically moving the posts 322. For example, one such way is to use a pneumatic actuator, instead of an electric motor.

C. Apparatus and Method for Wafer Alignment and Final Loading

In the previous method of initially loading the wafer 308 into an alignment zone, the wafer loader 312 positions the wafer 308 generally above the wafer final loading region. However, it is difficult to position the wafer 308 over the final loading region to the desired tolerance. As previously discussed in Section I-B, it is an object of the invention to provide a cathode that makes contact to the surface of the wafer 308 within the exclusion zone. The exclusion zone is the concentric ring area adjacent the perimeter of the wafer 308 and is typically around 3 millimeters wide. Therefore, because of the tight tolerance required for positioning the wafer 308 into its final loading position, there is a need for an apparatus and method for wafer alignment and final loading.

Referring to FIG. 12, a wafer alignment apparatus in accordance with the invention comprises three or more wafer alignment pins 358 coaxially oriented within vertical channels formed through the wafer mounting base 314. One or more O-rings 359 may be situated coaxially around each of the wafer alignment pins 358 within the corresponding vertical channel to prevent leakage of plating, rinsing and/or other fluids therethrough. The lower end of the wafer alignment pins 358 are mounted to horizontal mounting plate 340. The upper end of each of the wafer alignment pins is tapered. The tapered end of each of the wafer alignment pins 358 and a straight upper portion thereof are situated above the wafer mounting base 358. As seen in FIG. 10, the wafer alignment pins 358 are annularly spaced around the wafer final loading position 308, preferably coincident with the wafer supporting posts 322. It shall be understood that more than three wafer alignment pins 358 may be provided.

Figure 13A:
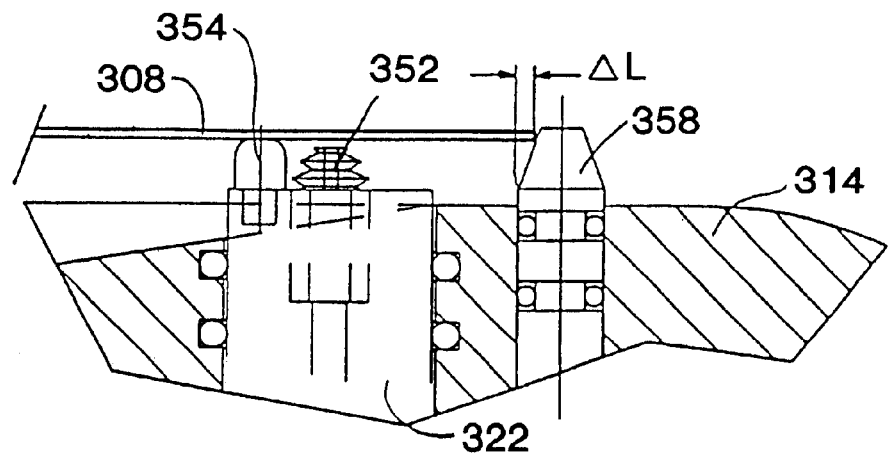
FIGS. 13A–C illustrate blow-up views of a portion of the wafer mounting assembly, with the wafer undergoing alignment procedure in accordance with the invention.

FIG. 13A illustrates a blow-up view of the wafer 308 situated in the alignment zone immediately after undergoing the initial loading method discussed above. At this position, the wafer supporting post 322 is making vacuum contact with the underside of the wafer 308 via the vacuum cup 352, and the wafer 308 is seated on the mechanical stop 354. As previously defined, the alignment zone is a region laterally adjacent to the tapered end of alignment pins 358. To exemplify the alignment method of the invention, the wafer 308 is shown slightly misaligned. In its final loading position, the edge of the wafer 308 lies approximately adjacent to the vertical surface of the alignment pin 358. Accordingly, the wafer 308 shown in FIG. 13A is misaligned by a distance of ΔL.

Figure 13B:
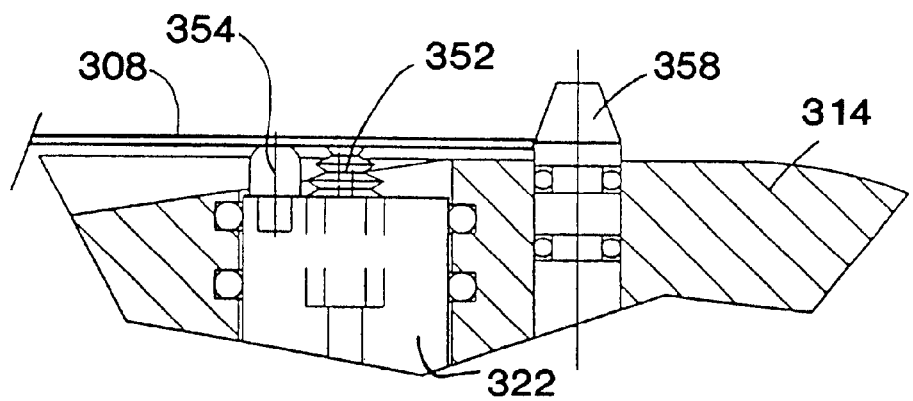

As illustrated in FIGS. 13A–B, a first step in the method for wafer alignment and final loading is to remove the vacuum contact of the wafer supporting posts 322 to the underside of the wafer 308. Then, the wafer supporting posts 322 are lowered by actuating the motor 334 to position the top of the posts 322 slightly above the final loading position. The lowering of the wafer supporting 322 causes the wafer 308 to drop. The wafer 308 then self-aligns by contacting and sliding down the tapered end of the alignment pin 358. Thus, at the end of this step, the wafer 308 is positioned approximately below the tapered end of the alignment pin 358, and is horizontally aligned with and positioned slightly above the final loading position.

Figure 13C:
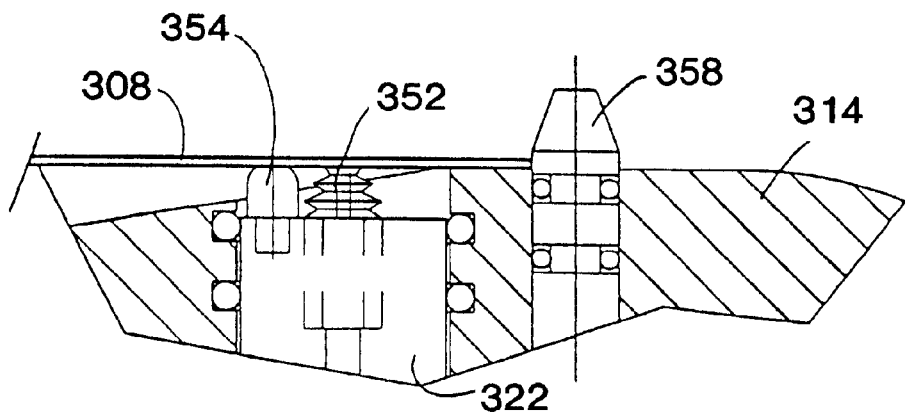

As illustrated in FIGS. 13B–C, a subsequent step in the method for wafer alignment and final loading is to re-engage the vacuum contact of the top of the wafer supporting posts 322 to the underside of the wafer 308. Then, the motor 334 is actuated to lower the wafer supporting posts 322 so that the edge of the wafer 308 is disposed on the wafer mounting base 314. The wafer 308 is now in its final loading position. At the final loading position, the edge of the wafer 308 lies approximately adjacent to the three alignment pins 358 (See FIG. 10). Although alignment pins 358 are used to cause the wafer 308 to self align, it shall be understood that other structures having an inclined surface such as the tapered end of the alignment pins 358 can also be used in accordance with the invention.

D. Apparatus and Method for Supporting the Wafer

As previously discussed in Section I-A of the specification, one aspect of the fluid dynamics of the invention is to position the wafer near the bottom of a bath of plating fluid. The bath, however, may comprise a large volume of plating fluid. Because the wafer is situated near the bottom of the bath, the large volume of plating fluid exerts substantial hydrostatic pressure on the wafer. If the perimeter of the wafer were disposed on a mechanical surface (e.g. an annular pad support), the hydrostatic pressure may cause the wafer to crack and/or deform. In addition, the cracking and/or warping of the wafer may cause plating fluid to creep under the wafer and contaminate the wafer underside. Accordingly, there is a need for an apparatus and method for supporting the wafer such that it will not flex because the hydrostatic pressure on both side of the wafer is substantially equalized. This prevents the wafer from cracking and/or deforming.

Figure 14:
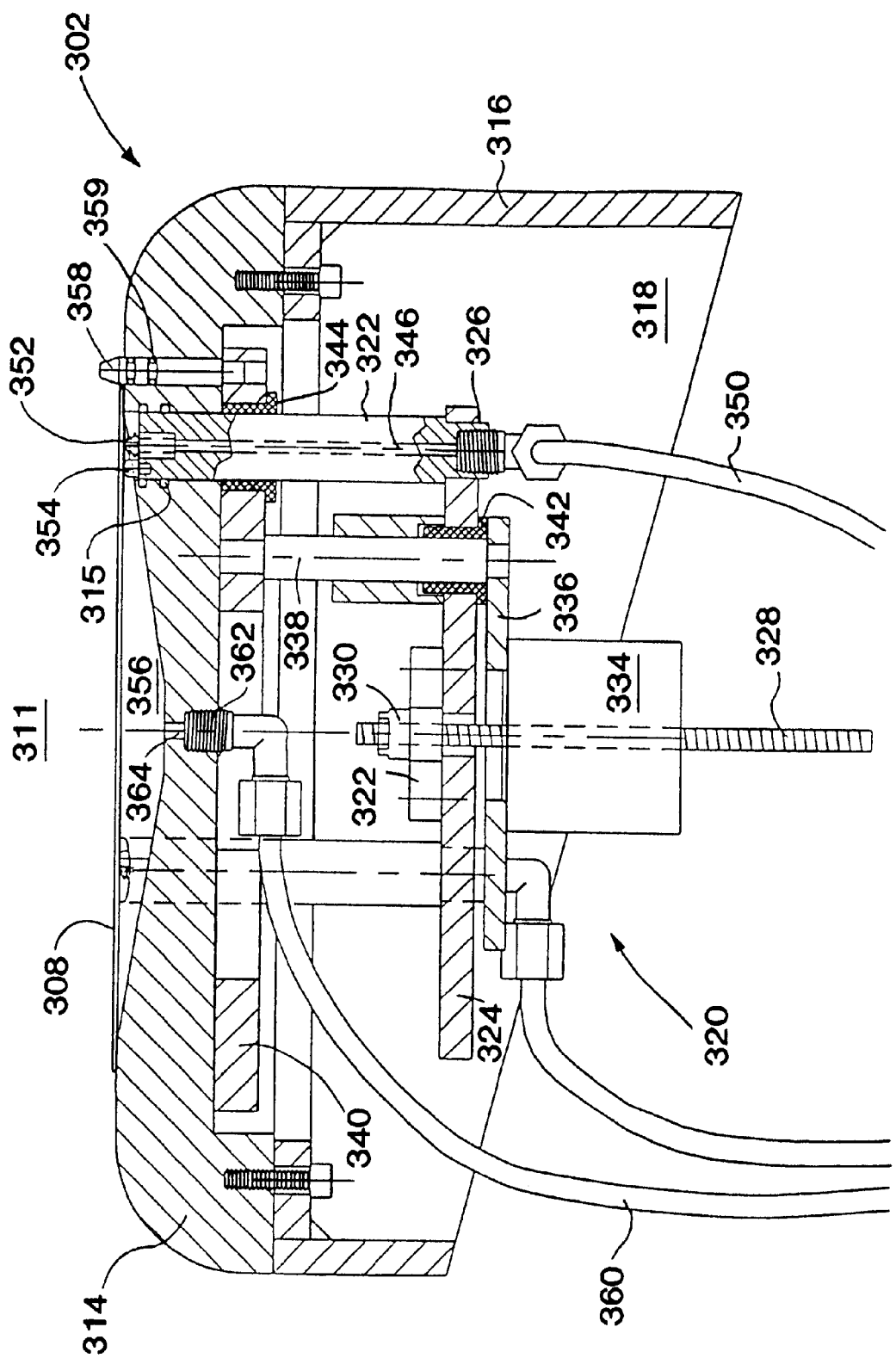
FIG. 14 illustrates a close-up cross-sectional view of a wafer mounting assembly in accordance with the invention, with a wafer in a final loading position.

FIG. 14 illustrates a cross-sectional view of the wafer mounting assembly 302 with the wafer 308 in its final loading position. The wafer mounting base 314 includes a circular recess 356 that is approximately concentric with the wafer 308 in its final loading position. The recess 356 is preferably horizontal around its center region and inclined elsewhere. The diameter of the recess 356 is slightly smaller than the diameter of the wafer 308. This allows the perimeter of the wafer 308 to rest on the wafer mounting base 314. The majority of the wafer 308, except for the perimeter area supported by the wafer mounting base 314, is supported by a wafer supporting fluid that is situated within the recess 356. The wafer supporting fluid counteracts the pressure from the plating fluid bath, and prevents the wafer 308 from cracking and/or deforming by evenly distributing the pressure and conforms to any surface irregularities on the surface of the wafer. Therefore, the wafer supporting fluid provides a continuous counteracting hydrostatic force, even though the wafer is non-planar. In the preferred embodiment, the wafer supporting fluid comprises de-ionized (DI) water.

In the preferred implementation of the method for supporting the wafer, the wafer supporting fluid is introduced into the recess 356 prior to the positioning of the wafer 308 into its final loading position. While the wafer 308 is situated above the final loading position, wafer supporting fluid is introduced into the recess 356 by way of feed/drain tube 360 situated within the housing 316 of the wafer mounting assembly 302. The end of the feed/drain tube 360 includes a fitting 362 for mating with a threaded hole in the wafer-mounting base 314. A small duct 364 extends from the threaded hole to the recess 356, preferably near its center. Once the recess 356 is filled with the wafer supporting fluid such that the fluid level is approximately at the top of the wafer mounting base 314, the wafer 308 is lowered into its final loading position preferably in accordance with the method described in Section II-C of the specification. Placing the wafer 308 onto its final loading position or pressure exerted by the plating or rinsing fluids may cause displacement of the wafer supporting fluid on top of the wafer mounting base 314. This is a spill over area.

Although in the preferred embodiment, the recess 356 has a horizontal center section and an inclined outer section, it shall be understood that other configurations for the recess 356 can be employed. For example, the recess 356 can have a horizontal bottom and vertical walls. In addition, the end of the feed/drain 360 need not be positioned at the center, and it is plausible also to have separate feed and drain lines for the wafer supporting fluid. Furthermore, the spill over area need not be at the top surface of the wafer-mounting base 314, but overflow ducts may be incorporated into the wafer mounting assembly 302 to drain out any displaced fluid from the recess 356. These types of modifications are within the purview of one skilled in the relevant art.

E. Apparatus and Method for Cathode Alignment

Once the wafer 308 is in its final loading position as described in Section II-C and is supported by the wafer supporting fluid as described in Section II-D, the next step in the overall plating process is to align the cathode to the wafer for making contact therewith. As with the alignment of the wafer 308, the alignment of the cathode is also critical because of the small exclusion zone of the wafer surface to which the cathode needs to make contact. Since the cathode is located at the bottom of the cylinder/distribution ring assembly 304, lowering the cylinder/distribution ring assembly 304 for proper placement on the wafer mounting assembly 302 is also critical.

Referring back to FIG. 8, the cylinder/distribution ring assembly 304 is preferably at its full raised position during the initial loading, final loading, and wafer supporting fluid steps as described in Sections II-B, C and D. During the plating method as will be described in Section II-G, the cylinder/distribution ring assembly 304 is at its full lowered position making a fluid seal contact with the wafer mounting assembly 302. To vertically position the cylinder/distribution ring 304, the plating apparatus 300 includes a cylinder lift assembly 400 comprising three or more two-mode pneumatic cylinder assemblies 402 (one shown in FIG. 8) mounted on a top horizontal mounting plate 404 for lowering and raising the cylinder/distribution ring assembly 304; three corresponding mechanical couplings 406 (one shown in FIG. 8) for coupling the cylinder/distributing ring assembly 304 to the pneumatic cylinder assemblies 402; and a flexible boot 408 mechanically coupled to the top of cylinder/distribution ring assembly 304 and to the underside of the top mounting plate 404 for allowing small horizontal (x-y direction) movement of the cylinder/distribution ring 304, while restricting rotational movement thereof.

Figure 15:
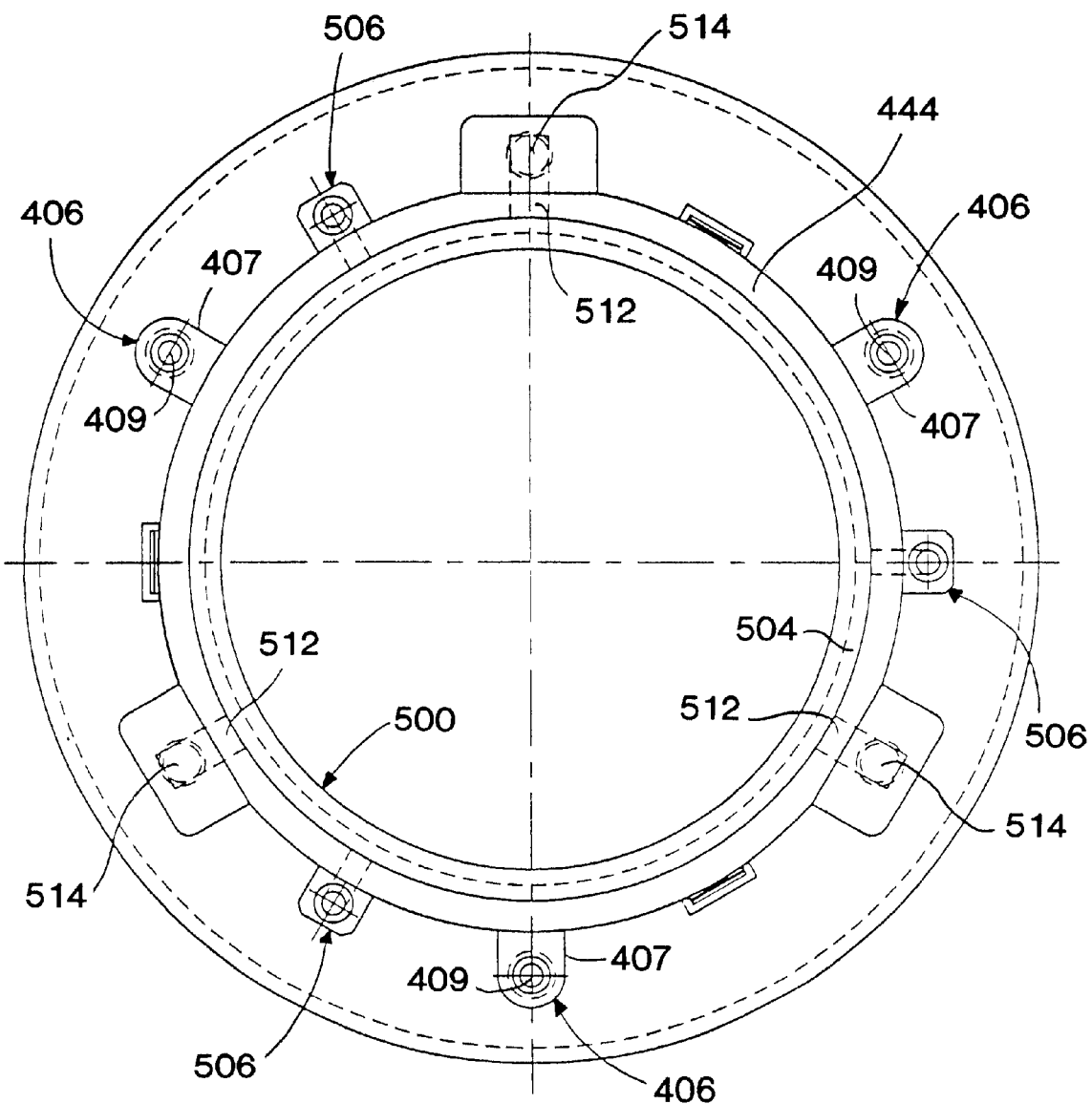
FIG. 15 illustrates a top view of a cylinder/distribution ring assembly in accordance with the invention.

Referring to both FIGS. 8 and 15 (which is a top view of the cylinder/distribution ring assembly 304), the mechanical couplings 406 of the cylinder/distribution ring assembly 304 each comprises a projection 407 having a through-hole 409. In the preferred embodiment, the three couplings 406 are annularly spaced around the cylinder with substantially equal angles between each of the coupling 406 (i.e. they are 120° apart from each other). The couplings 406 extend radially outward from the cylinder wall 444. It shall be understood that there are many ways to couple the cylinder/distribution ring 304 to the cylinder lift assembly 400, which are within the purview of one skilled in the art.

Figure 16:
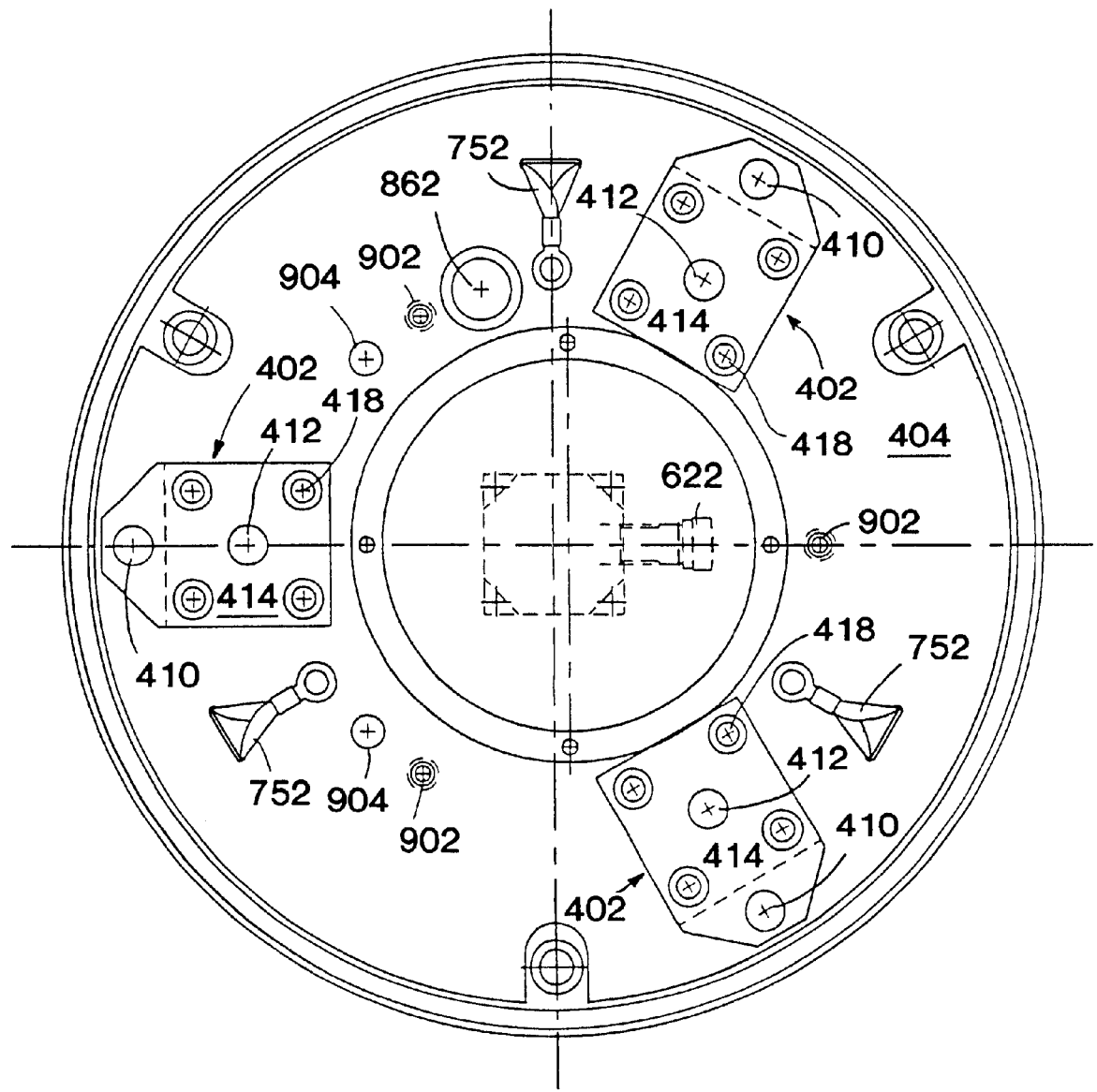
FIG. 16 illustrates a top view of the plating apparatus in accordance with the invention.

Referring to both FIGS. 8 and 16 (top view of the plating apparatus), each of the two-mode pneumatic assemblies 402 comprises a long-stroke cylinder 410 and a short-stroke cylinder 412, operating in combination, to provide vertical movement of the cylinder/distribution ring assembly 404 from its full raised position to its full lower position. The short-stroke cylinder 412 also independently lifts the cylinder/distribution ring assembly 304 off the wafer mounting assembly 302 for allowing drainage of the plating fluid, as will be explained in more detail in Section II-H (the short-stroke cylinder 412 does not play a role in the cathode alignment). The long and short stroke cylinders 410 and 412 are mounted on a plate 414 that is supported above the top mounting plate 404 by a base 416. Preferably, three guide-posts 418 extend upward from the top mounting plate 404 through the base 416 and plate 414, and above the plate 414. The short-stroke cylinder 412 includes a piston 420 mechanically coupled to the base 416. The long-stroke cylinder 410 also includes a piston 424 coupled to an extender 426 that extends through and below the top mounting plate 404. A resilient mechanism 425, such as a spring, is sandwiched between plate 414 and mounting plate 404. The extender 426 extends through the hole 409 of the coupling mechanism 406 and terminates with a shoulder 428. The shoulder 428 supports the cylinder/distribution ring assembly 304 during vertical movement thereof. The extender 426 also includes a resilient mechanism 427, such as a spring, and a mechanical stop 429 situated immediately above the cylinder coupling mechanism 406. In the preferred embodiment, there are three two-mode pneumatic cylinder assemblies 402 that are equally spaced in an angular direction to coincide with the mechanical couplings 406. It shall be understood that more than three cylinder assemblies can be employed.

Referring to only FIG. 8, the flexible boot 408 preferably comprises a central portion 430 that is configured into a bellows, and upper and lower ends that are configured into top and bottom flanges 432 and 434. The top flange 432 is connected to the underside of the top mounting plate 404 by any suitable means, such as screws 436. The bottom flange 434 is connected to the top rim of the cylinder/distribution ring assembly 304 also by suitable means, such as screws 438. The flexible boot is preferably made out of a resilient sealing material, such as Viton® material, which is compliant in the horizontal direction (x-y direction), but restricted rotationally.

Referring to both FIGS. 7 and 8, when the cylinder/distribution ring assembly 304 is lowered to mate with the wafer mounting assembly 302, both the long-stroke cylinder 410 and short-stroke cylinder 412 are actuated to the cylinder/distribution ring assembly. The lowering of the cylinder/distribution ring assembly 304 continues until it mates with the wafer mounting assembly 302. The long-stroke cylinder 410 continues to lower even after the cylinder mates with the wafer mounting assembly 302 to allow the cylinder/distribution ring 304 to self-align with the wafer mounting assembly 302. This further lowering of the extender 426 causes the mechanical stop 429 to compress the spring 427 so that a downward biasing force is produced to firmly hold the cylinder/distribution ring assembly 304 against the wafer mounting assembly 302. Note that when the cylinder/distribution ring 304 is at its full lower position, the shoulder 428 of the extender 426 is spaced apart from the coupling mechanism 406.

Figure 17A:
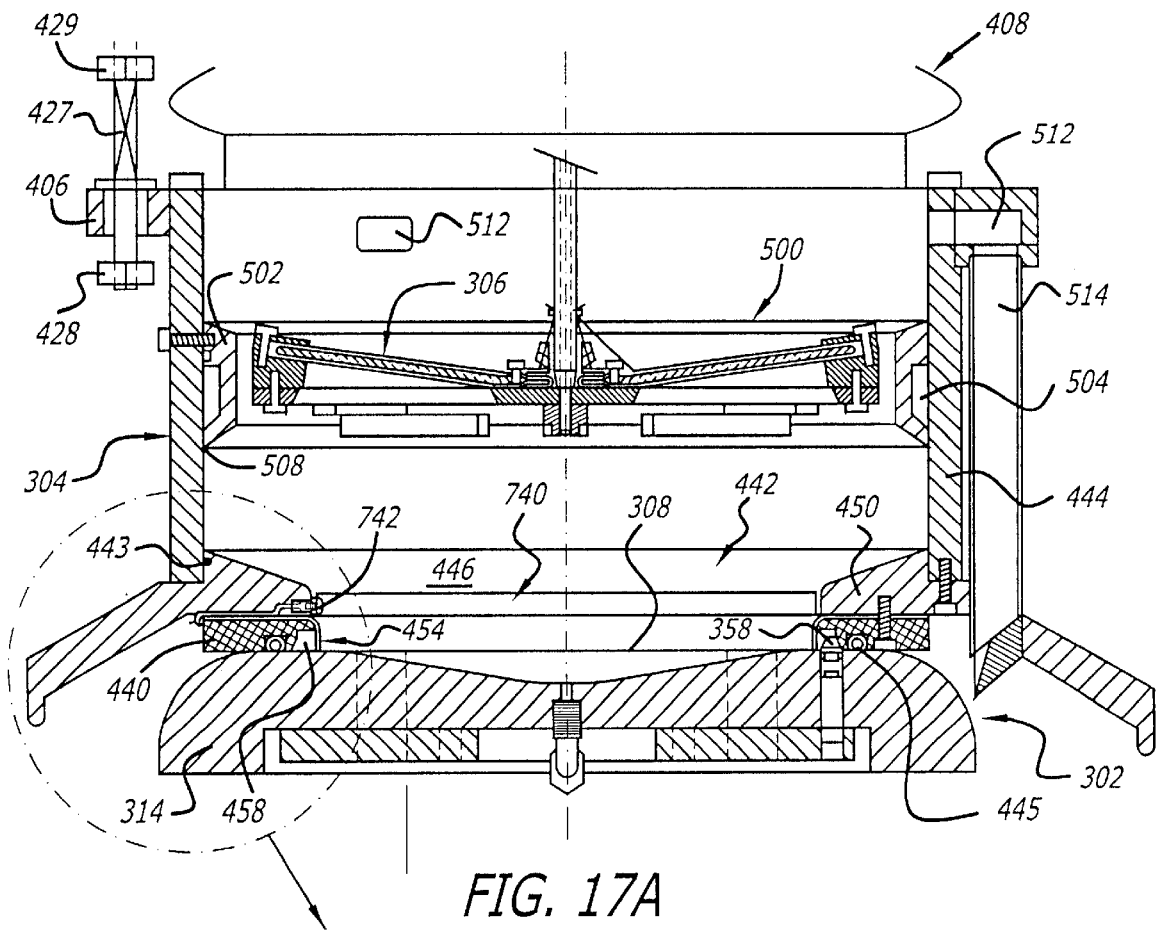
FIGS. 17A–B illustrate a cross-sectional view and blow up view of the cylinder/distribution ring assembly in mating relationship with the wafer mounting assembly in accordance with the invention.
Figure 17B:
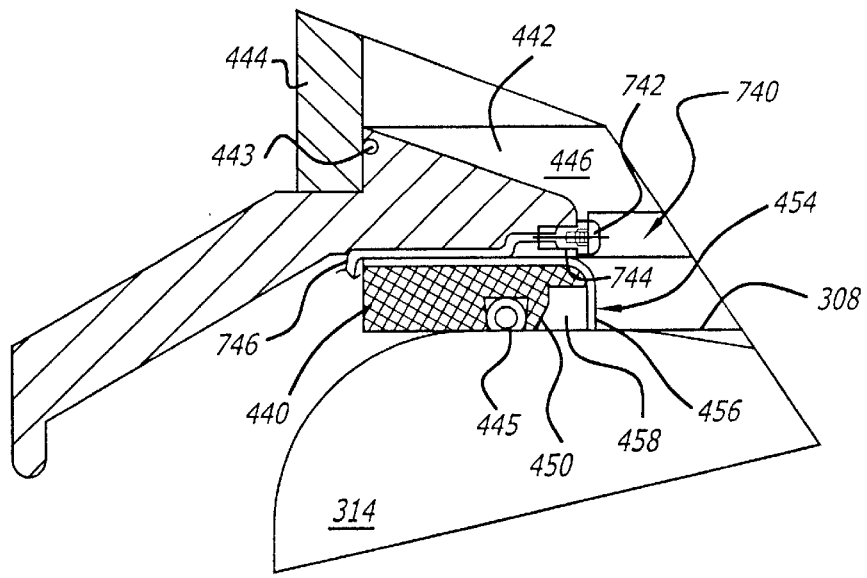

FIGS. 17A–B illustrate a cross-sectional view and blow up view of the bottom of the cylinder/distribution ring assembly 304 in mating relationship with the top of the wafer mounting assembly 304. At its lower end, the cylinder/distribution ring assembly 304 comprises a cathode ring 440 mounted to a cathode ring mount 442 that is, in turn, mounted to the cylindrical wall 444. An O-ring 443 is positioned between the cylinder wall 444 and the cathode ring mount 442 to prevent leakage of plating or rinsing fluid between these two structures. The cathode ring mount 442 includes an upper inclined surface 446 and a lower vertical surface 448. The cathode ring mount 442 serves three functions: (1) it provides a structure to which the cathode ring 440 is mounted to; (2) its inclined surface 446 and vertical surface 448 direct the plating and rinsing fluid toward the wafer 308; and (3) it protects the cathode ring 400 from exposure to the plating fluid. For the purpose of properly aligning the cathode ring 440 to the wafer mounting assembly 304 to provide the desired contacting of the cathode to the exclusion zone of the wafer 308, the cathode ring 440 includes an alignment groove 450 having a surface that is similarly inclined with the tapered end of the alignment pins 358.

The method of properly aligning the cathode ring 440 over the wafer mounting assembly 304 will now be described. When the cylinder/distribution ring 304 is lowered for mating with the wafer mounting assembly 302, the cathode ring 304 may be slightly misaligned in the horizontal direction. Because of the misalignment, the alignment groove 450 makes contact with the tapered end of one of the alignment pins 358 when the cylinder is lowered. The contacting of the alignment groove 450 and the alignment pin 358 will cause the cylinder/distribution ring assembly 304 to self-align. The flexible boot 408 allows the cylinder/distribution ring assembly 302 to be compliant in the horizontal direction (x-y direction) to allow the assembly 302 to self-align with the alignment pins 358. Furthermore, since the shoulder 428 supporting the cylinder/distribution ring assembly 304 is lowered a further distance below the coupling mechanism 406, the cylinder/distribution ring assembly 304 self-aligns on its own accord. As shown in FIG. 17A, proper alignment and positioning of the cathode ring 450 over the wafer mount assembly 302 occurs when the alignment groove 450 is substantially adjacent to the alignment pins 358, and an O-ring 445 of the cathode ring 440 makes fluid seal contact with the wafer mounting base 314.

Although the cylinder lift assembly 400 uses pneumatic cylinders to vertically move the cylinder/distribution ring assembly 302, it shall be understood that there are many other methods of performing the same function. For example, an electric motor, such as a stepper motor, can be used in place of a pneumatic cylinder. In addition, the coupling between the cylinder, distribution ring assembly 304 and the pneumatic assembly 412 need not comprise a piston/extender/shoulder supporting the cylinder ears 406, but can be any technique for supporting the cylinder 304 during its vertical movement. Finally, the flexible boot 408 need not be made of a resilient sealing material, such as Viton® material in a bellows configuration, but can comprise any structure that is compliant in the horizontal direction (x-y direction), while restricted rotationally.

F. Apparatus and Method for Cathode Contacting a Wafer

Figure 18:
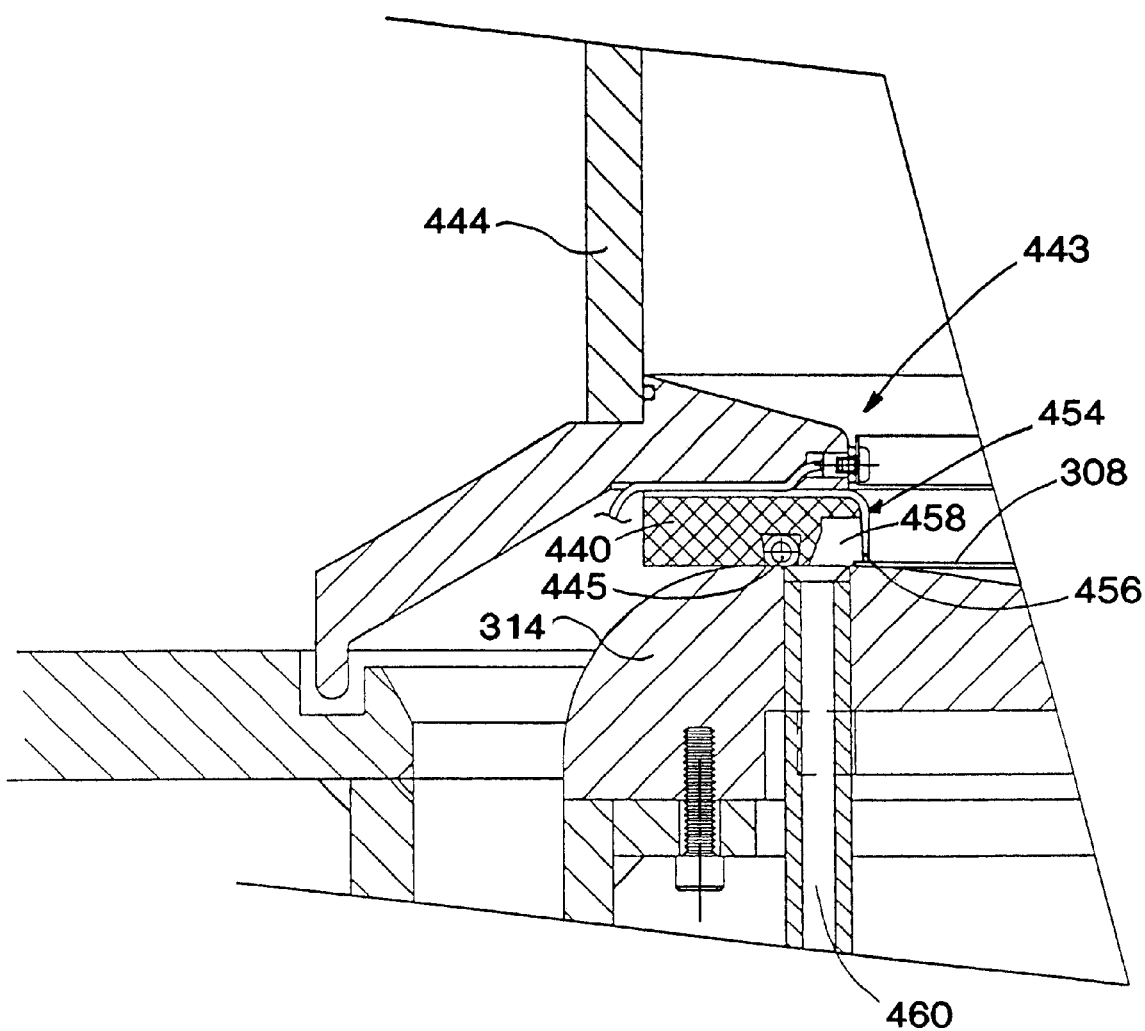
FIG. 18 illustrates a blow-up cross-sectional view of a portion of the wafer mounting assembly having a conductive fluid channel and feed/drain line in accordance with the invention.

Referring to FIG. 18, it illustrates the apparatus and methodology used for providing a cathode contact to the surface of the wafer 308. As previously discussed, the exclusion zone is a three (3) millimeter wide ring-shaped surface area adjacent to the perimeter of the wafer 308. It is this area to which the cathode needs to make contact. The remaining area of the wafer surface is reserved for the plating deposition. Within the exclusion zone, the cathode of the invention makes contact to the outer 2 millimeter wide ring-shaped surface area of the exclusion zone. This area is defined herein as the "cathode contact area." The remaining surface area of the exclusion zone, i.e. a 1 millimeter wide ring-shaped surface area 2 millimeters away from the perimeter of the wafer, is reserved to make a fluid seal to prevent leakage of plating fluid via the perimeter of the wafer 308. This area is defined herein as the "fluid seal area."

To establish this fluid seal, a fluid sealing element 454 is provided between the cathode ring 440 and the cathode ring mount 442, and includes a lip seal ring 456 that makes a fluid seal contact with the wafer 308 at the "fluid seal area." The lip seal ring 456 prevents plating fluid from leaking through pass the perimeter of the wafer 308. This protects the cathode ring 440 from exposure to the plating fluid, as well as the underside of the wafer 308. Note that the cathode ring 440 does not make mechanical contact to the "cathode contact area" of the wafer. Instead, a channel 458 exists between the lip seal ring 456 and the alignment groove 450 for receiving an electrically conductive fluid. The conductive fluid within the channel 458 provides the electrical connection of the cathode ring 440 to the "cathode contact area" of the wafer 308. A feed/drain 460 is provided to introduce the conductive fluid into the channel 458 prior to plating, and to drain the conductive fluid after plating. In the preferred embodiment, the conductive fluid comprises 5–10 percent sulfuric acid and the remaining is DI water.

The advantage of using a conductive fluid versus a mechanical contact in making the cathode connection to the wafer 308 is that the fluid contact does not typically damage the wafer, whereas a mechanical contact tends to warp and/or deform the wafer. Another advantage of the fluid contact is that it provides a relatively large contact surface area since the contact is continuous throughout the "cathode contact area." For example, the two (2) millimeter wide cathode contact area amounts to approximately a two (2) square-inch surface area. That is substantial considering how small the width of the "cathode contact area" is.

Because of the relatively large contact surface area, the resistance of the contact is relatively small. This increases the current carrying capacity of the contact, which can lead to much higher plating rates. Yet another advantage of the conductive fluid contact is that the electrical contact is more uniform throughout the "cathode contact area." This results is a more uniform plating deposition across the surface of the wafer. Still another advantage of the conductive fluid, particularly if it comprises sulfuric acid, is that typically the plating fluid also comprises sulfuric acid. Therefore, if the plating fluid leaked into the channel 458, it would not significantly contaminate the conductive fluid, nor would it substantially affect the electrical properties of the fluid. Although the conductive fluid cathode contact is advantageous, a mechanical contact can be also used.

G. Apparatus and Method of Plating a Wafer

1. Fluid Dynamics a) Apparatus and Method for Directing Streams of Plating Fluid to the Surface of the Wafer As previously discussed in Section I-A of the specification, one of the objectives of the plating methodology of the invention is to provide a relatively fast plating rate. An aspect of the fluid dynamics of the plating method of the invention helps in achieving this objective. This aspect is forcibly directing fresh plating fluid toward the surface of the wafer while the wafer is immersed in a bath of plating fluid. As previously explained, by directing fresh plating fluid toward the surface of the wafer, the gradient of the ion concentration in the bath is increased. The current between the anode and the cathode is proportional to the ion concentration gradient within the bath. In addition, the current is, in turn, proportional to the plating rate. Accordingly, increasing the ion concentration gradient by forcibly directing fresh plating fluid toward the surface of the wafer, increases the current, and therefore, increases the plating rate to provide a relatively fast plating rate. Furthermore, the constant directing of plating fluid toward the surface of the wafer 308 continuously replenishes the plating ions that are being depleted to form the plating deposition.

Referring to FIGS. 15 and 17A, to effectuate this method of forcibly directing fresh plating fluid toward the surface of the wafer 308, the cylinder/distribution ring assembly 304 comprises the cylinder wall 444 having the lip seal ring 454 at its lower end to make a fluid seal contact with the surface of the wafer 308 at the exclusion zone. The cylinder/distribution ring assembly 304 also includes the additional O-ring 445 for making a fluid seal contact with the wafer mounting base 314. The combination of the cylinder wall 444, the wafer 308, and the lip seal ring 454 forms the container in which to support the plating fluid bath.

The cylinder/distribution ring assembly 304 also includes a distribution ring 500 for forcibly directing fresh plating fluid toward the surface of the wafer 308 while the wafer is immersed in the plating fluid. The distribution ring 500 comprises a ring-shaped housing 502 connected to the inner surface of the cylinder wall 444 in a coaxial manner. The mating of the housing 502 to the cylinder wall 444 forms an intake ring-shaped cavity 504. The distribution ring 500 further includes at least one feed port 506, preferably three, for receiving plating and rinsing fluid as well as clean dry air (CDA) from external sources, and communicating the fluids to the intake cavity 504. To direct the plating fluid toward the surface of the wafer 308, the distribution ring 500 includes an annular slot 508 fluidly coupled to the intake cavity 504. The annular slot 508 is situated between the distribution ring 500 and the cylinder wall so that the plating or rinsing fluid cascades down to the surface of the wafer 308.

In operation, once the wafer 308 is in its full loading position and the cylinder/distribution ring assembly 304 is in a mating relationship with the wafer mounting assembly 302, fresh plating fluid is introduced into the intake cavity 504 by way of the plurality of feed ports 506. The plating fluid quickly fills the intake cavity 504 and exits the cavity via the annular slot and cascades down the cylinder wall 444, and cathode ring mount 442 toward the surface of the wafer 308. The plating bath begins to fill up with plating fluid immersing the anode assembly 306 in plating fluid. The plating of the wafer can now begin.

Although the distribution ring 500 is attached to the cylinder wall 444 in the preferred embodiment, it shall be understood that this need not be the case. The distribution ring can be a separate assembly. Also, the distribution ring 500 nor the cylinder wall 444 need not be cylindrical or ring-like shaped, but can encompass many other shapes including rectangular, triangular, hexagonal shapes. The shape of the distribution ring 500 and the cylinder wall 444 are not critical to the invention. Furthermore, the annular slot 508 need not be continuous, and can comprise a plurality of orifices to form separate streams of fluid. In addition, the annular slot 508 need not be adjacent to cylinder wall 444 but can be angled toward the center of the wafer 308.

b) Apparatus and Method for Effecting Random X-V Direction Fluid Flow

As previously discussed in Section I-A of the specification, another objective of the plating methodology of the invention is to provide a substantially uniform plating deposition across the surface of the wafer. A second aspect of the fluid dynamics of the plating method helps in achieving this objective. This second aspect is effecting random horizontal (x-y direction) of fluid flow within the plating fluid bath. As previously explained, the effecting of random x-y fluid flow within the bath prevents the formation of lengthy horizontal fluid flow across the surface of the wafer. Since during plating, ions are continuously being removed from the fluid bath, the ion concentration at the beginning of a lengthy horizontal fluid flow is high. This results in a high ion deposit on the surface of the wafer at the beginning of a lengthy horizontal fluid path. As the lengthy fluid flow continuous, its ion concentration is being depleted, therefore less plating ions are deposited as the fluid flows across the surface of the wafer. As a result, a gradient of deposited plating ions results across the surface of the wafer, which forms a non-uniform plating deposition. The random x-y fluid flow reduces lengthy horizontal fluid flow which helps improve the uniformity plating deposition on the wafer surface.

Figure 19:
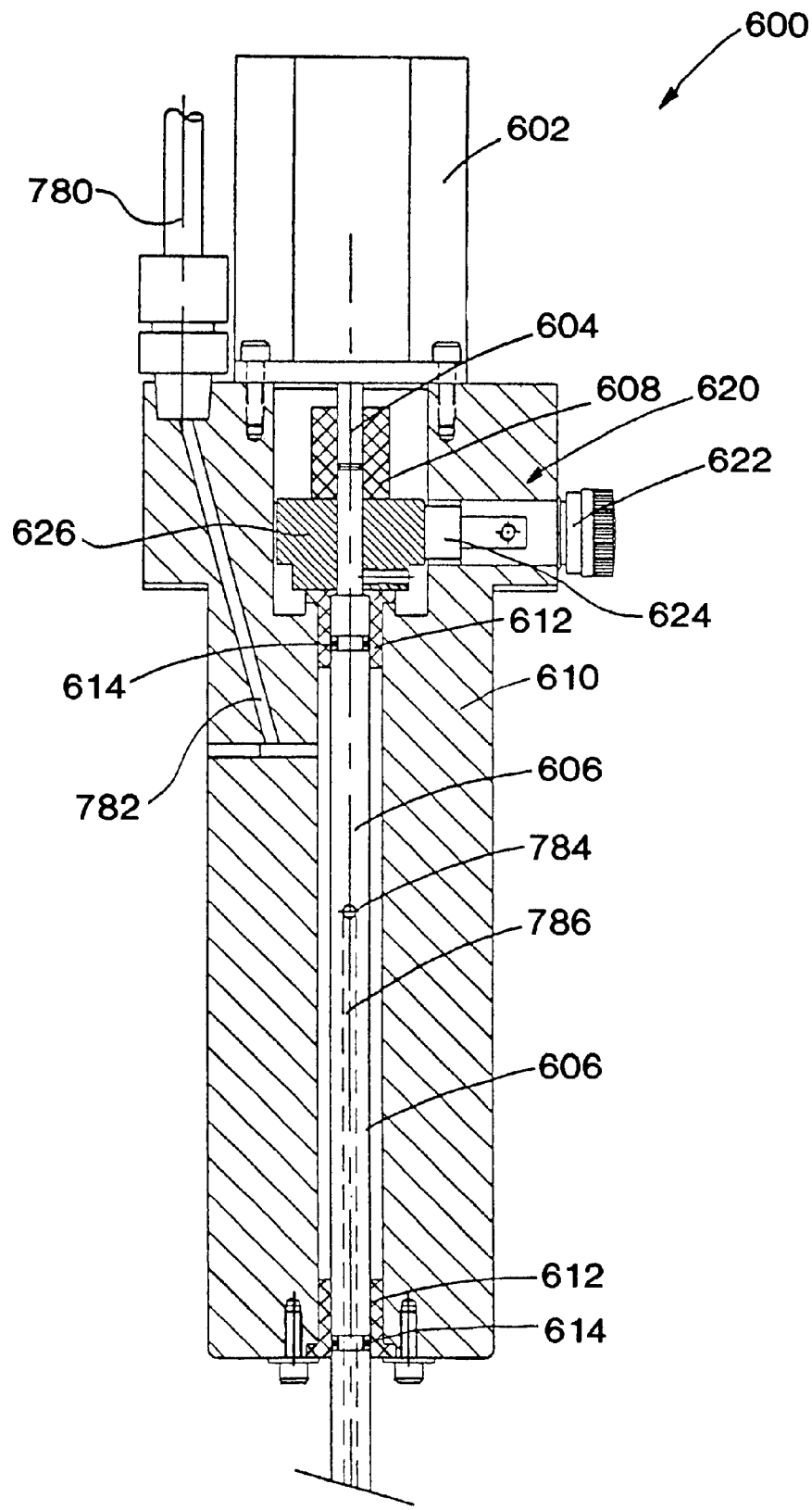
FIG. 19 illustrates a close-up cross-sectional view of a rotary assembly in accordance with the invention.
Figure 21A:
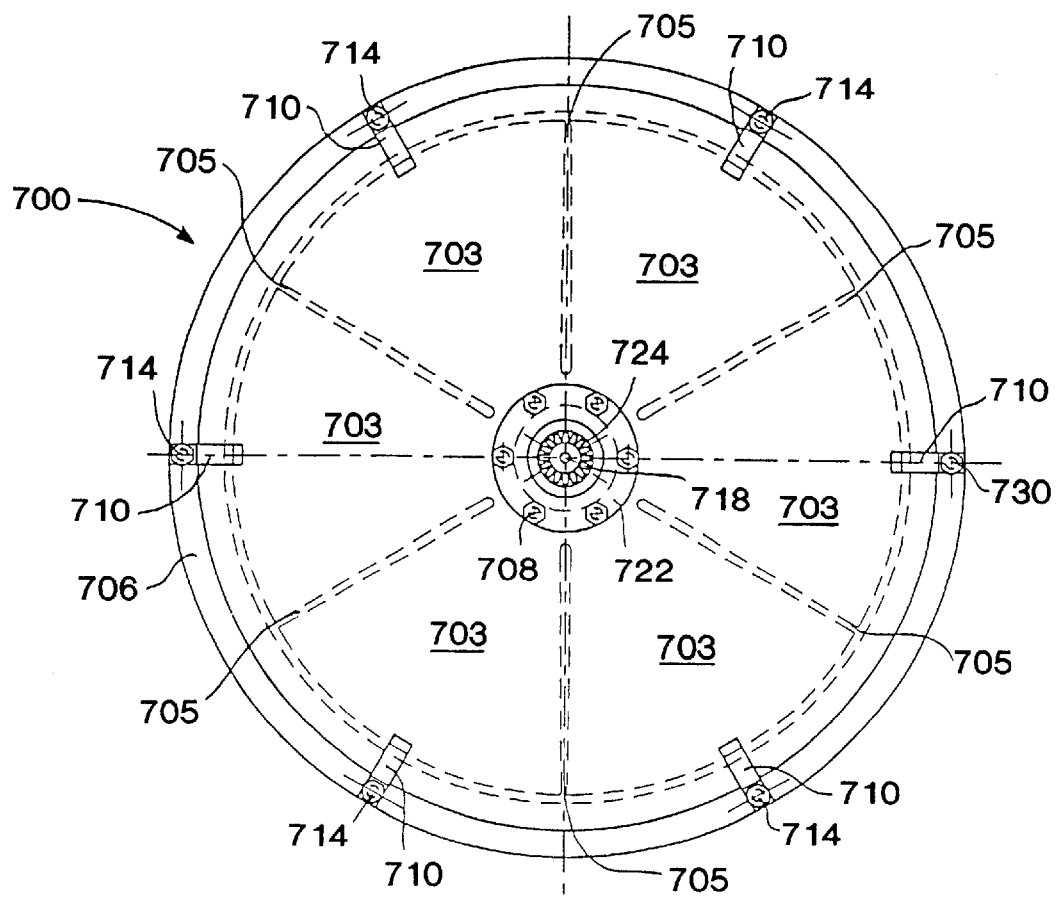
FIGS. 21A–B illustrate top and cross-sectional views of a soluble anode assembly in an angled-up configuration in accordance with the invention.
Figure 21B:
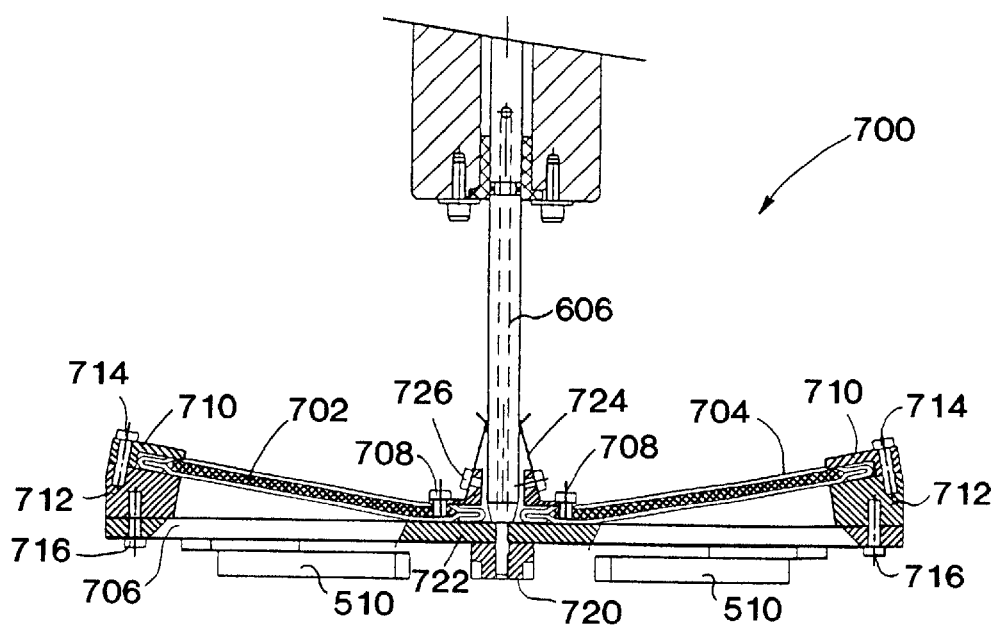

Referring to FIGS. 7, 19 and 21B, to effectuate random horizontal (x-y direction) fluid flow within the plating fluid bath, the anode assembly 306 includes one or more paddles 510 for randomly stirring the plating fluid bath. The plating apparatus 300 further includes a rotary assembly 600 for effecting random rotation of the anode assembly 306 to cause the paddles 510 to randomly stir the plating fluid bath. The anode rotary assembly 600 comprises an electric motor 602 having a motor shaft 604 rotatably coupled to an anode shaft 606 via a coupling 608. The motor shaft 604 and an upper portion of the anode shaft 606 are situated coaxially within a bearing housing 610. Preferably, the bearing housing 610 includes two bearing sleeves 612 that separates the anode shaft 606 from an inner wall of the bearing housing 610. In addition, the bearing housing 610 preferably includes two O-rings 614 to prevent leakage into and out-of the bearing housing 610. The lower end of the anode shaft 606 is rotatably coupled preferably to the center of the anode assembly 306.

In operation, once the wafer 308 is in its full loading position, the cylinder/distribution ring assembly 304 is in mating relationship with the wafer mounting assembly 302, and the plating fluid bath is formed, the electric motor 602 is actuated to rotate in a random manner. The random control of the motor 602 can be accomplished in many ways, preferably with a computer or microprocessor (not shown). With regard to the random control, the motor speed can be varied randomly, as well as the rotational direction (i.e. being clockwise or counter-clockwise) can be varied randomly. The random rotation of the electric motor 306 translates to a random movement of the paddles 510 via the motor shaft 604, anode shaft 606, and the anode assembly 306. The random movement of the paddles 510 effectuates the random horizontal (x-y direction) fluid flow for improving the uniformity of the plating deposition across the surface of the wafer.

Although the paddles 510 are part of the anode assembly 306 in the preferred embodiment, it shall be understood that this need not be the case. The paddles as well as the rotary assembly 600 need not be integral with the anode assembly. In addition, the paddles 510 need not be configured in a straight fashion, but can include random curved surfaces to further randomize the horizontal fluid flow of the plating fluid bath. Furthermore, the electric motor 602 can be of any type, for example, it can a stepper motor, a direct current (DC) motor, alternating current (AC) motor, and others. The type of motor used is not critical to the invention.

c) Apparatus and Method for Controlling Plating Fluid Path Flow

During the plating process, fresh plating fluid is continuously being injected into the bath through the distribution ring 500 to continuously replenish the plating ions at the surface of the wafer 308. Because the volume of the plating fluid bath is finite, the constant introduction of plating fluid into the bath causes the bath to overflow. Thus, there is a need for an apparatus and method for controlling the plating fluid path flow out of the bath. In addition, there is a need to recycle the plating fluid back to the distribution ring to prevent unnecessary waste of the plating fluid.

Referring to FIGS. 15 and 17, to effectuate the method of controlling plating fluid flow out of the bath and directing it to the sump area 310 for recycling thereafter, the cylinder/distribution ring assembly 304 includes one or more overflow slots 512 that is/are fluidly coupled to a corresponding overflow duct 514 that leads down to the sump area 310. The lower end of the overflow duct 514 is beveled to direct plating fluid towards the wafer mounting base 314. In operation, during the plating process, plating fluid continuously overflows out of the plating bath into the overflow ducts 512. The overflow plating fluid then enters the overflow ducts 514 and flows down towards the sump area 310. The beveled end of the overflow ducts 514 directs the overflowed plating fluid onto the wafer mounting base 314 to cause a "cascading flow" of the plating fluid down to the sump area 310 by way of the housing 316. This cascading flow minimizes splashing and provides a controlled manner of directing the plating fluid down to the sump area 3 10.

2. Electrostatics—Anode a) The Power Supply Electrical Connection to the Anode

For all the anode assemblies disclosed herein, there is a need to electrically connect the positive terminal of the plating power supply (not shown) to the anode assembly 306. A uniqueness of the invention in accomplishing this task is that it uses the same parts that perform other functions involved in the plating process. These functions include rotating of the stirring paddles to effectuate random horizontal (x-y movement) fluid flow within the plating fluid bath (Section II-G-b), rotating the anode assembly to dry the anode (Section II-I), and drying the wafer (II-K).

Referring to FIG. 19, the motor assembly 600 incorporates an anode electrical connection assembly 620 used to provide an electrical connection of the positive terminal of the plating power supply to the anode assembly 306. The anode electrical connection assembly 620 comprises a connector 622 for connecting to the positive terminal of the plating power supply. The connector 622 is electrically coupled to a brush 624 and a commutator 626. The commutator 626 is rotatably secured and electrically connected to the anode shaft 606. As previously explained, the anode shaft 606 (which comprises an electrical conductor, such as titanium) is electrically coupled to the anode assembly 306. Accordingly, the positive anode voltage is communicated to the anode assembly 306 via the connector 622, brush 624, commutator 626 and anode shaft 606.

It shall be understood that there are many other ways of supplying positive voltage to the anode assembly. For instance, the anode electrical connection assembly 620 need not be part of the rotary assembly 600, but could be a separate assembly, or incorporated with another assembly.

b) Insoluble Anode

Figure 20A:
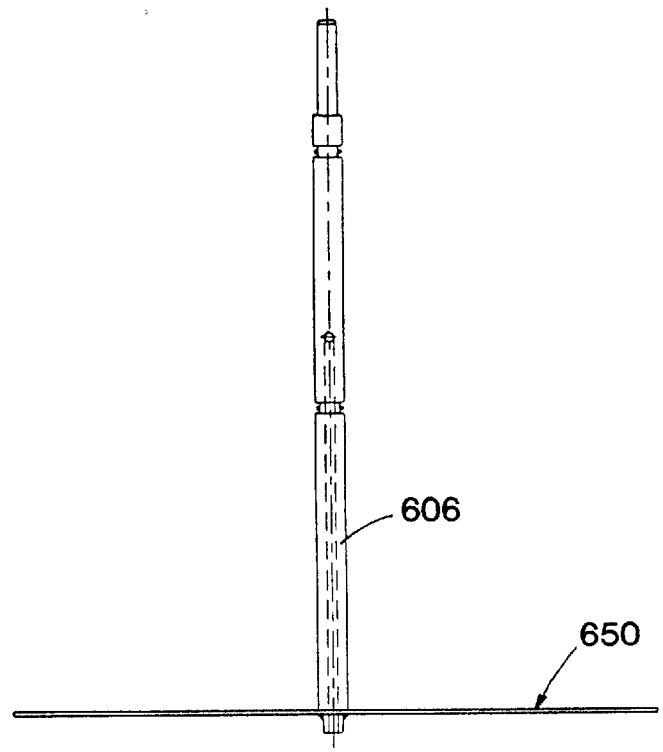
FIGS. 20A–B illustrate side and top views of an exemplary insoluble anode in accordance with the invention.
Figure 20B:
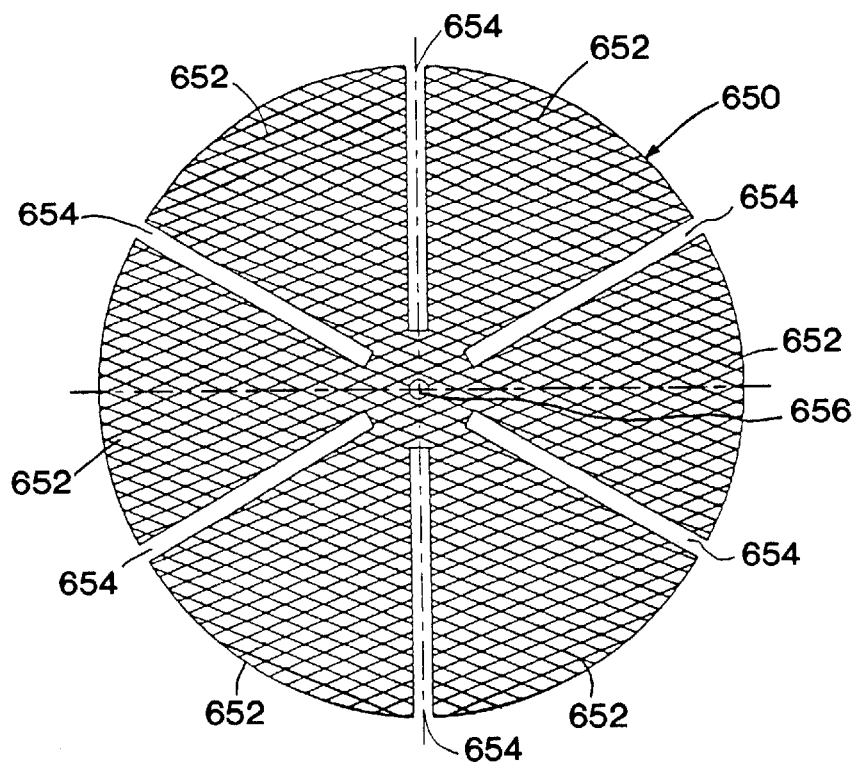

FIGS. 20A–B illustrate side and top views of an exemplary insoluble anode 650 in accordance with the invention. The insoluble anode 650 is preferably configured into a metallic mesh. The insoluble anode, preferably comprising titanium plated with platinum, is configured into a circular disk, and is subdivided into a plurality of peddles 652. In the preferred embodiment, there are six peddles 652. Each of the peddles 652 are separated from each other by a slit 654 extending radially from near the center of the anode 650 to its perimeter. The anode 650 further includes a though-hole 656 approximately its center to receive therein, in a secured fashion, the lower end of the anode shaft 606. The anode 650 can be configured flat as shown in FIGS. 20A–B. Alternatively, the peddles 652 can be bent or selectively shaped, as like in a io propeller, to provide vertical fluid flow within the plating fluid bath or achieve any other desired fluid flow. In addition, the peddles 652 can also be bent or selectively shaped to adjust the electrostatic fields between the anode and the cathode during plating, such as adjusting the fields in order to provide a substantially uniform current distribution across the surface of the wafer, as discussed in Section I-B of the specification.

Although in the preferred embodiment the insoluble anode 650 is configured in a circular shape, it shall be understood that it could be configured in many other configurations. The particular shape of the anode is not critical to the invention. It is preferred that the shape of the insoluble anode be adjustable so that a desired electrostatic fields and/or fluid flow is formed. In addition, the insoluble anode 650 need not be in a mesh form, but can comprise a solid sheet of metal. Nor does the insoluble anode 650 need to have peddles 652 separated by corresponding slits 654.

c) Soluble and Reconfigurable Anode (1) Angled-up Anode Configuration

FIGS. 21A–B illustrate top and cross-sectional views of a soluble anode assembly 700 in an angled-up configuration in accordance with the invention. The soluble anode assembly 700 comprises an anode mesh 702 includes the main constituent of what is being deposited on the wafer. For example, if copper is to be deposited on the wafer, the anode mesh 702 is preferably formed of a soluble phosphorized copper. In the preferred embodiment, the soluble anode assembly 700 is configured into a disk subdivided into a plurality of peddles 703 separated by slits 705. The anode 702 is enclosed in an anode sleeve 704 used for filtering unwanted particles that are shed from the anode 702. The central portion of the anode 702 and sleeve 704 are secured to a corresponding central portion of a base disk 706 by suitable fastening means, such as screws 708. The outer ends of the anode 702 and sleeve 704 are sandwiched between a plurality of retaining clips 710 and corresponding spacers 712 that are respectively secured together by suitable fastening means, such as screws 714. The retaining clips 710 and spacers 712 are angularly spaced around the anode assembly 700. Each spacer 712, in turn, is secured to a corresponding end of the base disk 706 by suitable fastening means, such as screw 716. The base disk 706 includes a centrally located clearance hole 718 for receiving therethrough an end of the anode shaft 606. A securing nut 720 is threaded coaxially over the end of the anode shaft 606 to secure the anode shaft 606 to the anode assembly 700. The base disk 706 may integrally incorporate the stirring paddles 510 as previously explained in Section I1-G- 1-b of the specification.

The anode assembly 700 further includes a ring-shaped flange 722 that is secured and electrically coupled to the anode 702 by way of suitable fastening means, such as screws 708. A resilient contact clip 724 includes a lowered section that is secured to the flange 722 by way of suitable fastening means, such as screws 726. The upper end of the contact clip 724 contacts the anode shaft 606 to effectuate an electrical connection between the anode 702 and the anode shaft 606. In this configuration, the anode 702 is oriented in an angled-up manner. This is because there is a relatively small space between the center of the anode 702 and the center of the base disk 706 since there is an absence of a spacer there, and there is a relatively large spacing between the end of the anode 702 and the base disk 706 due to the spacer 712. As explained in Section I-B of the specification, this configuration of the anode 702 may substantially equalize the currents across the surface of the wafer so as to provide a substantially uniform plating deposition across the wafer.

(2) Angled-down Anode Configuration

One of the advantage of the soluble anode assembly 700 of the invention is that it can be easily reconfigurable to alter the distribution of the electrostatic lines between the anode and the cathode, as discussed in Section I-B of the specification. The reconfiguration of the anode 702 is useful when the plating environment has changed, such as when a different plating metal (other than copper) is used, or when the plating concerns a new type of wafer or article, such as a ceramic wafer, or when the cathode configuration has changed. Because of possible changes in the plating environment, there is a need to experiment with the anode configuration to achieve the desired uniformity in the plating deposition. The anode assembly 700 of the invention easily allows for the reconfiguration of the anode for this purpose.

Figure 22A:
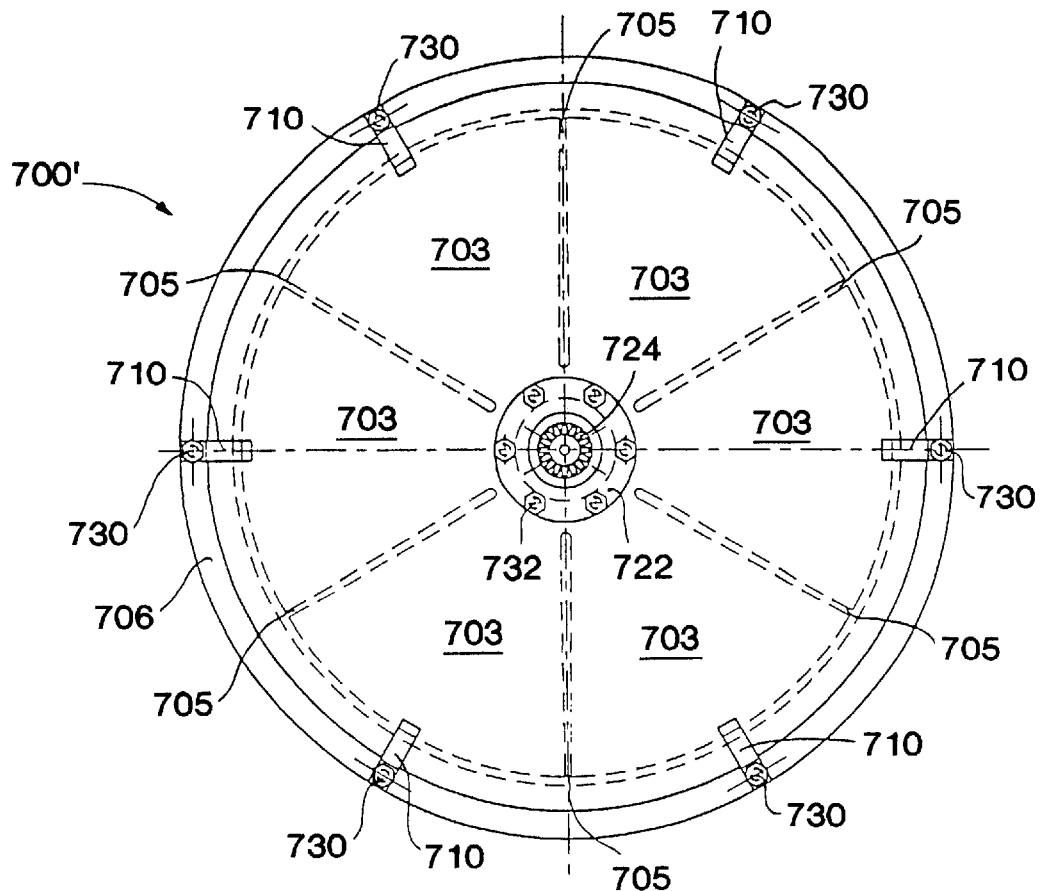
FIGS. 22A–B illustrate top and cross-sectional views of a soluble anode assembly in an angled-down configuration in accordance with the invention.
Figure 22B:
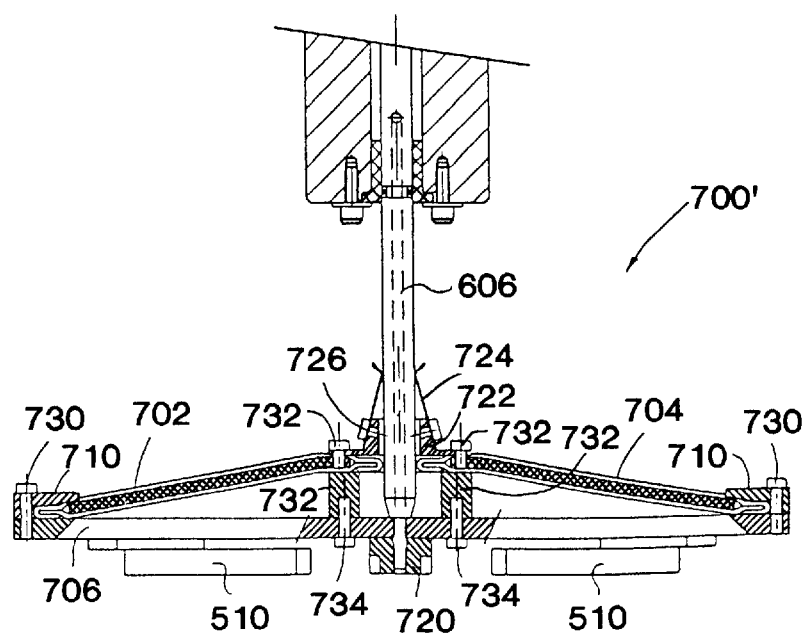

FIGS. 22A–B illustrate top and cross-sectional views of a soluble anode assembly 700' in an angled-down configuration in accordance with the invention. The angled-down anode assembly 700' includes essentially the same parts as that of the angled-up assembly 700, and those parts have the same reference numbers. The anode-down assembly 700' differs in that there is an absence of spacers at the end of the anode 702. Accordingly, the end of the anode 702 and sleeve 704 are sandwiched between the retaining clip 710 and the base disk 706 secured together by suitable fastening means, such as screw 730. In addition, the anode-down assembly 700' differs in that there is a spacer 732 situated between the center of the anode 702 and the center of the disk base 706. Suitable fastening means secure the center of the anode 702 and sleeve 704 to the spacer 732, and secure the spacer 732 to the center of the base disk 706, such as screws 732 and 734, respectively.

As FIGS. 21 and 22 illustrate, the anode assembly 700 can be configured into an angled-up or angled-down orientation by appropriate placing of spacers. This is performed prior to performing several experimental runs to determine which configuration of the anode assembly 700 is more suitable for the application at hand. The spacers need not be of any particular height, but can encompass a wide range of heights so that the degree that the anode is angled-up or angled down can be varied. As explained in Section I-B, the angled-down anode assembly 700' may be useful where the cathode is in connected to the center of the wafer, a configuration that is not preferred. There may also be other applications where the angled-down is more suited for the plating process.

(3) Flat Anode Configuration

Figure 23A:
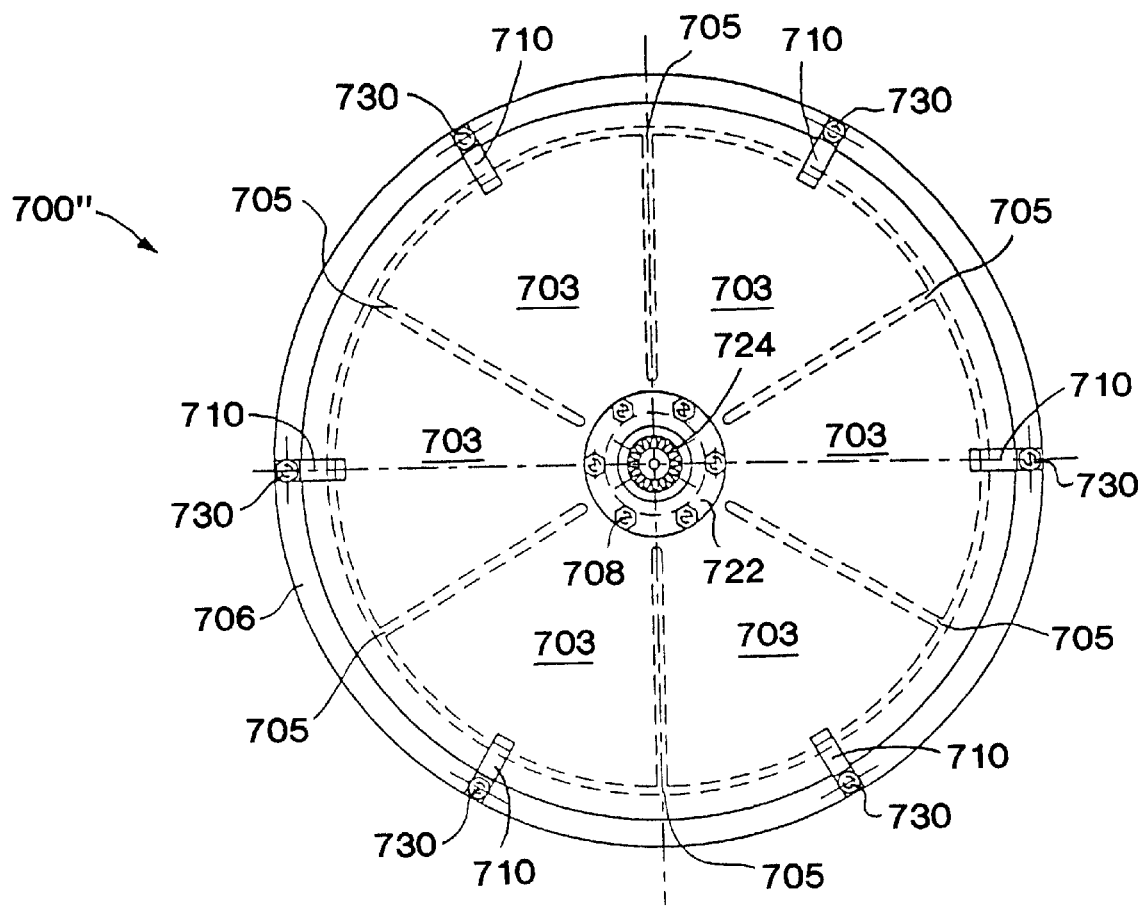
FIGS. 23A–B illustrate top and cross-sectional views of a soluble anode assembly in a flat configuration in accordance with the invention.
Figure 23B:
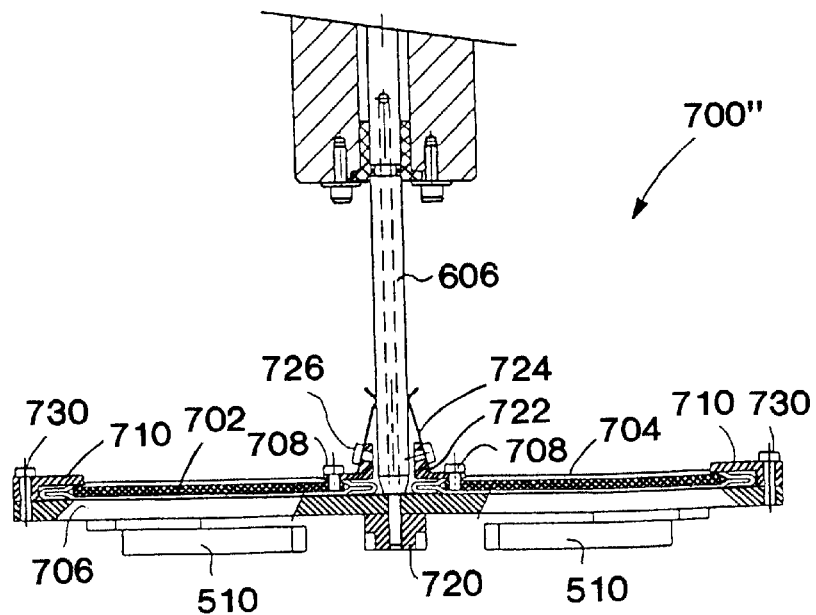

FIGS. 23A–B illustrate top and cross-sectional views of a soluble anode assembly 700" in a flat configuration in accordance with the invention. The flat anode assembly 700" includes essentially the same parts as that of the angled-up and angled down assemblies 700 and 700', and those parts have the same reference numbers. The flat anode assembly 700" differs in that there is an absence of spacers at the end and at the center of the anode 702. The center of the anode 702 and sleeve 704 is connected to the center of the disk base 706 in the same manner provided in the angled-up assembly 700. Also, the end of the anode 702 and sleeve 704 are secured to the end of the disk base 706 in the same manner provided in the angled-down assembly 700'. Again, there may be applications where the flat anode assembly 700" is more suitable for the plating process, than the others assemblies 700 and 700". This can be determined by performing several experimental runs and inspecting the wafer for plating uniformity and other characteristics.

(4) Anode Assembly with Shield

Figure 23C:
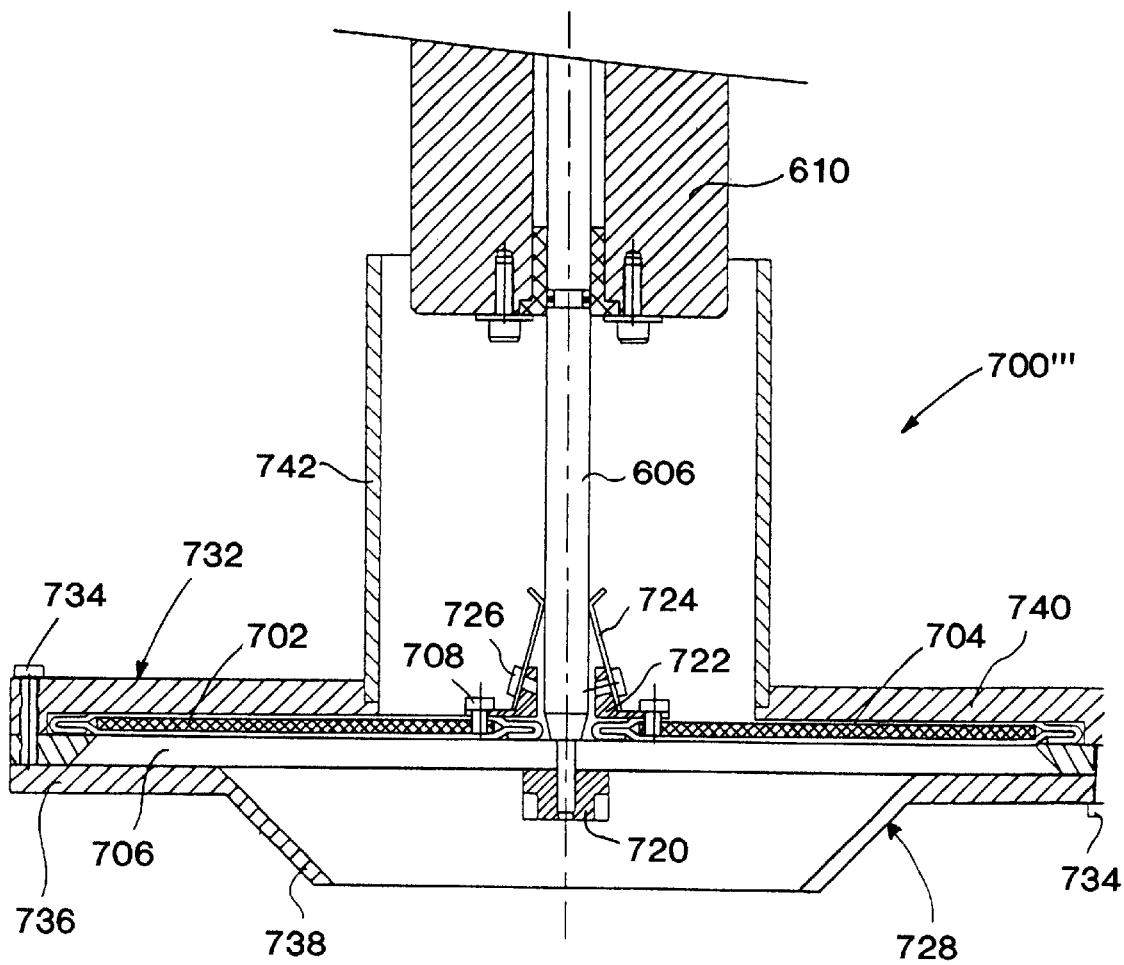
FIG. 23C illustrates a cross-sectional view of a flat anode assembly with upper and lower electrostatic shields.

FIG. 23C illustrates cross-sectional view of a flat anode assembly 700''' similar to soluble anode assembly 700" as described above. Accordingly, the common elements are designated with the same reference numbers. The flat anode assembly 700''' differs from assembly 700" in that it additionally includes a lower shield 728 and an upper shield 732. In the preferred embodiment, the lower shield 728 is mounted to the base 706 by suitable fastening means, such as screw 730. Also, the upper shield 732 is mounted to the base 706 by suitable fastening means, such as screw 732.

In the preferred embodiment, the lower shield 728 includes a portion 736 that is situated substantially parallel to the base 706 and covers its lower perimeter region. The lower shield 728 includes a more central portion 738 that angles below and towards the center of the anode assembly 700'''. As a result of this configuration, an electrostatic hole is formed at the center region of the anode assembly 700''' that channels the electrostatic field lines from the anode to the cathode. As explained with Section I-B of the specification with reference to FIG. 5B, the lower shield 728 is used to configure the electrostatic fields between the anode and the cathode to provide a more uniform current flow across the surface of the wafer.

In the preferred embodiment, the upper shield 732 comprises a portion 740 that is situated substantially parallel to the base 706 and covers its upper perimeter region. The upper shield 732 also includes a more central portion 742 that extends vertically upwards from the anode assembly 700''' to slightly above the lower end of the bearing housing 610. The upper shield 732 reduces stray electrical currents that would otherwise form within the plating fluid above the anode assembly 700'''.

Although the upper and lower shields 728 and 732 is shown being used with the flat anode assembly 700'', it shall be understood that the shields can also be used with the angled-up anode assembly 700 and the angled-down anode assembly 700'. In addition, the shields 728 and 732 can also be used with the soluble anode assembly 650. Furthermore, these anode assemblies need not have both the lower and upper shields 728 and 732, but can have either the lower shield 728 or the upper shield 732. Finally, the lower and upper shields 728 and 732 need not be configured in the manner shown in FIG. 23C, but can include any of a number of shapes to achieve the desired shielding and shaping of the electrostatic field lines between the anode and the cathode.

(5) Secondary Anode/Cathode Ring (a) Anode Mode

When the plating fluid is initially introduced into the bath by the distribution ring 500, it takes some time to fill the bath and thereafter begin the plating process. Thus, the plating fluid initially contacts the surface of the wafer without being exposed to the positive difference between the anode and cathode, and consequently, no current flow is formed at this point. As a result, the acidic properties of the plating fluid begins to etch the surface of the wafer 308, thereby reducing and/or eliminating the thickness of the copper seed layer of the wafer 308. For the copper-plating embodiment of the plating apparatus 300, without the copper seed layer, proper plating of the wafer 308 cannot occur.

Referring now to FIGS. 17A–B, a secondary anode/cathode ring assembly 740 is provided to prevent acidic damage to the copper seed layer of the wafer 308 from the inactivated plating fluid that is in contact with the wafer prior to the primary anode energizing the plating fluid. In the preferred embodiment, the secondary anode/cathode ring assembly 740 is configured into an annular electrically conductive ring mounted to the vertical surface of the cathode ring mount 442 by suitable means, such as electrically conductive screw 742. An O-ring 744 is placed around the threaded-portion of the screw 742 in between the screw head and the cathode ring mount 442 in order to prevent fluid leakage therethrough. A wire 746 is routed from the positive terminal of a power supply (not shown) to the screw 742 by way of the spaced between the cathode ring mount 442 and the cathode ring 440 in order to supply positive voltage (in anode mode) to the secondary anode/cathode ring 740.

In operation, when the plating fluid is initially introduced into the bath by the distribution ring 500, the secondary anode/cathode ring 740 is energized with a positive voltage in order to activate the plating fluid that initially accumulates at the surface of the wafer 308. Because the plating fluid is activated, it prevents the acidic properties of the plating fluid from damaging the copper seed layer of the wafer 308. At this time, there may be some plating deposited on the surface of the wafer 308. When the plating fluid in the bath rises above the primary anode, the positive voltage on the secondary anode/cathode ring 740 is removed, and the primary anode 306 is energized to perform the plating of the surface of the wafer 308. Accordingly, this solves the problem of the plating fluid causing acidic damage to the copper seed layer of the wafer 308 before the plating of the wafer begins.

Although in the preferred embodiment the secondary anode/cathode ring 740 is configured into an annular ring, it shall be understood that many other configurations for the secondary anode/cathode ring are possible. The only requirement is that the secondary anode/cathode ring 740 is near the bottom of the plating fluid bath so that it energizes the plating fluid that initially accumulates near the surface of the wafer 308. Nor does the secondary ring need to be mounted on the cathode ring mount 442, but any suitable place near the surface of the wafer. In the preferred embodiment, more than one wire/screw is used to supply positive voltage to the secondary anode/cathode ring 740. There are a number of ways to supply positive voltages to the secondary anode/cathode ring 740, all of which are not critical to the invention.

(b) Cathode Mode

Generally, the copper seed layer of the wafer 308 is relatively thin. It may have a thickness in the range of about 200 to 1500 Angstroms. Because the copper seed layer is relatively thin, the resistance of the layer is relatively high. This characteristic of the copper seed layer adversely affects the initial plating of the wafer. More specifically, because of the high resistance property of the copper seed layer, the plating current through the center region of the wafer towards the cathode at the perimeter of the wafer is relatively small compared to the plating current that flows directly to the perimeter of the wafer. As a result, more plating deposition occurs near the perimeter of the wafer than at the center region of the wafer. Thus, there is a need to compensate for this uneven plating deposition across the surface of the wafer.

Not only is the secondary anode/cathode ring 740 useful in an anode mode to prevent acidic damage of the copper seed layer as described above, the secondary anode/cathode ring 740 serves in a cathode mode to ameliorate the problem of uneven plating deposition due to the high resistance property of the copper seed layer. During initial plating of the wafer 308, a negative voltage with respect to the voltage on the cathode is applied to the secondary anode/cathode ring 740. Since the secondary anode/cathode ring 740 is radially around the perimeter of the wafer 308, the more negative voltage on the ring 740 diverges the plating ions drawn to the perimeter of the wafer 308 towards the ring 740. As a result, the plating rate at the perimeter of the wafer 308 is reduced so that it is more even with the plating rate at the center region of the wafer 308. Thus, this technique can achieve a more uniform plating deposition across the surface of the wafer 308. In general, the secondary anode/cathode ring 740 can be used to alter the electrostatic field formed between the anode 304 and the cathode 440 to control the plating of the wafer 308.

An additional application of the secondary anode/cathode ring 740 is to remove plating ions off a desired region of the wafer 308. In accordance with this application, the voltage on the primary anode 304 is removed so as to remove the electrostatic field between the anode 304 and the cathode 440. Then, a negative voltage with respect to the voltage on the cathode 440 is applied to the secondary anode/cathode ring 740. When this occurs, the cathode 440 operates as an anode and the secondary anode/cathode ring 740 operates as a cathode. Accordingly, the negative voltage on the secondary anode/cathode ring 740 causes the removal of plating ions off the wafer surface and deposits the removed plating ions on the secondary anode/cathode ring 740.

This application is particularly useful in removing excess plating off the perimeter region of the wafer 308 after the wafer has undergone the plating process. In some situations, there may be an increased buildup of plating deposition at the perimeter region of the wafer 308, due to, for example, the high resistance property of the seed layer on the surface of the wafer. If this occurs, it would be desirable to remove some of the excess plating at the perimeter region of the wafer 308 so as to better even out the plating deposition across the surface of the wafer. To do this, a negative voltage with respect to the cathode 440 is applied to the secondary anode/cathode ring 740. Since the secondary anode/cathode ring 740 is situated generally coincident with the perimeter of the wafer 308, the negative voltage on the secondary anode/cathode ring 740 removes excess plating off the perimeter region of the wafer 308, to better even out the plating deposition across the surface of the wafer 307. In general, an electrical conductor with a desired voltage applied to it can be positioned near the wafer 308 to remove plating at any desired region of the wafer surface.

(6) Electrostatics—Cathode

Most of the discussion relating the electrostatics aspect of the plating method of the invention that pertains to the cathode was given in Section II-G of the specification. It is worthy to restate that the unique cathode contact of the invention improves the uniformity of the plating deposition across the surface of the wafer, as well as improves the plating rate. The uniformity of the plating is improved by providing a uniform cathode contact along the "cathode contact area" of the exclusion zone of the wafer. This can be accomplished with the use of a conductive fluid or with a plurality of equally-spaced mechanical contacts. Because of the uniformity of the cathode contact, the surface currents across the wafer are more uniform, which improves the uniformity of the plating. The plating rate of the plating is improved by providing a large contact area along the "cathode contact area" of the exclusion zone of the wafer. The continuous contact of the conductive fluid or the almost-continuous contact of the mechanical contacts along the "cathode contact area" of the exclusion zone provides a large contact area that can handle large currents, which can improves the plating rate.

Figure 24:
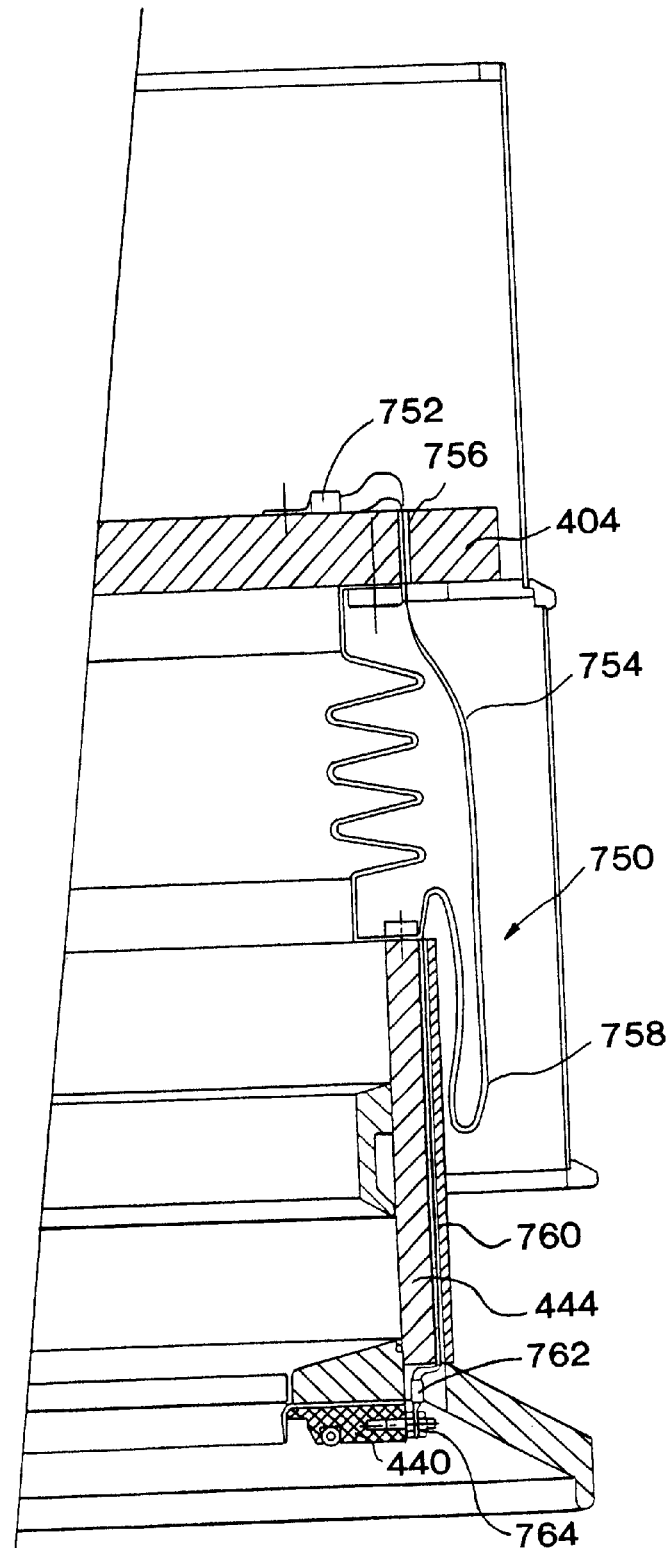
FIG. 24 illustrates a cross-sectional view of a portion of the plating apparatus that includes an apparatus for providing a cathode voltage to a cathode ring.

Referring to FIG. 24, another aspect of the cathode contact to the surface of the wafer is providing a cathode electrical connection assembly 750 to effectuate the electrical connection of the negative terminal of the plating power supply to the cathode ring 440. The cathode electrical connection assembly 750 comprises a connector 752 mounted to the top horizontal mounting plate 404 for making an connection to the negative terminal to the power supply (not shown). A first end of a wire 754 is electrically connected to the connector 752 and is routed downward towards the cathode ring 440 through a hole 756 in the top mounting plate 404. A portion of the wire 754 is configured into a stress-relief loop 758 and a subsequent portion is situated within a duct 760 extending vertically along the outside of the cylinder wall 444. The opposing end of the wire 754 is connected to a lug 762 attached to the cathode ring 440 by screw 764. Accordingly, the negative cathode voltage is communicated to the cathode ring 440 via the connector 752, wire 754 that has a stress-relief loop 758 and extends through duct 760, lug 762, and screw 764. There are preferably three cathode electrical connection assemblies 750 angularly spaced around the cylinder/distribution ring assembly 304.

H. Apparatus and Method of Draining the Plating Fluid Bath

Once the plating of the wafer 308 is completed, the next procedure in the overall plating process is to drain the plating fluid from the bath. Prior to draining the plating fluid bath, the anode and/or cathode voltage(s) is/are removed from the anode and cathode, and the rotation of the anode assembly 306 is ceased. Thus, prior to draining the plating fluid bath, the cylinder/distribution ring 304 is making a fluid seal contact with the wafer mounting assembly 302, the wafer 308 is in its full loading position, and the bath is filled with plating fluid.

FIG. 25 illustrates the plating apparatus 300 in a plating fluid draining position in accordance with the invention. After completion of the plating process as described in the previous paragraph, the short-stroke pneumatic actuator 412 is actuated to move vertically to its full raised position. The vertical movement of the short-stroke pneumatic actuator 412 causes the mounting plate 414 to move upward with the actuator 412. This action causes the long-stroke pneumatic actuator 410 to similarly move upward. The length of the vertical movement of the short-stroke pneumatic actuator 412 is such that it is larger than the clearance that exists between the extender shoulder 428 and the coupling 406, when the extender 428 is at its full lowered position. Accordingly, the vertical movement of the actuator 412 causes the shoulder 428 to lift the cylinder/distribution ring assembly 304 off the wafer mounting assembly 302.

The lifting of the cylinder/distribution ring assembly 304 off the wafer mounting assembly 302 causes the plating fluid to drain out through the perimeter of the wafer 308. The plating fluid then cascades down the wafer mounting base 314 and housing 316 to the sump area 310. At this time, the sump valve 812 is opened to allow the plating fluid to drain into a reservoir (not shown) for later use, as will be discussed in more detail in Section II-L of the specification. The draining of the plating fluid bath is ceased when most of the plating fluid has drained out of the sump area 310.

I. Apparatus and Method of Drying the Anode Assembly

Referring again to FIG. 25, concurrently with or after the draining of the plating fluid bath, there is a need to remove any excess plating fluid that remains on the anode assembly 306. Accordingly, the plating apparatus 800 includes a nozzle 770 directed at the anode assembly 306. In the preferred embodiment, the nozzle 770 communicates forced nitrogen gas to the anode assembly 306. Since the center of the anode assembly 306 comprises a plurality of small components, it is preferred that the nozzle 770 is aimed towards the center of the anode assembly 306. In operation, the electric motor 602 is actuated to cause a high-speed rotation of the anode assembly 306 in order to spin-off some of the plating fluids. At the same time, the nozzle 770 directs forced nitrogen gas towards the center of the anode assembly. This process continues until most of the excess plating fluid is removed from the anode assembly 306.

J. Apparatus and Method of Rinsing the Wafer After Plating

Once the plating fluid has sufficiently drained out of the bath in accordance with Section II-H, the next procedure in the overall plating process is to rinse the wafer 308. After the draining of the plating fluid, the top surface of the wafer 308 will have some plating fluid on it. Thus, there is a need to rinse off the remaining plating fluid off the top surface of the wafer 308. In addition, the underside of the wafer 308 may also be in contact with contaminants, therefore, there is also a need to rinse off the underside of the wafer. In this Section of the specification, the preferred manner of rinsing of the top-side and underside of the wafer 308 is discussed.

Referring to FIG. 18, before the rinsing of the wafer 308 can occur, and in fact, preferably before the cylinder/distribution ring assembly 304 is lifted to drain the plating fluid bath, it is desired that the conductive fluid in the conductive channel 458 and corresponding feed/drain line 460 be drained and flushed out by DI-water. This is to prevent contamination of the conductive fluid from the plating fluid since this area would be expose to the plating fluid during drainage. Accordingly, before the cylinder/ distribution ring assembly 304 is lifted, the conductive fluid is allowed to drain from the conductive channel 458 and feed/drain lines 360 into a suitable reservoir (not shown). Then DI water is forcibly injected into the conductive channel 458 and feed/drain line 460 in order to flush out this area.

Referring now to FIG. 25, after the cylinder/distribution ring assembly 304 is lifted to drain the plating fluid, the first step in the rinsing of the wafer 308 is to supply DI water to the distribution ring 500 so that the ring directs the DI water to the top surface of the wafer 308. The DI water removes the plating fluid remaining on the top-surface of the wafer 308, and consequently drains down to the sump area. The rinsing of the top-surface of the wafer 308 is continued until the top-surface of the wafer 308 has been sufficiently rinsed.

Figure 26:
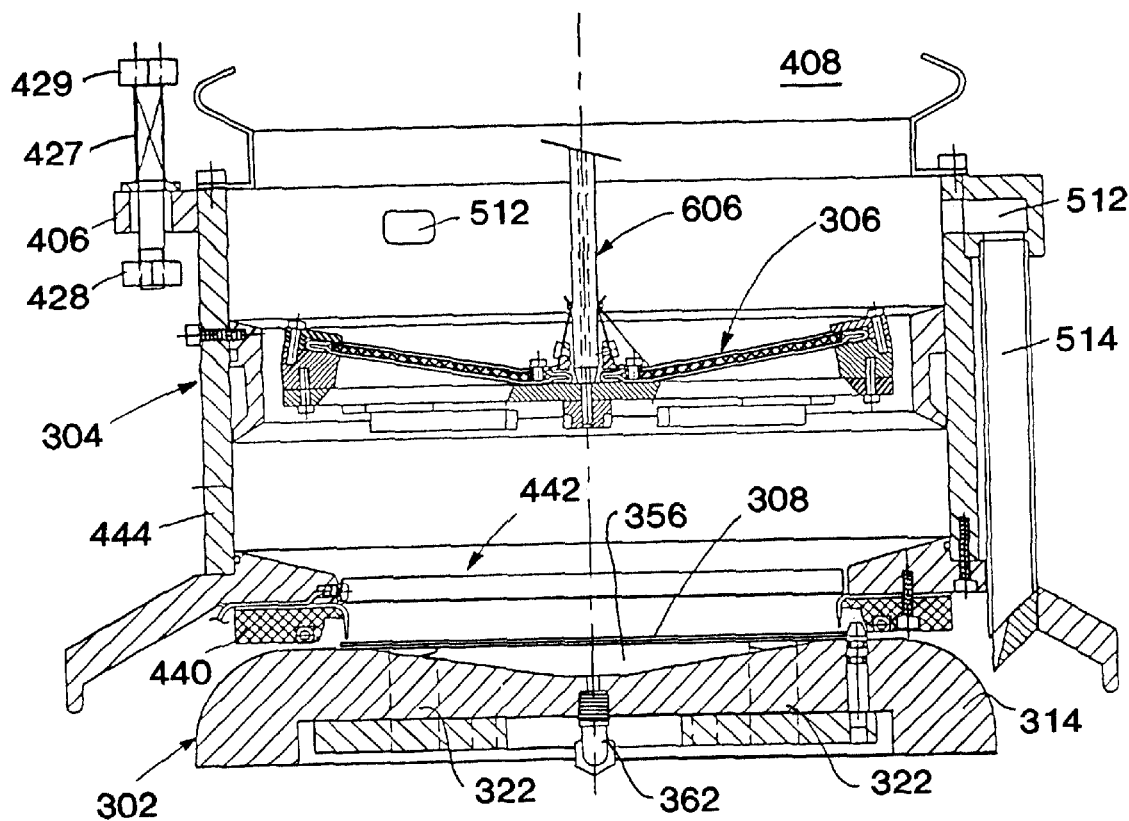
FIG. 26 illustrates a close-up cross-sectional view of the cylinder/distribution ring and the wafer mounting assembly in a wafer rinsing configuration in accordance with the invention.

Referring to FIG. 26, the next step in the preferred method of rinsing the wafer 308 is to rinse the underside of the wafer. First, the wafer-supporting fluid bed is drained through the feed/drain line 362. After this occurs, the motor 334 of the wafer lift assembly 320 is actuated in order to raise the wafer-supporting posts 322 slightly. Consequently, the wafer 308 is lifted off the wafer mounting base 314. Then, DI water is injected upon the underside of the wafer 308 by way of the feed/line 362 in order to rinse the underside of the wafer. The space between the wafer 308 and the wafer mounting base 314 allows the DI water to drain out of the fluid bed cavity 356, out the perimeter of the wafer 308, and down to the sump area 310. The rinsing of the underside-surface of the wafer 308 is continued until it has been sufficiently rinsed.

K. Apparatus and Method of Drying the Wafer

Referring back to FIG. 18, during the rinsing of the wafer 308 as discussed in the previous section, rinsing solution accumulates in the feed/drain line 460 of the conductive fluid. It is undesirable to have rinsing solution remaining in the feed/drain line 460 since it will contaminate the conductive fluid during the next plating process. Therefore, there is a need to purge out the rinsing solution from the feed/drain line 460. In the preferred embodiment, this is performed by injecting hot (above ambient temperature) nitrogen gas up through the feed/drain line 460 so as to force the remaining rinsing solution out of the feed/drain line 460. This process is continued until the feed/drain line 460 is sufficiently dried.

Referring to FIGS. 19 and 25, the apparatus for performing the drying of the wafer 308 in accordance with the invention comprises the distribution ring 500 for directing hot (above ambient temperature) nitrogen gas upon the top surface of the wafer 308. The wafer drying apparatus also comprises a nozzle 780' mounted to the top of the bearing housing along with the motor 602. The nozzle 708 is fluidly coupled to a channel 782 within the bearing housing 610 that leads to the anode shaft 606. The anode shaft 606 includes an orifice 784 within the bearing housing 610 that is fluidly coupled to the channel 782. The anode shaft 606 includes a channel 786 extending coaxially within that leads to an opening at the lower end of the anode shaft. Finally, the wafer drying apparatus further includes the feed/drain line 360 situated below the wafer 308.

In operation, hot (above ambient temperature) nitrogen gas is introduced into the distribution ring 500 from one or more of its input ports 514. The distribution ring 500 directs the hot nitrogen gas towards the top surface of the wafer 308 by way of its intake cavity 504 and its annular slot 508. This process is performed for a desired period of time. Then, hot nitrogen gas in introduced into nozzle 780 to direct it to the top surface of the wafer 308 by way of channel 782 within the bearing housing, orifice 782 of the anode shaft 606, channel 786 within the anode shaft 606, and the opening at the bottom of the anode shaft 606. This is again performed for a desired period of time. Both the above described drying steps is performed to sufficiently dry the top surface of the wafer 308.

Then hot nitrogen gas is introduced into the feed/drain line 360 in order to forcibly direct the gas upon the underside of the wafer. This is performed for a desired period of time in order to sufficiently dry the underside of the wafer 308. Once the wafer 308 is sufficiently dried, the feeding of the nitrogen gas is ceased. The order by which the nitrogen gas is used to dry the top and bottom side of the wafer 308 is not critical to the invention.

L. Apparatus and Method of Draining Fluids From the Plating Apparatus

During the plating and rinsing processes described above, it is desired that the plating apparatus and method of the invention provides a means for draining the plating and rinsing fluids after they have been used. With regard to the plating fluid, it is desirable that the plating fluid be recycled back to the distribution ring for use again in the plating process. Thus, there is a need to accumulate the plating fluid that has already been used during the plating process, filter the used plating fluid so that it can be recycled back the plating fluid to the distribution ring for reuse again by the plating process. With regard to the rinsing solution, it is desirable that the rinsing solution be properly disposed of after the wafer has undergone the rinsing process. Thus, for both the plating and rinsing fluids, there is a need to control the fluids after they have been used in their respective processes.

Figure 27:
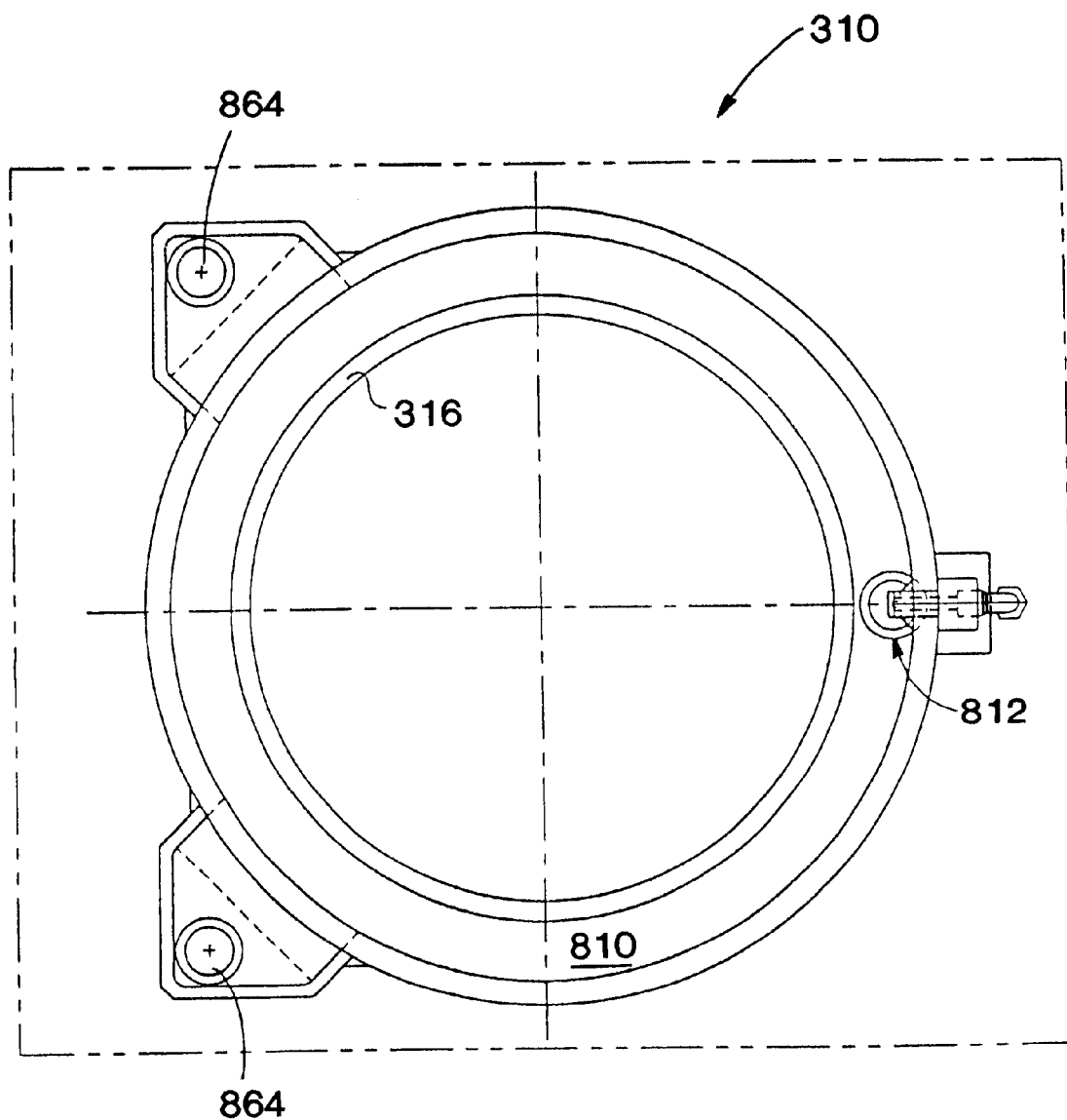
FIG. 27 illustrates a top view of a sump in accordance with the invention.

Referring to FIGS. 25 and 27, the sump 310 of the plating apparatus 300 achieves the preferred method of controlling the fluid flow after they have been used in their respective processes. As previously discussed, the plating apparatus 300 is designed such that during the draining of the plating and rinsing fluids and the overflow of the plating fluid during the plating process, the corresponding fluids flows down to the sump 310 by way of the wafer mounting base 314 and the wafer-mount housing 316. The sump 310 preferably includes an inclined base 810 situated at the bottom of the wafer-mount housing 316. The sump 310 further includes a sump valve 812 situated at the lowest portion of the inclined base 810. The sump valve 812 is preferably of the type that comprises an input port and two output ports. The input port of sump valve 812 receives both the used plating and rinsing fluids. One of the output ports of the sump valve 812 is for directing the rinsing fluid to a disposal area (not shown). The other output port of the sump valve 812 is used for directing the plating fluid to a recycling reservoir (not shown).

Figure 28A:
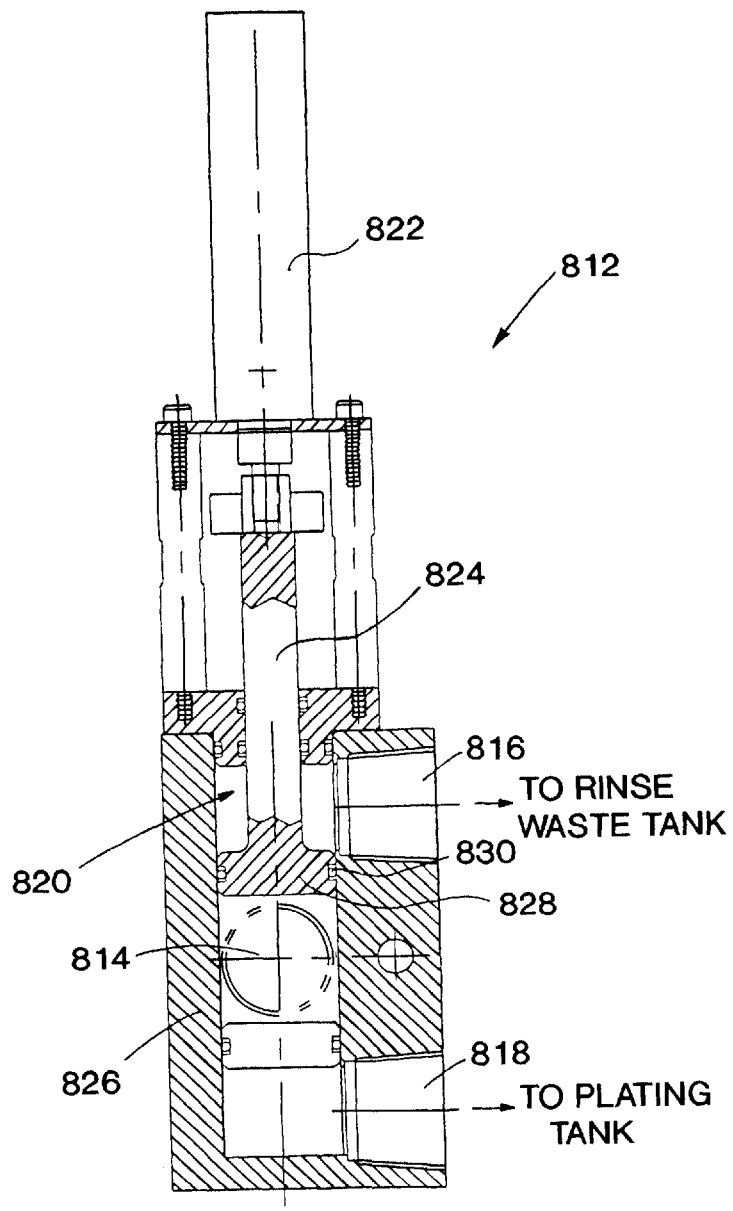
FIGS. 28A–B illustrate top and side cross-sectional views of a sump valve in accordance with the invention.
Figure 28B:
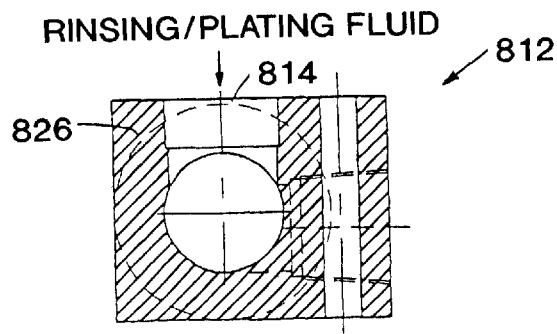

FIGS. 28A–B illustrate top and side cross-sectional views of the preferred embodiment of sump valve 812. The sump valve 812 comprises an input port 814 for receiving the used plating and rinsing fluids, a first output port 816 fluidly coupled to a rinse waste tank (not shown), and a second output port 818 fluid coupled to a plating tank (not shown). The sump valve 812 comprises a switch 820 for selectively coupling the input port 814 to one of the output ports 816 and 818. In the preferred embodiment, the switch 820 comprises a pneumatic cylinder 822 axially coupled to a piston 824 that is situated within a bore housing 826 of the sump valve 812. The piston 824 includes an occluding shoulder 828 that makes a fluid seal contact using an O-ring 830 with the inside walls of the bore housing 826. The pneumatic cylinder 822 can be actuated to position occluding shoulder 828 on one side of the input port 814 that is closer to the rinsing fluid output port 816 to occlude fluid flow to that port, and allow fluid flow to the plating fluid output port 818. Similarly, the pneumatic cylinder 822 can be actuated to position occluding shoulder 828 on one side of the input port 814 that is closer to the plating fluid output port 818 to occlude fluid flow to that port, and allow fluid flow to the rinsing fluid output port 816.

In operation, during and after the plating of the wafer 308 when plating fluid is allowed to overflow and drain, the plating fluid is directed to the sump 310 by way of cascading down the wafer mounting base 314 and the wafer-mount housing 316. The plating fluid then encounters the inclined base 810 of the sump 310 and flows down to the input port 814 of the sump valve 812. Prior to this overflowing and draining of the plating fluid, the pneumatic cylinder 822 is actuated to position the occluding shoulder 828 of the piston 824 to fluidly couple the input port 814 with the plating fluid output port 818. Thus, as the plating fluid enters the input port 814 of the sump valve 812, it is directed to the plating fluid output port 818 to which the plating tank is fluidly coupled.

After the rinsing of the wafer 308 when the rinsing fluid is allowed to drain, the rinsing fluid is directed to the sump 310 by way of cascading down the wafer mounting base 314 and the wafer-mount housing 316. The rinsing fluid then encounters the inclined base 810 of the sump 310 and flows down to the input port 814 of the sump valve 812. Prior to the draining of rinsing fluid, the pneumatic cylinder 822 is actuated to position the occluding shoulder 828 of the piston 824 to fluidly couple the input port 814 with the rinsing fluid output port 816. Thus, as the rinsing fluid enters the input port 814 of the sump valve 812, it is directed to the rinsing fluid output port 816 to which the rinsing tank is fluidly coupled.

M. Apparatus and Method of Controlling and Disposing of Fumes

The plating of the wafer 308 typically produces potentially corrosive fumes that accumulate within the plating apparatus 300. The source of these fumes is primarily the plating fluid. Because of environmental concerns and regulations, there is a need to contain the fumes and to provide a controlled manner of expelling the fumes from the plating apparatus 300. The plating apparatus and method of the invention provides this control containment and expulsion of fumes created during the plating process.

Referring to FIG. 25, in order to contain the fumes created within the plating apparatus, the plating apparatus 300 provides hermetic sealing throughout the plating compartment. For example, the mating of the flexible boot 408 with the top horizontal mounting plate 404 forms a hermetic seal therebetween. The mating of the flexible boot 408 and the top of the cylinder wall 444 also forms a hermetic seal therebetween. Finally, the cathode ring mount 442 includes an annular extension 850 having its annular end situated within an annular recess 852 formed within a lower horizontal plate 856. A liquid seal is introduced into the recess 852 by way of feed line 858 which immerses the lower end of the annular extension 850. The liquid seal forms a hermetic sealing with the annular extension 850 to prevent fumes from escaping therethrough. In the preferred embodiment, the liquid seal comprises DI-water.

The use of the liquid seal assists in the alignment of the cathode ring 440 to the wafer 308 during the lowering of the cylinder/distribution ring assembly 304 down to the wafer mounting assembly 302. As previously discussed in Section II-E of the specification, in order to achieve the desired alignment of the cathode ring 440 to the wafer 308, it is preferred that the cylinder/distribution ring assembly 304 be compliant in the lateral direction (i.e. x-y direction), and restricted in the rotational direction. The liquid seal allows the lowering of the cylinder/distribution ring assembly 304 to be compliant in the lateral direction since liquid tends to displace when a solid object moves within it. As previously discussed, the compliancy in the lateral direction of the cylinder/distribution ring assembly 304 allows the assembly 304 to "self-align" as it is lowered onto the wafer mounting assembly 302.

Referring to FIGS. 16, 25 and 27, to provide a control expulsion of the fumes, the plating apparatus 300 includes a feed line 860 near the sump 310 to forcibly introduce clean dry air (CDA) into the plating compartment. The plating apparatus 300 further includes a plurality of exhaust ports to expel the fumes from the plating compartment. With reference to FIG. 16, the top horizontal mounting plate 404 includes an exhaust port 862 for the plating fumes. With reference to FIG. 27, the sump 310 also includes exhaust ports 864 for the plating fumes. These exhaust ports 862 and 864 may be connected to some hose (not shown) for providing a controlled manner of expelling the fumes from the plating apparatus.

N. Apparatus and Method of Unloading the Wafer

After the plating of the wafer 308 has been completed, and it has been rinsed and dried, the next step in the overall plating process is to unload the wafer 308 from the plating apparatus 300. The procedure for unloading the wafer 308 is similar to the loading procedure, only in the reverse direction. The position of the plating apparatus 300 prior to the unloading of the wafer 308 is that the cylinder/distribution ring assembly 304 is in its fluid draining position, the wafer 308 is also in its fluid draining position (i.e. slightly above the final loading position), and the wafer supporting posts 322 are making vacuum contact with the underside of the wafer 308.

With reference to FIG. 25, the first step in the method of unloading the wafer 308 is raise the cylinder/distribution ring assembly 304 to its full raised position as shown in FIG. 8. This is accomplished by actuating the long-stroke pneumatic cylinders 410 to retract their respective pistons 424 and cause the corresponding extenders to lift the cylinder/distribution ring assembly 304 to its full raised position. This action forms the clearance region 311 between the cylinder/distribution ring assembly 304 and the wafer mounting assembly 302 in order for the wafer loader 312 to be introduced therebetween.

With reference to FIG. 11, the next step in the method of unloading the wafer 308 is to raise the wafer 308 to its full raised position. This is accomplished by actuating the motor 334 to raise the wafer supporting posts 322 to its full raised position. Once this has occurred, the wafer loader 312 is introduced into the plating apparatus 300, and specifically, directly below the wafer 308. Then, the vacuum contact of the wafer supporting posts 322 and the underside of the wafer 308 is removed.

With reference to FIG. 9, the next step in the method of unloading the wafer 308 is to lower the wafer 308 onto the wafer loader 312. This is accomplished by actuating the motor 334 to lower the wafer supporting posts 322 to its full lowered position. This action causes the wafer 308 to drop onto the wafer loader 312. Once this has occurred, the wafer loader 312 is then removed from the plating apparatus 300 to produced the final product, i.e. a wafer that has a substantially uniform plating deposition produced by the apparatus and methods of the invention.

O. Apparatus and Method of Cleaning the Plating Apparatus

With reference to FIGS. 8 and 16, in order to clean the plating apparatus 300 after performing a plating process, the plating apparatus 300 includes one or more nozzles 900 for spraying the plating compartment with DI-water in order to clean most of the surfaces. The nozzles 900 are mounted within holes 902 formed through the top horizontal mounting plate 404. The top horizontal mounting plate 404 may also include feed ports for introducing clean dry air (CDA) and nitrogen gas to the distribution ring 500 as desired.

III. New Design—Anode Having Separately Excitable Sections

A. Plating Methodology

As was previously discussed in this patent application, one of the objectives of the invention is to provide a plating methodology that results in a plating deposition across the surface of a wafer that is substantially uniform. One impediment to achieving this objective is the relatively high resistance characteristic of the seed layer (e.g. a copper seed layer if copper is the plating material) on the surface of a wafer prior to plating. Typically, the seed layer is relatively thin, ranging from about 200 Angstroms to about 2000 Angstroms. As a result, a wafer prior to plating has a relatively high surface resistance. During plating, the relatively high surface resistance of a wafer causes more deposition to occur near the cathode contact on the wafer than in other surface areas of the wafer. If the cathode makes contact to the perimeter of the wafer, more deposition occurs near the perimeter than in the center of the wafer. This is explained in more detail below with reference to FIGS. 29A–B.

Figure 29A:
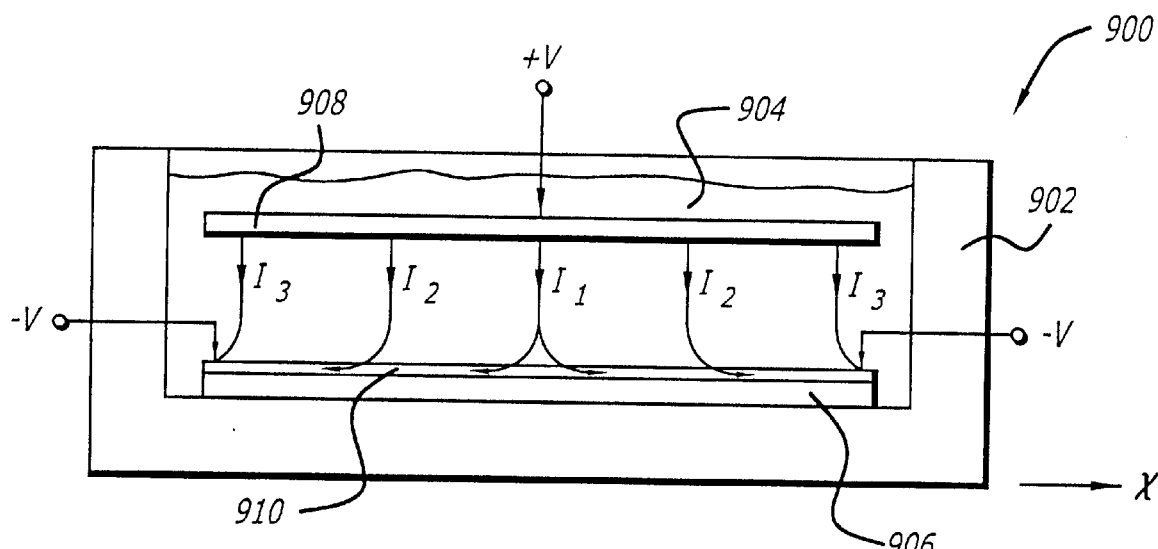
FIGS. 29A–B illustrate side view and schematic of a plating apparatus that does not compensate for uneven plating deposition caused by a wafer seed layer.

FIG. 29A illustrates, by example, a plating apparatus 900 that does not compensate for the uneven plating distribution across the wafer surface caused by the high resistance characteristic of the seed layer. The plating apparatus 900 comprises a container 902 that supports a bath of plating fluid 904. A wafer 906 is typically situated in a substantially horizontal orientation at or near the bottom of the container 902. An anode 908 is typically situated in a substantially horizontal orientation above the wafer 906, and immersed in the plating fluid bath 904. Prior to plating, the top surface of the wafer 906 comprises a relatively thin seed layer 910, e.g. a copper seed layer.

During plating, a positive voltage (+V) is applied to anode 908 and a negative voltage or ground (−V) is applied to the seed layer 910. Typically, it is preferred that the positive voltage (+V) is applied near the center of the anode 908 and the negative voltage (−V) is applied near the perimeter of the wafer 906. The voltage differential between the anode 902 and the wafer 906 causes current to flow between the anode 902 and the wafer 906. For simplicity, the current between the anode 908 and the 906 can be sub-divided into three different currents: the plating current $I_1$ near the center of the wafer 906, the plating current $I_2$ midway between the center and the perimeter of the wafer 906, and the plating current $I_3$ near the perimeter of the wafer 906. Since the plating deposition rate is proportional to the plating current, it is desirable to have plating currents $I_1$, $I_2$, and $I_3$ substantially equal to each other to produce a substantially uniform plating deposition across the surface of the wafer 906. As is explained with reference to FIG. 29B, the relatively high resistance characteristic of the seed layer 910 is an impediment to achieving plating uniformity.

Figure 29B:
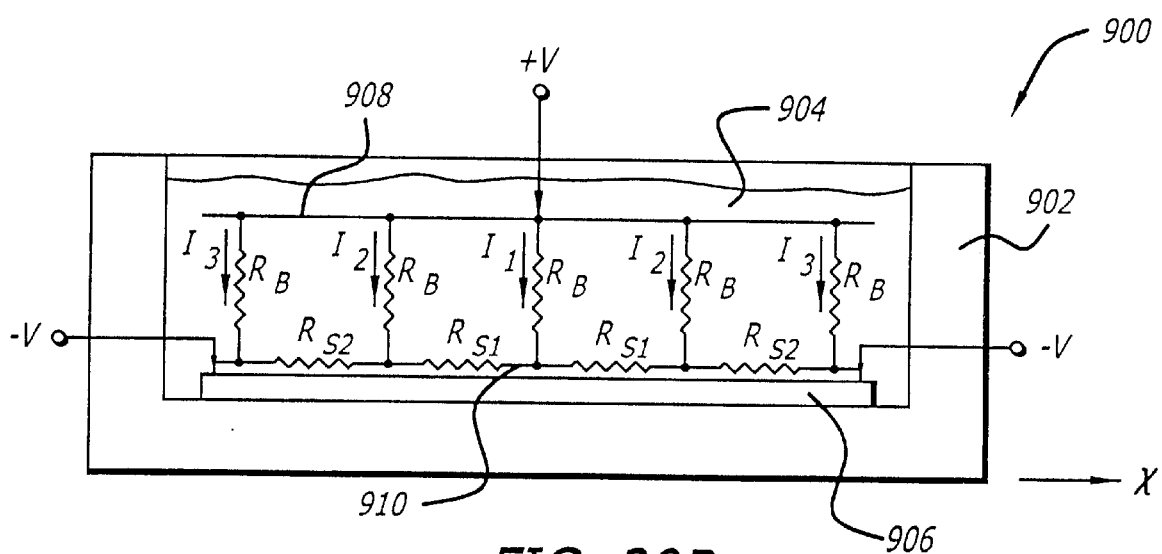

FIG. 29B illustrates, by example, a simplified schematic diagram of the plating apparatus 900. The anode 908 may be schematically represented as a bus bar having negligible resistance in the horizontal direction (x-direction). The bulk resistance of the plating fluid 904 from the anode 908 to the wafer 906 may be schematically represented as a resistor $R_B$. Because the bulk resistance $R_B$ of the plating fluid is substantially uniform throughout the fluid bath 904, each of the currents $I_1$, $I_2$, and $I_3$ encounter the same bulk resistance $R_B$. The seed layer 910 may be schematically represented as sheet resistance $R_{S1}$ and $R_{S2}$ connected in series across the surface of the wafer, wherein resistor $R_{S1}$ is the resistance of the seed layer 910 from the center of the wafer 906 to the midway point between the center and the perimeter of the wafer 906, and resistor $R_{S2}$ is the resistance of the seed layer 910 from the midpoint to the perimeter of the wafer 906.

The schematic diagram of FIG. 29B illustrates that the current $I_1$ near the center of the wafer 906 is substantially less than the current $I_2$, midway between the center and the perimeter of the wafer 906, which is, in turn, substantially less than the current $I_3$ near the perimeter of the wafer 906. More accurately, the plating current gradually increases from the center of the wafer 906 towards the perimeter. As a result, more plating is deposited near the perimeter than near the center of the wafer 906, which leads to a non-uniform deposition across the surface of the wafer 906. The reason for this is that the current $I_1$ near the center of the wafer 906 encounters more resistance (i.e. the bulk resistance $R_B$ and sheet resistances $R_{S1}$ and $R_{S2}$ of the seed layer 910) than current $I_2$ encounters (i.e. the bulk resistance $R_B$ and sheet resistance $R_{S1}$ of the seed layer 910). Likewise, current $I_2$ encounters more resistance than current $I_3$ (i.e. only the bulk resistance $R_B$). Thus, the relatively high resistance characteristic of the seed layer 910 results in an uneven plating deposition across the surface of the wafer 906.

Figure 30:
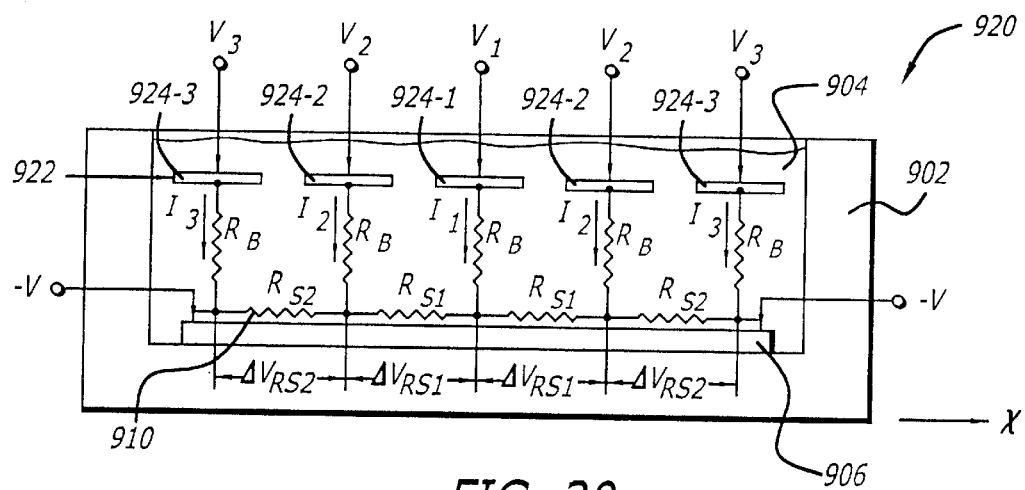
FIG. 30 illustrates a schematic of a plating apparatus in accordance with the invention that compensates for uneven plating deposition caused by a wafer seed layer.

FIG. 30 illustrates, by example, a schematic diagram of a plating apparatus 920 in accordance with the invention that ameliorates the plating non-uniformity problem caused by the relatively high resistance characteristic of the seed layer 910. The plating apparatus 920 comprises essentially the same elements as that of plating apparatus 900, including a container 902, a bath of plating fluid 904 having a bulk resistance of $R_B$, and a wafer 906 having a top seed layer 910, schematically represented as sheet resistances $R_{S1}$ and $R_{S2}$. The plating apparatus 920 differs from the plating apparatus 900 in that the former includes a new anode assembly 922 designed to compensate for the non-uniform plating deposition caused by the high resistance characteristic of the seed layer 910. In particular, the new anode assembly 922 comprises a plurality of separate anode sections 924-1, 924-2 and 924-3 extending in the horizontal direction (x-direction) from center to the perimeter of the anode assembly 922. Each of the anode sections 924-1, 924-2 and 924-3 are separately excited by respective anode voltages $V_1$, $V_2$ and $V_3$ in a manner that improves the uniformity of the plating currents (e.g. $I_1$, $I_2$ and $I_3$) across the surface of the wafer 906.

More specifically, in order for the plating currents $I_1$, $I_2$ and $I_3$ to be substantially the same (or more uniform), the anode voltages $V_1$, $V_2$ and $V_3$ exciting the respective anode sections s 924-1, 924-2 and 924-3 are selected so that their respective voltage differences substantially match the voltage drop in the horizontal direction (x-direction) across regions of the seed layer 910 that are substantially coincident with the corresponding anode sections. For example, if the voltage drops across sheet resistances $R_{S1}$ and $R_{S2}$ of the seed layer 910 are respectively $\Delta V_{RS1}$ and $\Delta VRS_2$, then the following relationships substantially hold:

$$V_1 - V_2 = \Delta V_{RS1} \qquad \text{equation 1}$$

$$V_2-V_3=\Delta V_{RS2} \quad \text{equation 2}$$

Or another way of characterizing this is that each of the anode sections must be excited with an anode voltage substantially equal to a reference voltage plus a corresponding voltage drop across the seed layer from a region underlying the corresponding anode section to the cathode contact point. For example, anode section 924-3 essentially overlies the cathode contact point. Accordingly, there is essentially no voltage drop across the seed layer from a region underlying anode section 924-3 to the cathode contact point. Thus, the anode voltage exciting anode section 924-3 is merely the reference voltage, which in this case is $V_3$. Accordingly, the reference voltage typically overlies the cathode contact point. The voltage drop across the seed layer from a region underlying anode section 924-2 to the cathode contact point is $\Delta V_{RS2}$. Thus, the anode voltage $V_2$ exciting anode section 924-2 is essentially as follows:

$$V_2=V_3+\Delta V_{RS2} \quad \text{equation 3}$$

Similarly, the voltage drop across the seed layer from a region underlying anode section 924-1 to the cathode contact point is $\Delta V_{RS1}+\Delta V_{RS2}$. Thus, the anode voltage VI exciting anode section 924-1 is essentially as follows:

$$V_1=V_3+\Delta V_{RS1}+\Delta V_{RS2} \quad \text{equation 4}$$

These relationships (i.e. equations 1–4) are designed to provide a more uniform plating current distribution (e.g. $I_1$, $I_2$ and $I_3$) to promote better uniformity of the plating deposition across the surface of the wafer.

Figure 31:
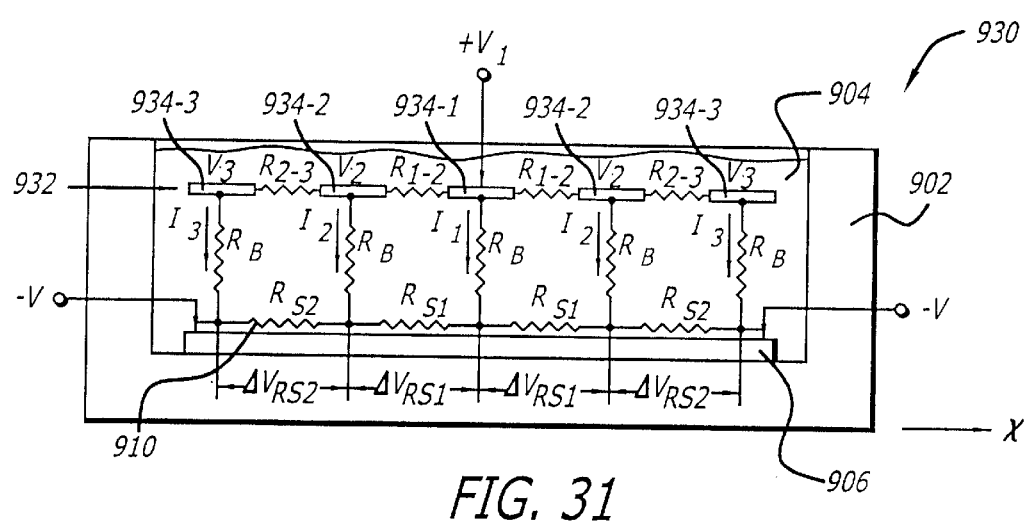
FIG. 31 illustrates a schematic of another plating apparatus in accordance with the invention that compensates for uneven plating deposition caused by a wafer seed layer.

FIG. 31 illustrates, by example, a schematic of another plating apparatus 930 in accordance with the invention that ameliorates the plating non-uniformity problem caused by the relatively high resistance characteristic of the seed layer 910. The plating apparatus 930 is similar to plating apparatus 920 including many of the same elements, which are identified with the same reference numbers. The plating apparatus 930 differs from plating apparatus 920 in that the former includes an anode assembly 932 designed to receive a single anode voltage (+V) and use a resistive network to generate the desired excitation voltages for the anode sections. More specifically, the anode assembly 932 comprises anode sections 934-1, 934-2 and 934-3 extending respectively from the center to the perimeter of the anode assembly 932. The anode assembly 932 further includes resistor $R_{1-2}$ electrically connecting anode sections 934-1 to 934-2, and resistor $R_{2-3}$ electrically connecting anode sections 934-2 to 934-3. A positive anode voltage $V_1$ is applied to the center anode section 934-1 and generates, during plating, voltages $V_2$ and $V_3$ that excite anode sections 934-2 and 934-3, respectively.

The resistors $R_{1-2}$ and $R_{2-3}$ are selected so that the voltages $V_2$ and $V_3$ generated during plating substantially follow the relationships set forth above by equations 1–4. That is, the resistors $R_{1-2}$ and $R_{2-3}$ are selected so that the respective voltage differences between anode sections substantially match the corresponding voltage drops in the horizontal direction (x-direction) across regions of the seed layer 910 that are substantially coincident with the corresponding anode sections (i.e. equations 1 and 2). Or, in other words, the resistors $R_{1-2}$ and $R_{2-3}$ are selected so that the respective voltages for the anode sections substantially equal to a reference voltage plus the corresponding voltage drop across the seed layer from a central point underlying the corresponding anode section to the cathode contact point (i.e. equations 3 and 4). Mathematically, it so happens that for equations 1–4 to hold, resistors $R_{1-2}$ and $R_{2-3}$ are substantially the same as the sheet resistances $R_{S1}$ and $R_{S2}$ of the seed layer 910. That is, $$R_{1-2}=R_{S1} \quad \text{equation 5}$$
$$R_{2-3}=R_{S2} \quad \text{equation 6}$$

Thus, by designing a resistive network for coupling anode section in the horizontal direction (xdirection) that substantially matches the variation of the sheet resistances of the seed layer in the same horizontal direction (x-direction), a more uniform plating current distribution (e.g. $I_1$, $I_2$ and $I_3$) can be formed, which results in a more uniform plating deposition across the surface of the wafer. The resistances of the resistive network can be configurable to match the resistance of different types and thickness of the seed layer.

Figure 32:
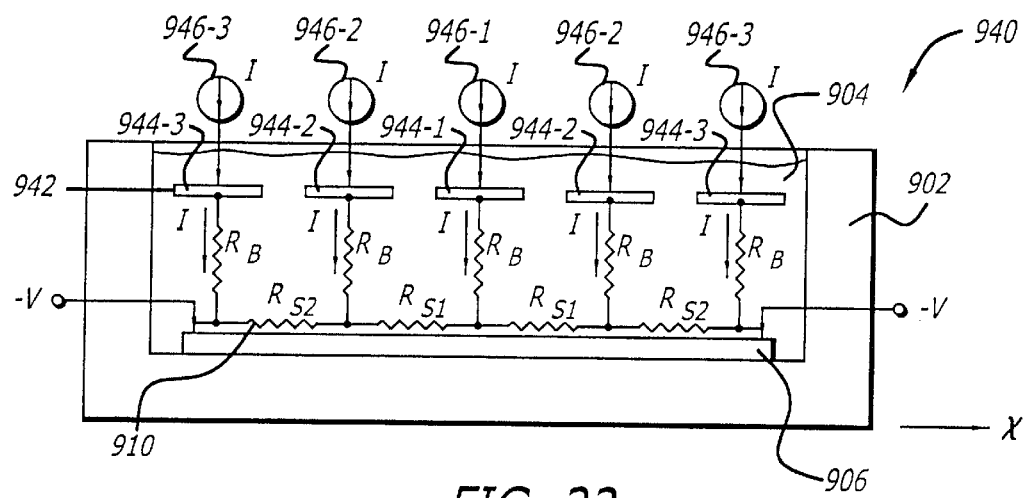
FIG. 32 illustrates a schematic of yet another plating apparatus in accordance with the invention that compensates for uneven plating deposition caused by a wafer seed layer.

FIG. 32 illustrates, by example, a schematic diagram of yet another plating apparatus 940 in accordance with the invention that ameliorates the plating non-uniformity problem caused by the relatively high resistance characteristic of the seed layer 910. The plating apparatus 940 is similar to plating apparatus 920 including many of the same elements, which are identified with the same reference numbers. The plating apparatus 940 differs from plating apparatus 920 in that the former includes an anode assembly 942 having a plurality of anode sections 944-1, 944-2, and 944-3 that extend from the center to the perimeter of the anode assembly 942. The anode sections 944-1, 944-2 and 944-3 are excited by substantially constant current sources 946-1, 9462, and 946-3, respectively. The constant current sources 946-1, 946-2, and 946-3 insure that the plating currents for the anode sections 944-1, 944-2, and 944-3 are substantially the same in order to promote a more uniform plating deposition across the surface of the wafer.

It shall be understood that the number of anode sections for the anode assembly is not critical to the invention. The more anode sections provided in the anode assembly results in a better control of the plating current uniformity across the surface of the wafer. However, as the number of anode sections increases, the more complex the anode assembly becomes. Furthermore, wafers and anodes are typically circular in shape. Accordingly, the center anode section (e.g. 924-1, 934-1, 944-1) will be in the shape of a circle, and the other anode sections (e.g. 924-2, 924-3, 934-2, 934-3, 944-2, 944-3) will be in the shape of an annular ring. Other shapes for the anode sections can also be employed. The resistors $R_{1-2}$ and $R_{2-3}$ of plating apparatus 930 can be made of thin-film, thick film, discrete resistors, or wires having a desired diameter. The preferred embodiments for the anode assemblies used with the plating apparatus 300 described herein are discussed in the following section.

B. The Preferred Embodiments of the New Gradient Anode Assembly

1. Anode with Resistive Network Comprising an Electrically-Conductive Layer

Figure 33A:
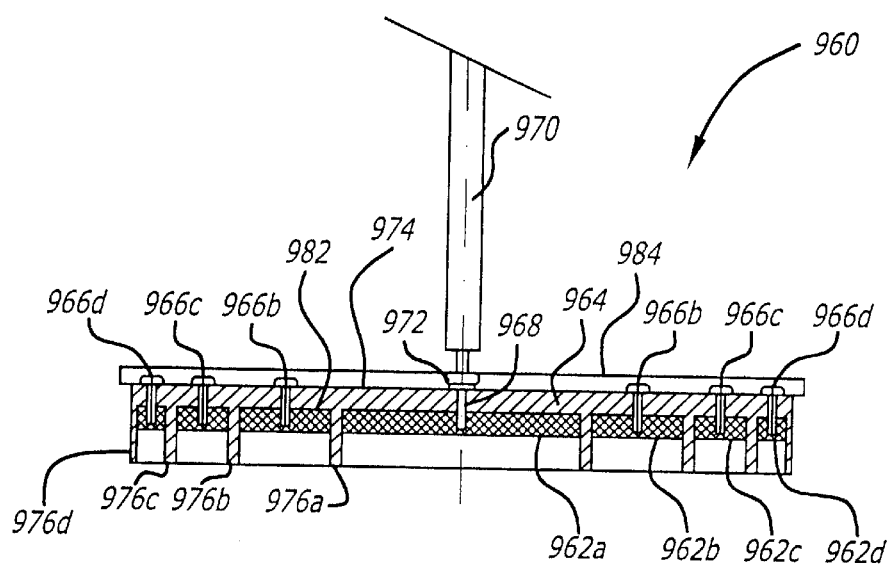
FIGS. 33A–C illustrate cross-sectional view A—A, bottom view, and cross-sectional view B—B of an anode assembly in accordance with the invention that compensates for uneven plating deposition caused by a wafer seed layer.
Figure 33B:
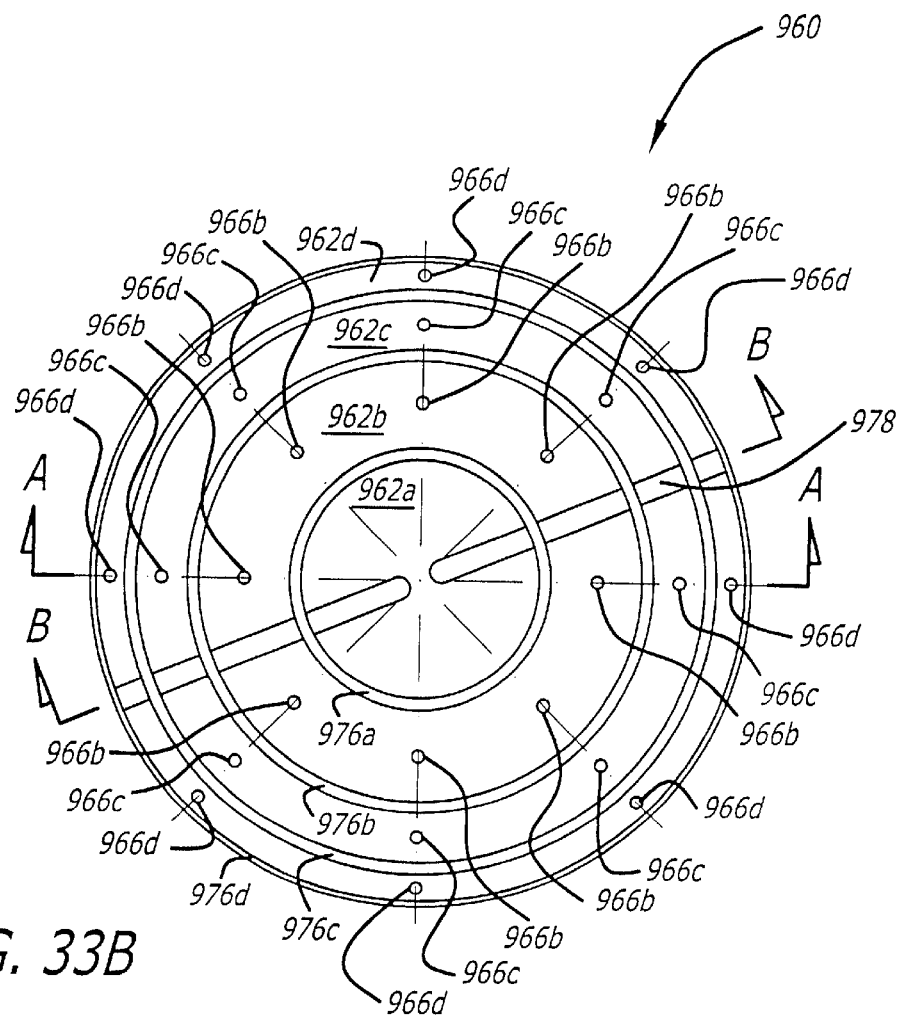
Figure 33C:
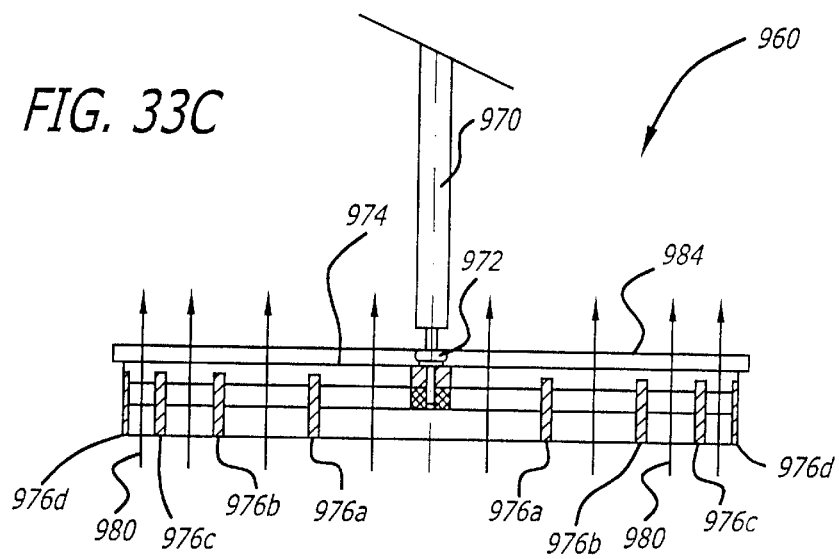

FIGS. 33A–C illustrate an anode assembly 960 in accordance with a preferred embodiment of the invention. Specifically, FIG. 33B illustrates a bottom view of the anode assembly 960. FIGS. 33A and 33C illustrate cross-sectional views of the anode assembly 960 taken across lines A—A and B—B shown in FIG. 33B. The anode assembly 960 is of the same type as anode assembly 930 described with reference to FIG. 31. That is, the anode assembly 960 comprises a plurality of separate anode sections and a resistive network for generating distinct anode voltages for the respective anode sections. The resistive network is designed to achieve the desired anode voltages for the respective anode sections such that the uniformity of the plating deposition across the surface of the wafer is improved.

More specifically, the anode assembly 960 preferably comprises a plurality of anode sections 962a–d spaced apart from each other and extending radially from the center to the perimeter of the anode assembly 960. The anode sections 962a–d are formed of the plating material. The center anode section 962a is primarily circular shaped, whereas the remaining anode sections 962b–d are primarily annular ring shaped. The anode sections 962b–d are securely attached to an electrically non-conducting base 964 by way of a plurality of electrically-conducting threaded screws 966b–d, respectively. As best seen in FIG. 33B, a total of eight screws 966b–d equally and angularly spaced are used to secure each of the anode sections 962b–d to the base 964. The center anode section 962a is secured to the base 964 by way of an electrically-conducting, threaded extension 968 of an electrically-conducting anode shaft 970. A nut 972 is used to securely attach the lower end of the anode shaft 970 to the base 964.

The anode assembly 960 further includes a thin electrically-conductive layer 974 disposed essentially over the entire top surface of the base 964. The thin electrically-conductive layer 974 is securely attached also by way of screws 966b–d and nut 972. The anode assembly 960 further includes a plurality of annular shields 976a–d extending downward from the base 964 and separates of the anode sections from each other. In the preferred embodiment, the anode section is made integral with the base 964. The anode assembly 960 also includes a pair of thru-slots 978 extending radially from near the center to the perimeter of the anode assembly 960. As best seen in FIG. 33B, the thru-slots 978 allow gas bubbles 980 in the plating fluid to flow upwards into the slots and exit above the anode assembly 960, as indicated by the arrows. In order to prevent stray currents from forming in the plating fluid within the thru-slots 978, the top of the anode sections 962a–d are covered with a thin electrically-insulating film 982. The anode assembly 960 further includes an encapsulation 984 disposed over the electrically-conductive layer 974, the screws 966, and nut 972 to protect them from the plating fluid environment.

As previously discussed with regard to plating apparatus 930 of FIG. 31, the resistive network (i.e. $R_{1-2}$ and $R_{2-3}$) is designed such that the resistances coupling anode sections in the horizontal direction (radial direction) substantially match the variation of the sheet resistances of the seed layer in the same horizontal direction (radial-direction). This results in a more uniform plating current distribution, which in turn, results in a more uniform plating deposition across the surface of the wafer. Thus, in anode assembly 960, the electrically-conductive layer 974 which electrically couple anode sections 962a–d through screws 966b–d should have substantially the same sheet resistance as that of the seed layer of the wafer being plated. For different types and thickness seed layers, the anode assembly 960 can be configured to include an electrically-conductive layer 974 that has a sheet resistance substantially matching the sheet resistance of the seed layer.

The positive anode voltage is applied to the anode assembly 960 by way of the electrically-conductive anode shaft 970. Since the anode shaft 970 is directly connected to the center anode section 962a, the anode voltage exciting the center anode section 962a is essentially the voltage applied to the shaft 970. The voltages applied to the other sections 962b–d are less since respective voltage drops occur through the electrically-conductive layer 974 as currents flow from the anode shaft 970 to the respective anode sections 962b–d. Again, if the sheet resistance of the electrically-conductive layer 974 substantially matches the resistance of the seed layer on the wafer, substantially the proper voltages are generated for the respective anode sections 962a–d. This results is an improvement in the plating current distribution as previously explained, and leads to a more uniform plating deposition across the surface of the wafer.

The annular shields 976a–d are provided to columnize the plating currents formed between the respective anode sections 962a–d and the respective coincident regions on the surface of the wafer underlying the anode sections. This reduces migration or diffusion of plating currents intended for a particular region on the surface of the wafer to an unintended region of the wafer surface. Along this line, it is preferred that the bottom of the shields 976a–d is sufficiently close to the surface of the wafer to prevent substantial migration or diffusion of the plating currents below the shields.

2. Anode with Resistive Network Comprising Discrete Resistors

Figure 34:
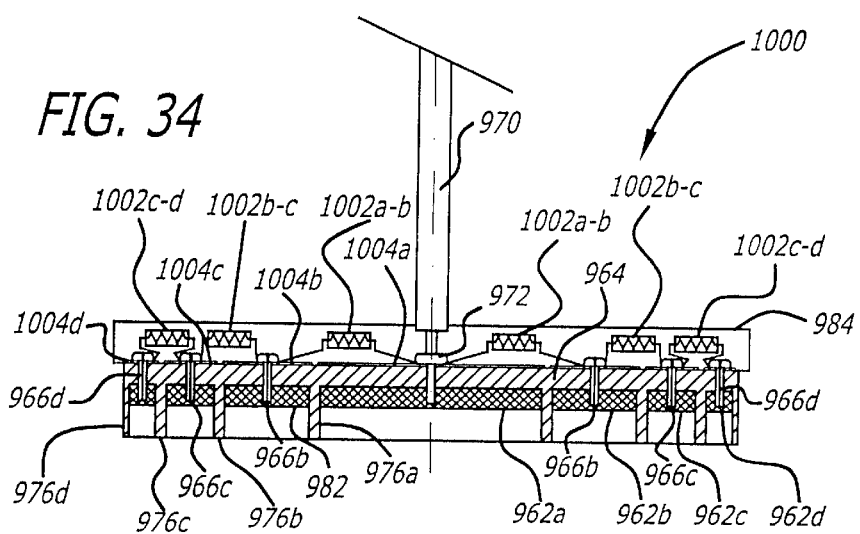
FIG. 34 illustrates a cross-sectional view A—A of another anode assembly in accordance with the invention that compensates for uneven plating deposition caused by a wafer seed layer.

FIG. 34 illustrates another preferred embodiment of an anode assembly 1000 in accordance with the invention. The anode assembly 1000 is a variation of anode assembly 960 and includes many of the same elements, which are identified with the same reference numbers. The anode assembly 1000 differs from anode assembly 960 in that discrete resistors electrically connect adjacent anode sections. More specifically, separate electrically conductive layers 1004a–d are disposed on the base plate 964 and are positioned substantially above and have the substantially the same shape as respective anode sections 962a–d. Discrete resistors 1002a–b electrically couple anode section 962a to anode section 962b, discrete resistors 1002b–c electrically couple anode section 962b to anode section 962c, and discrete resistors 1002c–d electrically couple anode section 962c to anode section 962d. The leads of resistors 1002a–b can be attached to the nut 972 and to respective screws 966b, the leads of resistors 1002b–c can be attached to respective screws 966b and screws 966c, and leads of resistors 1002c–d can be attached to respective screws 966c and screws 966d. If the screw arrangement shown in FIG. 33B is used, eight discrete resistors electrically connect adjacent anode sections.

It may be desirable to use discrete resistors for more power handling capability. The thin electrically-conductive layer 974 of anode assembly 960 may not be capable of handling large plating currents under some circumstances. Under those circumstances, discrete resistors may be employed. As with anode assembly 960, the discrete resistors 1002 coupling adjacent anode sections should be designed to substantially match the sheet resistance of respective coincident regions of the seed layer, as explained with reference to plating apparatus 930 shown in FIG. 31. The discrete resistors 1002 may be substituted by thin-film, thick-film, or chip resistors. The particular type of resistor is not critical to the invention, and can encompass many types of resistors.

3. Anode with Resistive Network with Via Hole Connection to Anode Sections

Figure 35:
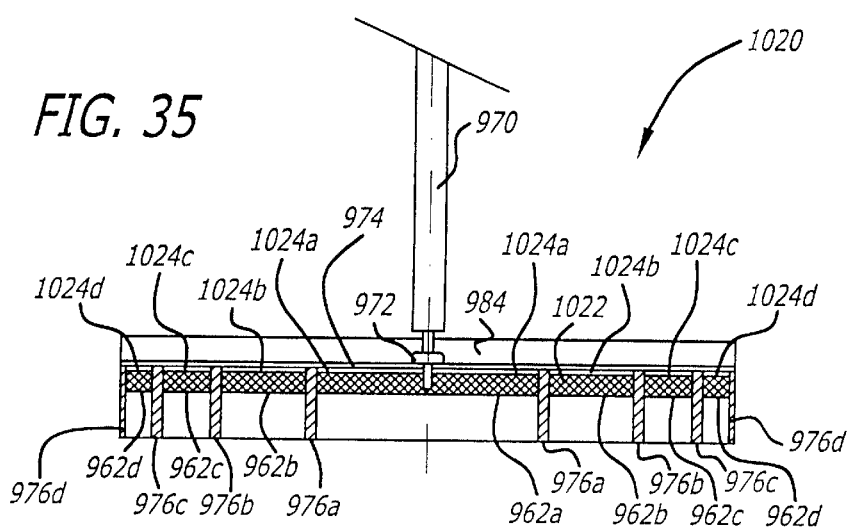
FIG. 35 illustrates a cross-sectional view A—A of yet another anode assembly in accordance with the invention that compensates for uneven plating deposition caused by a wafer seed layer.

FIG. 35 illustrates another preferred embodiment of an anode assembly 1020 in accordance with the invention. The anode assembly 1020 is a variation of anode assembly 960 and includes many of the same elements, which are identified with the same reference numbers. The anode assembly 1020 differs from anode assembly 960 in that the former includes a base 1022 with a plurality of via holes 1024a–d (i.e. contact holes, plated-thru holes), instead of screws 966a–d, for electrically connecting the electrically-conductive layer 974 to respective anode sections 962a–d. The anode sections 962a–d are securely attached to the via holes by way of solder, conductive epoxy, or other electrically-conductive attaching means.

4. Anode with Resistive Network Comprising Discrete Wires

Figure 36A:
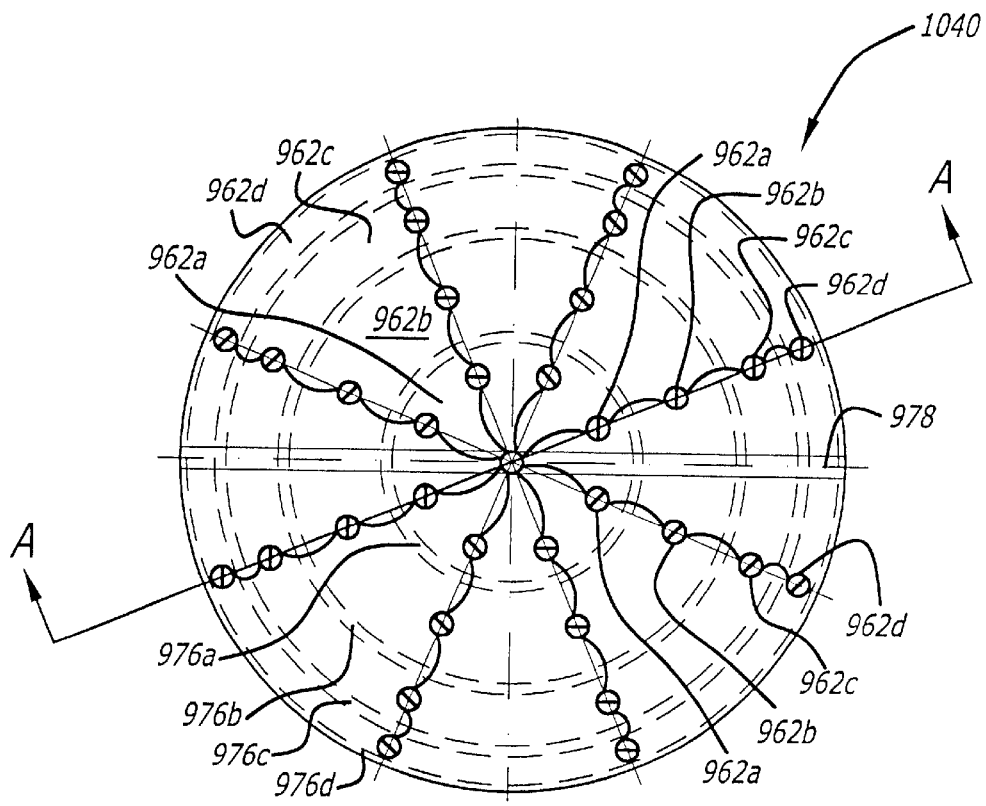
FIGS. 36A–B illustrate top view and cross-sectional view A—A of still another anode assembly in accordance with the invention that compensates for uneven plating deposition caused by a wafer seed layer.
Figure 36B:
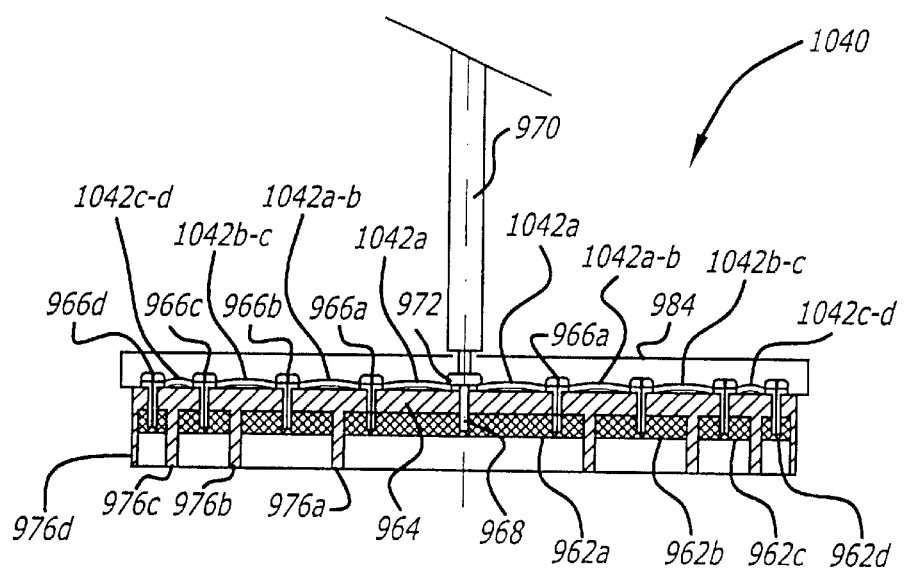

FIGS. 36A–B illustrate another preferred embodiment of an anode assembly 1040 in accordance with the invention. The anode assembly 1040 is yet a another variation of anode assembly 960 and includes many of the same elements, which are identified with the same reference numbers. The anode assembly 1040 differs from anode assembly 960 in that discrete wires, instead of resistors, electrically connect adjacent anode sections together. More specifically, discrete wires 1042a–b electrically couple anode section 962a to anode section 962b, discrete wires 1042b–c electrically couple anode section 962b to anode section 962c, and discrete wires 1042c–d electrically couple anode section 962c to anode section 962d. The leads of wires 1042a–b can be attached to the respective screws 966a–b, the leads of wires 1042b–c can be attached to respective screws 966b and screws 966c, and leads of wires 1042c–d can be attached to respective screws 966c and screws 966d. In the preferred embodiment, eight wires equally spaced around the center of the anode assembly 1040 are used to electrically connect anode sections together.

The anode assembly 1040 further includes wires 1042a having leads attached to nut 972 and respective screws 966a, which are electrically connected to the center anode section 962a. These wires 1042a are used to increase the current capacity of the connection of the anode shaft 970 to the center anode section 962a. As with anode assembly 960, the discrete wires 1042 coupling adjacent anode sections should be designed to substantially match the sheet resistance of respective coincident regions of the seed layer, as explained with reference to plating apparatus 930 shown in FIG. 31. The conductivity and diameters of the wires 1042 are selected to meet that criteria.

IV. Conclusion

While the invention has been described in connection with various embodiments, it will be understood that the invention is capable of further modifications. This application is intended to cover any variations, uses or adaptation of the invention following, in general, the principles of the invention, and including such departures from the present disclosure as come within known and customary practice within the art to which the invention pertains.

It is claimed:

1. An anode for plating a plurality of surface regions of an article, comprising:
   first and second separate anode sections for substantially plating respectively said surface regions of said article; and
   a resistive element electrically connecting said first separate anode section to said second separate anode section.

2. The anode of claim 1, wherein said first and second separate anode sections are substantially co-planar.

3. The anode of claim 1, wherein said first separate anode section comprises a circular anode section, and said second separate anode section comprises an annular-ring anode section being concentric with said circular anode section.

4. The anode of claim 3, further comprising an electrical conductor electrically connected to said circular anode section for supplying a main anode voltage thereto.

5. The anode of claim 1, further including at least one shield for shielding said first separate anode section from said second separate anode section.

6. The anode of claim 1, wherein said resistive element comprises a discrete resistor.

7. The anode of claim 6, wherein said discrete resistor comprises a chip resistor.

8. The anode of claim 1, wherein said resistive element comprises a thin film resistor.

9. The anode of claim 1, wherein said resistive element comprises a thick film resistor.

10. The anode of claim 1, wherein said resistive element comprises a thin electrically-conductive layer having a sheet resistance.

11. The anode of claim 1, wherein said resistive element comprises a wire.

12. A plating apparatus, comprising:
    a container for supporting a bath of plating fluid and a wafer disposed within said bath of plating fluid; and
    an anode positioned within said container, said anode comprising.
       first and second separate anode sections for substantially plating respective surface regions of said wafer; and
       a resistive element electrically connecting said first separate anode section to said second separate anode section.

13. The plating apparatus of claim 12, wherein said first separate anode section comprises a circular anode section, and said second separate anode section comprises an annular-ring anode section being concentric with said circular anode section.

14. The plating apparatus of claim 13, further comprising an electrical conductor electrically connected to said circular anode section for supplying a main anode voltage thereto.

15. The plating apparatus of claim 12, further including at least one shield for shielding said first separate anode section from said second separate anode section.

16. The plating apparatus of claim 12, wherein said resistive element comprises a discrete resistor.

17. The plating apparatus of claim 16, wherein said discrete resistor comprises a chip resistor.

18. The plating apparatus of claim 12, wherein said resistive element comprises a thin film resistor.

19. The plating apparatus of claim 12, wherein said resistive element comprises a thick film resistor.

20. The plating apparatus of claim 12, wherein said resistive element comprises a thin electrically-conductive layer having a sheet resistance.

21. The plating apparatus of claim 12, wherein said resistive element comprises a wire.

22. An anode comprising
    a non-electrically conducting base;
    a plurality of separate anode sections attached to said base; and
    one or more resistive elements electrically connected to respective pairs of said plurality of separate anode sections.

23. The anode of claim 22, wherein said plurality of separate anode sections are attached to a first side of said base and said one or more resistive elements are situated on a second side of said base opposite of said first side.

24. The anode of claim 23, further including electrical conductors situated within respective openings in said base for electrically connecting said one or more resistive elements to respective pairs of said plurality of separate anode sections.

25. The anode of claim 22, wherein said resistive element comprises a discrete resistor.

26. The anode of claim 22, wherein said resistive element comprises a wire.

27. The anode of claim 22, wherein said resistive element comprises a thin film resistor.

28. The anode of claim 22, wherein said resistive element comprises a thick film resistor.

29. The anode of claim 22, wherein said resistive element comprises a thin electrically-conductive layer having a sheet resistance.

30. The anode of claim 22, further comprising shields separating adjacent anode sections.

31. An anode comprising:
   a non-electrically conducting cylindrical base having top and bottom surfaces;
   a circular anode section attached to a center region of said bottom surface of said base;
   an annular-ring anode section attached to said bottom surface of said base in a manner that said annular-ring anode section is concentric with and separate from said circular anode section; and
   a resistive element electrically connecting said circular anode section to said annular-ring anode section.

32. The anode of claim 31, wherein said resistive element is situated over said top surface of said base.

33. The anode of claim 32, further including electrical conductors situated within respective holes through said base which electrically connect said resistive element respective to said circular anode section and said annular-ring anode section.

34. The anode of claim 31, wherein said resistive element comprises a discrete resistor.

35. The anode of claim 31, wherein said resistive element comprises a wire.

36. The anode of claim 31, wherein said resistive element comprises a thin film resistor.

37. The anode of claim 31, wherein said resistive element comprises a thick film resistor.

38. The anode of claim 31, wherein said resistive element comprises a thin electrically-conductive layer disposed over said top surface of said base.

39. The anode of claim 31, further comprising an annular shield extending downward from the bottom surface of said base between said circular anode section and said annular-ring anode section.

* * * * *